(12) United States Patent
Kudo et al.

(10) Patent No.: US 9,331,309 B2
(45) Date of Patent: May 3, 2016

(54) DISPLAY APPARATUS, METHOD FOR MANUFACTURING DISPLAY APPARATUS, AND METHOD FOR DESIGNING DISPLAY APPARATUS

(71) Applicant: c/o JOLED Inc., Tokyo (JP)

(72) Inventors: Yasuyuki Kudo, Miyagi (JP); Jiro Yamada, Kanagawa (JP); Yoko Yamaguchi, Kanagawa (JP); Yuichiro Ishiyama, Kanagawa (JP); Kazuma Teramoto, Kanagawa (JP); Takahide Ishii, Kanagawa (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 14/553,352

(22) Filed: Nov. 25, 2014

(65) Prior Publication Data
US 2015/0188091 A1    Jul. 2, 2015

(30) Foreign Application Priority Data

Dec. 26, 2013 (JP) .................................. 2013-270225
Feb. 28, 2014 (JP) .................................. 2014-038643

(51) Int. Cl.
| | | |
|---|---|---|
| H01L 29/18 | (2006.01) | |
| H01L 51/52 | (2006.01) | |
| G06F 17/50 | (2006.01) | |
| H01L 27/32 | (2006.01) | |

(52) U.S. Cl.
CPC ............ *H01L 51/5271* (2013.01); *G06F 17/50* (2013.01); *H01L 27/3246* (2013.01); *H01L 51/5275* (2013.01); *H01L 27/322* (2013.01)

(58) Field of Classification Search
CPC .................................................... H01L 51/5271
USPC ............................................................ 257/88
See application file for complete search history.

(56) References Cited

U.S. PATENT DOCUMENTS

2015/0008403 A1*  1/2015  Kudo .................. H01L 51/5012
                                                     257/40

FOREIGN PATENT DOCUMENTS

JP        2013-191533         9/2013

\* cited by examiner

*Primary Examiner* — Anthony Ho
(74) *Attorney, Agent, or Firm* — Michael Best & Friedrich LLP

(57) ABSTRACT

A display apparatus includes (A) a first substrate where a plurality of light emitting elements, which are formed by laminating a first electrode, a light emitting section which is configured by an organic layer provided with a light emitting layer, and a second electrode, are formed, and (B) a second substrate which is arranged to oppose the first substrate, in which the first substrate is further provided with a light reflecting layer formed of first members which propagate and output light from each light emitting element to an outside and second members placed between two first members, the first members have a truncated cone shape where a cutting head section opposes the light emitting element, a part of light propagated by the first members is completely reflected on opposing surfaces of the second members which oppose the first members.

17 Claims, 24 Drawing Sheets

DISTANCE BETWEEN STRUCTURES

DISPLAY APPARATUS, METHOD FOR MANUFACTURING DISPLAY APPARATUS, AND METHOD FOR DESIGNING DISPLAY APPARATUS

CROSS REFERENCE TO RELATED APPLICATIONS

This application claims the benefit of Japanese Priority Patent Application JP 2013-270225 filed Dec. 26, 2013, and Japanese Priority Patent Application JP 2014-038643 filed Feb. 28, 2014, the entire contents of each of which are incorporated herein by reference.

BACKGROUND

The present disclosure relates to a display apparatus, a method for manufacturing a display apparatus, and a method for designing a display apparatus, and more specifically, to a display apparatus which is provided with light emitting elements, a method for manufacturing the display apparatus, and a method for designing the display apparatus.

In recent years, lighting apparatuses or organic electroluminescence display apparatuses (below, simply abbreviated to organic EL display apparatuses) in which organic electroluminescence elements (below, simply abbreviated as organic EL elements) are used as light emitting elements have come into widespread use. Then, there is a strong demand for development of a technique which efficiently extracts light for organic EL display apparatuses. This is because when the light extracting efficiency is low, the actual amount of emitted light is not effectively used in the organic EL element, which is a factor which causes a great loss in terms of electricity consumption and the like.

An organic EL display apparatus which has a reflector (a reflecting structure) in order to improve the light extracting efficiency is disclosed, for example, in Japanese Unexamined Patent Application Publication No. 2013-191533. The display apparatus which is disclosed in the Japanese Unexamined Patent Application Publication is provided with a light reflecting layer formed of first members which propagate and output light from light emitting elements to the outside and second members which are filled between the first members and when the refractive index of the first members is $n_1$ and the refractive index of the second members is $n_2$, $1.1 \leq n_1 \leq 1.8$ and $n_1 - n_2 \geq 0.20$ are satisfied and at least a part of light propagated by the first members is reflected on surfaces of the second members which oppose the first members. Here, the opposing surfaces of the second members which oppose the first members have, for example, a truncated cone shape where a cutting head section opposes the light emitting element and the opposing surfaces are tilted at a tilting angle $\theta$.

SUMMARY

Here, when manufacturing the display apparatus, variations are easily generated in the tilting angle $\theta$ of the opposing surfaces of the second members which oppose the first members and variations are also easily generated in the ratio (an aspect ratio) of the height of the truncated cone shape which configures the opposing surface and the diameter of the cutting head section. Then, when these vary, variations are generated in the luminance (the front surface luminance) in the normal direction of the display apparatus, which leads to deterioration in image display quality of the display apparatus. In the Japanese Unexamined Patent Application Publication described above, there is no detailed description given relating to a structure where variations are not easily generated in the luminance (the front surface luminance) in the normal direction of the display apparatus.

It is desirable to provide a display apparatus which has a configuration and a structure where variations are not easily generated in the luminance (the front surface luminance) in the normal direction of the display apparatus, a method for manufacturing the display apparatus, and a method for designing the display apparatus.

According to an embodiment of the present disclosure, there is provided a display apparatus including (A) a first substrate where a plurality of light emitting elements, which are formed by laminating a first electrode, a light emitting section which is configured by an organic layer provided with a light emitting layer, and a second electrode, are formed and (B) a second substrate which is arranged to oppose the first substrate, in which the first substrate is further provided with a light reflecting layer formed of first members which propagate and output light from each light emitting element to an outside and second members placed between the first members, the first members have a truncated cone shape where a cutting head section opposes the light emitting element, and a part of light propagated by the first members is completely reflected on opposing surfaces of the second members which oppose the first members.

Then, in the display apparatus according to the embodiment of the present disclosure, when a tilting angle of the opposing surfaces of the second members is $\theta$ (units: degrees), a refractive index of a material which configures the first members is $n_1$, and a refractive index of a material which configures the second members is $n_2$ (here, $n_2 < n_1$), (1) $75.2 - 54(n_1 - n_2) \leq \theta \leq 81.0 - 20(n_1 - n_2)$, preferably, (2) $76.3 - 46(n_1 - n_2) \leq \theta \leq 77.0 - 20(n_1 - n_2)$ is satisfied.

In addition, in the display apparatus according to another embodiment of the present disclosure, when a refractive index of a material which configures the first members is $n_1$ and a refractive index of a material which configures the second members is $n_2$ (here, $n_2 < n_1$), a tilting angle $\theta$ of the opposing surfaces of the second members is determined based on a value of the refractive index $n_1$, a value of the refractive index $n_2$, and an allowable variation range of the tilting angle $\theta$ of the opposing surfaces of the second members.

According to still another embodiment of the present disclosure, there is provided a method for manufacturing a display apparatus or a method for designing a display apparatus provided with (A) a first substrate where a plurality of light emitting elements, which are formed by laminating a first electrode, a light emitting section which is configured by an organic layer provided with a light emitting layer, and a second electrode, are formed and (B) a second substrate which is arranged to oppose the first substrate, in which the first substrate is further provided with a light reflecting layer formed of first members which propagate and output light from each light emitting element to an outside and second members placed between the first members, the first members have a truncated cone shape where a cutting head section opposes the light emitting element, and a part of light propagated by the first members is completely reflected on opposing surfaces of the second members which oppose the first members.

Then, the method for manufacturing a display apparatus of the embodiment of the present disclosure determines a relationship between a tilting angle $\theta$ of the opposing surfaces of the second members, $\{(4S/\pi)^{1/2}/H\}$, and a relative luminance value at a 0 degree viewing angle of light which is output from the light emitting element via the first members by setting $\Delta n$ as a parameter when a refractive index of a material which configures the first members is $n_1$, a refractive index of a material which configures the second members is $n_2$ (here, $n_2<n_1$), an area of the cutting head section of the truncated cone shape is S, the height of the truncated cone shape is H, and $\Delta n = n_1 - n_2$, determines a maximum value and a minimum value of the relative luminance value at a 0 degree viewing angle based on a desired value of $\{(4S/\pi)^{1/2}/H\}$ and an allowable variation range of the tilting angle $\theta$, determines the tilting angle $\theta$ such that a difference between the maximum value and the minimum value of the relative luminance value at a 0 degree viewing angle is minimized, and manufactures a light reflecting layer which has the determined tilting angle $\theta$.

In addition, the method for designing a display apparatus of the embodiment of the present disclosure determines a relationship between a tilting angle $\theta$ of the opposing surfaces of the second members, $\{(4S/\pi)^{1/2}/H\}$, and a relative luminance value at a 0 degree viewing angle of light which is output from the light emitting element via the first members by setting $\Delta n$ as a parameter when a refractive index of a material which configures the first members is $n_1$, a refractive index of a material which configures the second members is $n_2$ (here, $n_2<n_1$), an area of the cutting head section of the truncated cone shape is S, the height of the truncated cone shape is H, and $\Delta n = n_1 - n_2$, determines a maximum value and a minimum value of the relative luminance value at a 0 degree viewing angle based on a desired value of $\{(4S/\pi)^{1/2}/H\}$ and an allowable variation range of the tilting angle $\theta$, and determines the tilting angle $\theta$ such that a difference between the maximum value and the minimum value of the relative luminance value at a 0 degree viewing angle is minimized.

For the display apparatus according to the embodiments of the present disclosure or a display apparatus which is obtained by the method for manufacturing a display apparatus of an embodiment of the present disclosure or the method for designing a display apparatus of still another embodiment of the present disclosure, since a part of light propagated by the first members is completely reflected on opposing surfaces of the second members which oppose the first members, it is possible to improve the light extracting efficiency from light emitting elements to the outside even without providing a light reflecting member or the like between the first members and the second members. Then, in the display apparatus according to the embodiment of the present disclosure, since a relationship between a difference between the values of the refractive index $n_1$ and the refractive index $n_2$, and the tilting angle $\theta$ of the opposing surfaces of the second members is regulated, variations are not easily generated in the luminance (the front surface luminance) in the normal direction of the display apparatus. In addition, in the display apparatus according to the embodiment of the present disclosure, the method for manufacturing the display apparatus, and the method for designing the display apparatus, since the tilting angle $\theta$ of the opposing surfaces of the second members is determined based on the values of the refractive indexes $n_1$ and $n_2$ and the allowable variation range of the tilting angle $\theta$ of the opposing surfaces of the second members, variations are not easily generated in the luminance (the front surface luminance) in the normal direction of the display apparatus. Here, the effects described in the present specification are merely illustrative without being limited and there may also be additional effects.

DETAILED DESCRIPTION OF EMBODIMENTS

Figure 1:
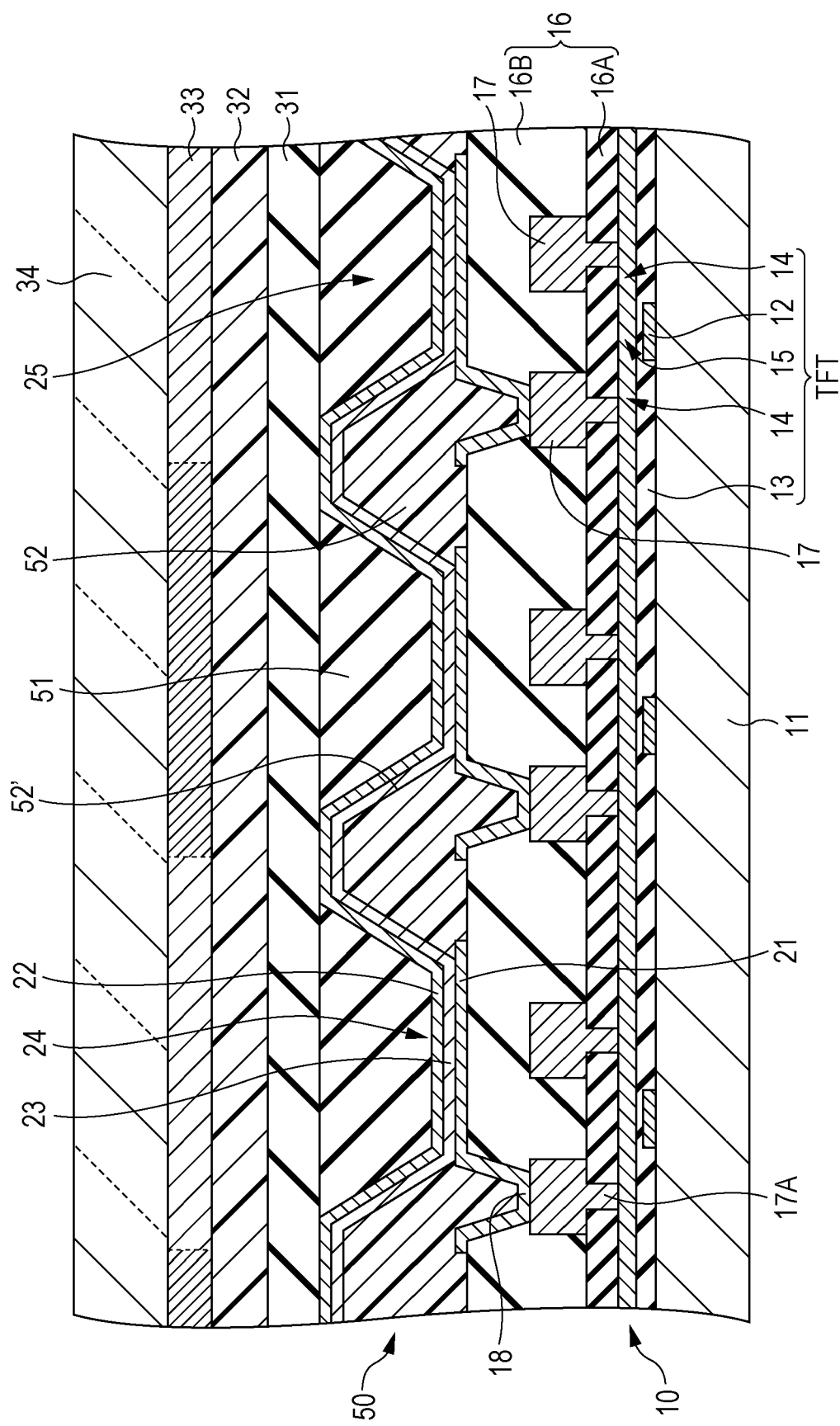
FIG. 1 is a schematic partial cross-sectional diagram of a display apparatus in Embodiment 1.

Below, description will be given of the present disclosure based on embodiments with reference to the diagrams; however, the present disclosure is not limited to the embodiments and the various values and materials in the embodiments are illustrative. Here, description will be given in the following order.

1. General description relating to a display apparatus of an embodiment of the present disclosure according to a first embodiment and a second embodiment of the present disclosure, a method for manufacturing a display apparatus of an embodiment of the present disclosure, and a method for designing a display apparatus of an embodiment of the present disclosure 2. Embodiment 1 (a display apparatus according to the first embodiment and the second embodiment of the present disclosure)

3. Embodiment 2 (a modification of Embodiment 1)

4. Embodiment 3 (another modification of Embodiment 1)

5. Embodiment 4 (yet another modification of Embodiment 1)

6. Embodiment 5 (yet another modification of Embodiment 1)

7. Embodiment 6 (yet another modification of Embodiment 1), Other

[General Description Relating to a Display Apparatus of an Embodiment of the Present Disclosure According to a First Embodiment and a Second Embodiment of the Present Disclosure, a Method for Manufacturing a Display Apparatus of an Embodiment of the Present Disclosure, and a Method for Designing a Display Apparatus of an Embodiment of the Present Disclosure]

In a display apparatus according to the first embodiment or the second embodiment of the present disclosure, a display apparatus which is obtained by a method for manufacturing a display apparatus of an embodiment of the present disclosure, or a display apparatus which is obtained by a method for designing a display apparatus of an embodiment of the present disclosure (these display apparatuses are collectively referred to below as a "display apparatus or the like of the embodiment of the present disclosure"), it is desirable to set a configuration where an allowable variation range for a tilting angle θ in a light emitting element which configures the display apparatus is a maximum of 4 degrees (set to have a maximum of 4 degrees). Here, the "variation in the tilting angle θ" refers to the value of a standard deviation σ when 100 arbitrary light emitting elements are chosen, the tilting angle θ is measured, and the average value of the tilting angle θ and the standard deviation σ are determined in the display apparatus.

It is desirable that the display apparatus or the like of an embodiment of the present disclosure which includes the preferable configuration described above have a configuration where an allowable change range of a relative luminance value at a 0 degree viewing angle of light which is output from the light emitting element via the first members (a difference between the maximum value and the minimum value of the relative luminance value) is a maximum of 0.5 in the light emitting elements which configures the display apparatus. Here, it is possible for a display apparatus according to the second embodiment of the present disclosure to have a configuration where the tilting angle θ of the opposing surfaces of the second members is determined based on a value of the refractive index $n_1$, a value of the refractive index $n_2$, and the allowable variation range of the tilting angle θ of the opposing surfaces of the second members and also such that a difference between the maximum value and the minimum value of the relative luminance value at a 0 degree viewing angle is minimized. Here, the "relative luminance value at a 0 degree viewing angle" is a relative value of the luminance (the front surface luminance) in the normal direction of the display apparatus and is represented as $Bn_1/Bn_0$ when the luminance value at a 0 degree viewing angle of light which is output from the light emitting element via the first members is set as $Bn_1$ and the luminance value at a 0 degree viewing angle of light which is output from the light emitting element via the first members supposing that the first substrate was covered only by the first members is set as $Bn_0$. Here, in a case where the "variation of the relative luminance value at a 0 degree viewing angle" is determined, the value of the standard deviation σ may be determined when 100 arbitrary luminance measuring places are chosen, the luminance values at a 0 degree viewing angle are measured, and the average value of the luminance values and the standard deviation σ are determined in the display apparatus.

In the display apparatus or the like of the embodiment of the present disclosure which includes the preferable configuration described above, it is desirable to set a configuration where a relative luminance value at a 0 degree viewing angle of light which is output from the light emitting element via the first members is 1.5 or more to 3.0 or less.

Furthermore, in the display apparatus or the like of the embodiment of the present disclosure which includes the preferable configuration described above, it is desirable to set a configuration where an allowable variation range of $\{(4S/\pi)^{1/2}/H\}$ in the light emitting element which configures the display apparatus is a maximum of 0.2 (set to have a maximum of 0.2) when an area of the cutting head section (the surface which opposes the light emitting element) of the truncated cone shape is S and the height of the truncated cone shape is H. Here, $\{(4S/\pi)^{1/2}/H\}$ is equivalent to the reciprocal of an aspect ratio. In the method for manufacturing the display apparatus of the embodiment of the present disclosure or the method for designing the display apparatus of the embodiment of the present disclosure, the maximum value and the minimum value of the relative luminance value at a 0 degree viewing angle may be determined based on the allowable variation range of $\{(4S/\pi)^{1/2}/H\}$ and the allowable variation range of the tilting angle θ. "Variation of $\{(4S/\pi)^{1/2}/H\}$" refers to a value of a standard deviation σ when 100 arbitrary light emitting elements are chosen, $\{(4S/\pi)^{1/2}/H\}$ is measured, and the average value of $\{(4S/\pi)^{1/2}/H\}$ and the standard deviation $\sigma$ are determined in the display apparatus.

Furthermore, in the display apparatus or the like of the embodiment of the present disclosure which includes the preferable configuration described above, a configuration where $0.1 \leq n_1 - n_2 \leq 0.4$ is satisfied is preferable.

Furthermore, in the display apparatus or the like of the embodiment of the present disclosure which includes the preferable configuration described above, a configuration where $0.8 \leq (4S/\pi)^{1/2}/H \leq 1.6$ is satisfied when the area of the cutting head section (the surface which opposes the light emitting element) of the truncated cone shape is S and the height of the truncated cone shape is H is preferable.

Furthermore, in the display apparatus or the like of the embodiment of the present disclosure which includes the various preferable configurations described above, it is possible to set a form where light which is output from the light emitting element and output from the first members in parallel with an axis line of the truncated cone shape is completely reflected on the opposing surface when the light hits the opposing surface of the second member.

Furthermore, in the display apparatus or the like of the embodiment of the present disclosure which includes the various preferable configurations and forms described above, it is possible to set a form where the light emitting element and the first members are in contact. Due to this, since light which is output from the light emitting section is constantly directly incident on the first members, a remarkable drop in light extracting efficiency is not caused.

Furthermore, in the display apparatus or the like of the embodiment of the present disclosure which includes the various preferable configurations and forms described above, it is possible to set a form where light from each light emitting element is output to the outside via the second substrate. Such a display apparatus may be referred to as an "upper surface light emitting type display apparatus". However, the display apparatus is not limited to such a configuration and it is possible to set a form where light from each of the light emitting elements is output to the outside via the first substrate. Such a display apparatus may be referred to as a "lower surface light emitting type display apparatus".

In the display apparatus or the like of the embodiment of the present disclosure which includes the various preferable configurations and forms described above (below, these may be collectively referred to as the "display apparatus in the present disclosure"), examples of the material which configures the first members include $Si_{1-x}N_x$, ITO, IZO, $TiO_2$, $Nb_2O_5$, bromine-containing polymers, sulfur-containing polymers, titanium-containing polymers, and zirconium-containing polymers.

In the display apparatus in the present disclosure, it is possible to set a form where a second electrode extends between the first member and the second member or it is possible to set a form where an organic layer and the second electrode extend therebetween. In such a case, a part of light propagated by the first members is completely reflected on an interface between the second member and the second electrode or an interface between the second member and the organic layer; however, these forms are also encompassed in the form where "a part of light propagated by the first members is completely reflected on opposing surfaces of the second members which oppose the first members".

In addition, in the display apparatus in the present disclosure, examples of a material which configures the second member excluding a light absorbing layer which will be described below include $SiO_2$, MgF, LiF, polyimide-based resins, acryl-based resins, fluorine-based resins, silicone-based resins, fluorine-based polymers, silicone-based polymers, silicon nitride, silicon oxynitride, and aluminum oxide.

Alternatively, in the display apparatus in the present disclosure, it is possible to configure the second member by a lower layer formed of an organic material and an upper layer formed of an inorganic material which covers at least a part of the lower layer. In detail, examples include a form where the upper layer covers the surface of the entire lower layer and a form where the upper layer covers the top surface of the lower layer. Examples of the organic material which configures the lower layer include polyimide-based resins, acryl-based resins, fluorine-based resins, silicone-based resins, fluorine-based polymers, and silicone-based polymers and examples of the inorganic material which configures the upper layer include silicon nitride, silicon oxide, silicon oxynitride, aluminum oxide, titanium oxide, and zirconium oxide. The lower layer may be configured by a single layer or may be configured by a laminated structure where a plurality of layers are laminated. The upper layer may also be configured by a single layer or may be configured by a laminated structure where a plurality of layers are laminated. In this manner, it is possible to suppress external light reflection by providing the upper layer and, by setting a form where the upper layer covers the entire surface of the lower layer, gas diffusion is prevented by the upper layer even when gas is generated in the lower layer, and it is possible to avoid the gas having an adverse influence on the light emitting section. Here, it is possible for the optical density (OD value) of the material which configures the upper layer to be 1.0 or more.

Then, it is possible to set a form where an opening section is provided in the second member, the inclined surface of the opening section corresponds to the opposing surface, and the light emitting section is provided on the bottom surface of the opening section. In detail, light emitting elements, which are formed by laminating a first electrode, a light emitting section which is configured by an organic layer provided with a light emitting layer, and a second electrode, are provided on the bottom surface of the opening section. In some cases, the organic layer and the second electrode extend on the opposing surface. Alternatively, it is possible to set a form where an opening section is provided in the second member, an inclined surface of the opening section corresponds to the opposing surface, and the upper layer which configures the second member extends to a part of the bottom surface of the opening section. Then, examples of such a form include [1] a form where the light emitting section is provided on the first electrode which is exposed on the bottom surface of the opening section of which a part is covered by the extending section of the upper layer, [2] a form where a first auxiliary electrode is formed on the first electrode which is exposed on the bottom surface of the opening section of which a part is covered by the extending section of the upper layer and the light emitting section is formed on the first auxiliary electrode, and [3] a form where the first auxiliary electrode is formed over the opposing surface from on the first electrode which is exposed on the bottom surface of the opening section of which a part is covered by the extending section of the upper layer and the light emitting section is formed on a part of the first auxiliary electrode. It is possible to configure the first auxiliary electrode by, for example, a laminated structure of an aluminum alloy [for example, Al—Nd (Nd: 0.4 mass % to 3 mass %), Al—Cu, or the like] or an indium compound [for example, indium-tin compound oxide (ITO), indium-zinc compound oxide (IZO), indium doped gallium-zinc compound oxide (IGZO), indium doped tin-zinc compound oxide], and aluminum alloys (for example, Al—Ni, Al—Ni—B, or the like), and silver or gold alloys.

In the form where the upper layer covers the entire surface of the lower layer, the "refractive index $n_2$ of the material which configures the second member" may be determined from the average thickness of the upper layer in the opposing surface and the refractive indexes of the materials which configure each of the upper layer and the lower layer. In addition, in the form where the upper layer covers the top surface of the lower surface, since the lower layer is exposed on the opposing surface, the refractive index of the material which configures the lower layer may be set as the "refractive index $n_2$ of the material which configures the second member". When the second member is configured by the upper layer and the lower layer described above, it is also possible for a display apparatus excluding the provisions of $\theta$, $n_1$, and $n_2$ in the display apparatus according to the first embodiment or the second embodiment of the present disclosure to configure the display apparatus of the embodiment of the present disclosure.

It is possible to form the second member which includes the lower layer and the upper layer, for example, by a method, which is a combination of a vacuum vapor deposition method, a sputtering method, and an etching method; a combination of the vacuum vapor deposition method, the sputtering method, a spin coating method, and a lift-off method; an atomic layer deposition (ALD) method, a CVD method, a screen printing method, a lithography technique, or the like, which is appropriately selected depending on the material to be used.

In the display apparatus in the present disclosure, it is possible to set a configuration where a light absorbing layer is provided on the second member. In this manner, by providing the light absorbing layer on the second member, external light which is incident on the second member is absorbed by the light absorbing layer and is not easily output to the outside from the display apparatus. For this reason, it is possible to improve the contrast of the display apparatus. In detail, in a case where the light absorbing layer is provided on the second member, it is possible to set a configuration where the second member has a structure where the light absorbing layer and other layers (referred to as "second member configuration layers" for convenience) are laminated, alternatively, it is possible to set a configuration where the second member is configured by the light absorbing layer (that is, a configuration where the light absorbing layer accounts for the entire second member). Then, in the former configuration, it is possible to set a configuration where the light absorbing layer is provided in the lower section of the second member (that is, a structure where the second member and the second member configuration layer are laminated from the first substrate side), alternatively, it is possible to set a configuration where the light absorbing layer is provided in the middle section of the second member (that is, a structure where the second member configuration layer, the light absorbing layer, and the second member configuration layer are laminated from the first substrate side), and alternatively, it is possible to set a configuration where the light absorbing layer is provided in the top section of the second member (that is, a structure where the second member configuration layer and the second member are laminated from the first substrate side). Two or more light absorbing layers may be formed.

Examples of a material which configures the light absorbing layer include carbon, a metal thin film (for example, chromium, nickel, aluminum, molybdenum, or the like, or a thin film formed of an alloy thereof), metal oxide (for example, chromium oxide), metal nitride (for example, chromium nitride), an organic resin, glass paste which contains a black pigment or the like, and various types of resins which include black pigments such as carbon black or black dyes. In detail, examples include photosensitive polyimide resins, chromium oxide or chromium oxide/chromium laminated films. It is possible to form the light absorbing layer, for example, by a method, which is a combination of a vacuum vapor deposition method, a sputtering method, and an etching method; a combination of the vacuum vapor deposition method, the sputtering method, a spin coating method, and a lift-off method; a screen printing method, a lithography technique, or the like, which is appropriately selected depending on the material to be used. The difference between a refractive index $n_2'$ of the material which configures the light absorbing layer and the refractive index $n_2$ of the material which configures the second member configuration layer is preferably as small as possible. The light absorbing layer has the meaning of a layer where the absorptivity of visible light is 90% or more, preferably 99% or more.

Furthermore, it is possible to set a configuration where the display apparatus in the present disclosure is provided with a color filter. In a case where the display apparatus is set as a color display apparatus, one pixel is configured by three sub-pixels which are a red light emitting sub-pixel which emits a red color, a green light emitting sub-pixel which emits a green color, and a blue light emitting sub-pixel which emits a blue, or by four or more sub-pixels. In such a color display apparatus, the red light emitting sub-pixel may be configured by a light emitting element which emits red light, the green light emitting sub-pixel may be configured by a light emitting element which emits green light, and the blue light emitting sub-pixel may be configured by a light emitting element which emits blue light and in the upper surface light emitting type display apparatus which includes the preferable configurations and forms described above, the second substrate may have a configuration which is provided with a color filter, the light emitting element may have a configuration which emits white light, and each color light emitting sub-pixel may be configured by a combination of the light emitting element which emits white light and the color filter. The second substrate may have a configuration which is provided with a light shielding film (a black matrix). In the same manner, in the lower surface light emitting type display apparatus, it is possible to set a configuration where the first substrate is provided with a color filter or a light shielding film (a black matrix).

It is possible for the upper surface light emitting type display apparatus in the display apparatus in the present disclosure to have a form where a protective film and a sealing material layer are further provided on the light reflecting layer (that is, on the first member and the second member). Here, the form may have a structure where the first member and the protective film are integrated by forming the first member and the protective film at the same time. When a refractive index of a material which configures the protective film is set as $n_3$ and a refractive index of a material which configures the sealing material layer is set as $n_4$, it is possible to set a form which satisfies $|n_3-n_4| \leq 0.3$, preferably $|n_3-n_4| \leq 0.2$ and due to this, it is possible to effectively prevent light from being reflected or scattered at the interface between the protective film and the sealing material layer.

As the material which configures the protective film, it is preferable to use a material which is transparent with respect to light which is emitted by the light emitting layer, which is dense, and which does not allow water to permeate. In detail, examples thereof include amorphous silicon ($\alpha$-Si), amorphous silicon carbide ($\alpha$-SiC), amorphous silicon nitride ($\alpha$-Si$_{1-x}$N$_x$), amorphous silicon oxide ($\alpha$-Si$_{1-y}$O$_y$), amorphous carbon ($\alpha$-C), amorphous oxide nitride silicon ($\alpha$-SiON), and Al$_2$O$_3$. In addition, examples of the material which configures the sealing material layer include thermosetting type adhesive agents such as acryl-based adhesive agents, epoxy-based adhesive agents, urethane-based adhesive agents, silicone-based adhesive agents, and heat curable type adhesive agents such as cyanoacrylate-based adhesive agents or ultraviolet curable type adhesive agents.

The display apparatus in the present disclosure is not limited to the form where one pixel (or sub-pixel) is configured by one light emitting element and examples of the arrangement of the pixels (or sub-pixels) include a stripe arrangement, a diagonal arrangement, a delta arrangement, or a rectangular arrangement. In addition, the present disclosure is not limited to a form where one pixel (or sub-pixel) is configured by gathering a plurality of light emitting elements and examples of an arrangement of the pixels (or sub-pixels) include a stripe arrangement. It is possible to exemplify 1 to 1000 as the number of light emitting elements which configure one pixel (or sub-pixel). It is possible to set a form where a plurality of opposing surfaces are provided with respect to one light emitting element and it is also possible to set a form where one opposing surface is provided with respect to one light emitting element.

In the display apparatus in the present disclosure, the first member is configured by a part of a rotating body (a cutting head rotating body), alternatively, the opposing surface is configured by a part of the surface of the rotating body (a cutting head rotating body), and when the axis line of the opposing surface which is the axis of rotation of the rotating body (the axis line of the truncated cone shape in the first member) is set as a z axis, it is preferable that the cross-sectional shape of the first member or the opposing surface be configured by a trapezoid or a part of a parabola when the first member or the opposing surface is cut in a virtual plane which includes the z axis; however, the cross-sectional shape may be configured in another manner, and for example, it is possible to set a spherical surface, a rotating ellipsoid, or a rotating paraboloid as the rotating body and it is also possible to set a curved surface which is obtained by rotating a part of a curved line, as exemplified by a polynomial with three or more dimensions, a two-leaf line, a three-leaf line, a four-leaf line, a lemniscate, a snail line, a rose, a conchoid, a cissoid, a likelihood curved line, a drawn arc, a catenary, a cycloid, a trochoid, an asteroid, a half three-dimensional parabola, a lissajous curved line, an Agnesi curve, an epicycloid, a heart shape, a hypocycloid, a clothoid curve, or a spiral. In addition, in some cases, it is possible to set a surface which is obtained by rotating one line, a combination of a plurality of lines, or a combination of a line and a curved line. Alternatively, it is possible to configure the first member or the opposing surface by a truncated pyramid (for example, a truncated tetrahedron, a truncated quadrangular pyramid, a truncated hexagonal pyramid, a truncated octagonal pyramid, or the like). Furthermore, examples of a visible outline of the first member or the opposing surface when the first member or the opposing surface is cut in the xy plane include an arbitrary closed curved line.

Figure 24A:
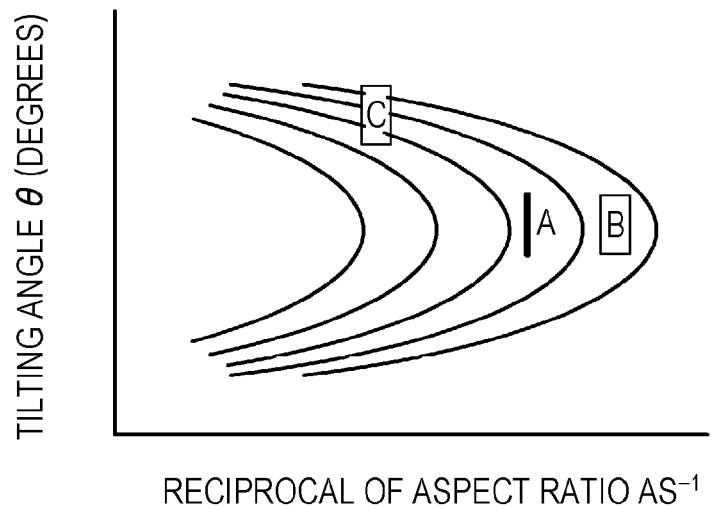
FIG. 24A is a conceptual diagram of a relative luminance value at a 0 degree viewing angle when the reciprocal of an aspect ratio and the tilting angle θ are set as parameters in the display apparatus of Embodiment 1 and FIG. 24B is a schematic partial cross-sectional diagram of a light reflecting layer for illustrating the tilting angle θ or the like of the opposing surfaces of the second members in the display apparatus of Embodiment 1.
Figure 24B:
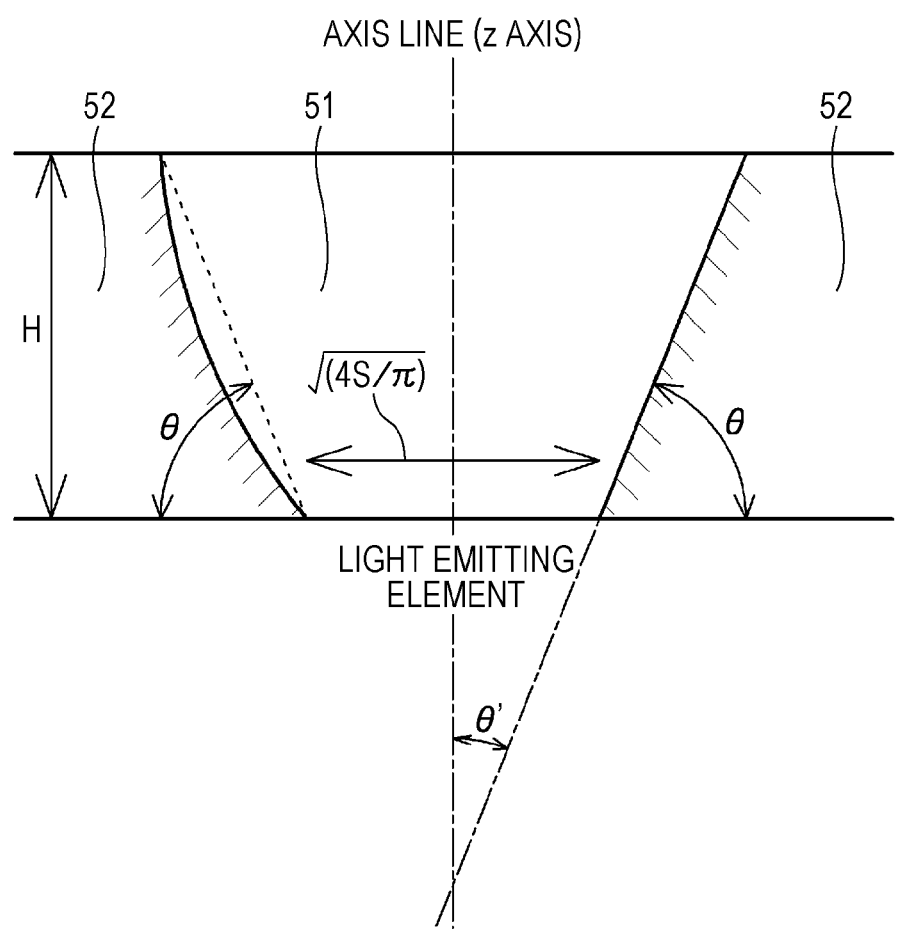

In the display apparatus in the present disclosure, a tilting angle θ of the opposing surfaces of the second members, has, in other words, a meaning of a complementary angle (units: degrees) of an angle θ' formed of the cross-section of the opposing surfaces of the second members when the opposing surfaces of the second member are cut in a virtual plane, which includes the axis line (z axis, refer to FIG. 24B) of a truncated cone shape, and the axis line (z axis) of the truncated cone shape (FIG. 24B). In a case where the cross-section of the opposing surface is drawn in a curved line, the tilting angle θ of the cross-section of the opposing surfaces of the second members is a complementary angle of an angle θ' formed by a straight line which connects a lower end section and an upper end section of the opposing surface and the axis line (z axis) of the truncated cone shape. Here, in FIG. 24B, a case where the cross-section of the opposing surface is drawn in a straight line is illustrated on the right hand side of the diagram and a case where the cross-section of the opposing surface is drawn in a curved line is illustrated on the left hand side of the diagram. In a case where there are plurality of cross-sectional shapes of the first member or the opposing surface when the first member or the opposing surface is cut in a virtual plane which includes the z axis (for example, a case of a truncated cone shape or the like), the tilting angle with the largest value is set as the tilting angle θ.

In adjacent light emitting elements, examples of the shortest distance to the top surface of the second member (referred to as "distance between structures" for convenience) include 0 μm, 2 μm, or 4 μm; however, the shortest distance is not limited thereto and depends on the specifications for the display apparatus.

In a case where a light reflecting electrode functions as an anode electrode, examples of a material (a light reflecting material) which configures the first electrode in the upper surface light emitting type display apparatus or the second electrode in the lower surface light emitting type display apparatus (these electrodes may be referred to as "light reflecting electrodes" for convenience) include a metal with high work function such as platinum (Pt), gold (Au), silver (Ag), chromium (Cr), tungsten (W), nickel (Ni), copper (Cu), iron (Fe), cobalt (Co), or tantalum (Ta); or an alloy (for example, an Ag—Pd—Cu alloy with silver as a main component which includes 0.3 mass % to 1 mass % of palladium (Pd) and 0.3 mass % to 1 mass % of copper (Cu), or an Al—Nd alloy). Furthermore, in a case of using a conductive material where a value of the work function is small such as aluminum (Al), an alloy which includes aluminum, or the like and where the light reflectivity is high, it is possible to use the conductive material as an anode electrode by improving the hole injection property by providing an appropriate hole injection layer or the like. It is possible to give 0.1 μm to 1 μm as an example of the thickness of the light reflecting electrode. Alternatively, it is possible to set a structure where transparent conductive materials which have excellent hole injection characteristics, such as indium tin oxide (ITO) or indium zinc oxide (IZO), are laminated on a reflecting film with a high light reflecting property such as a dielectric multilayer film or aluminum (Al). On the other hand, in a case where the light reflecting electrode functions as a cathode electrode, it is desirable to configure the light reflecting electrode using a conductive material where the value of the work function is small and where the light reflectance is high; however, use as a cathode electrode is possible by improving the electron injection property by providing an appropriate electron injection layer or the like in the conductive material with high light reflectivity which is used as the anode electrode.

On the other hand, as a material (a half-light transmitting material or a light transmitting material) which configures the second electrode in the upper surface light emitting type display apparatus or the first electrode in the lower surface light emitting type display apparatus (these electrodes may be referred to as "half-light transmitting electrodes" for convenience), in a case where a half-light transmitting electrode functions as a cathode electrode, it is desirable to have a configuration using a conductive material which transmits light emitting light and moreover, where the value of the work function is small so as to be able to efficiently inject electrons with respect to an organic layer. Examples thereof include a metal or an alloy where the work function is small such as aluminum (Al), silver (Ag), magnesium (Mg), calcium (Ca), sodium (Na), strontium (Sr), an alkali metal or alkali earth metal, and silver (Ag) [for example, an alloy of magnesium (Mg) and silver (Ag) (Mg—Ag alloy)], an alloy of magnesium-calcium (Mg—Ca alloy), an alloy of aluminum (Al) and lithium (Li) (Al—Li alloy), or the like and, out of these, a Mg—Ag alloy is preferable and it is possible to give Mg:Ag=5:1 to 30:1 as an example of the volume ratio of the magnesium and silver. Alternatively, it is possible to give Mg:Ca=2:1 to 10:1 as an example of a volume ratio of magnesium and calcium. It is possible to give 4 nm to 50 nm, preferably 4 nm to 20 nm, and more preferably 6 nm to 12 nm as examples of the thickness of the half-light transmitting electrode. Alternatively, it is also possible to set the half-light transmitting electrode to have a laminated structure of the material layer described above and for example, a so-called transparent electrode formed of ITO or IZO (for example, with a thickness of $3 \times 10^{-8}$ m to $1 \times 10^{-6}$ m) from the organic layer side. In the case of setting the laminated structure, it is also possible to make the thickness of the material layer described above as thin as 1 nm to 4 nm. In addition, it is also possible to set a configuration using only transparent electrodes. Alternatively, the resistance may be lowered for the entire half-light transmitting electrode by providing a bus electrode (an auxiliary electrode) formed of a low resistance material such as aluminum, an aluminum alloy, silver, a silver alloy, copper, a copper alloy, gold, a gold alloy, or the like with respect to the half-light transmitting electrode. On the other hand, in a case where the half-light transmitting electrode functions as an anode electrode, it is desirable to configure the half-light transmitting electrode using a conductive material which transmits emitted light and moreover, where the value of the work function is large.

It is desirable that the average light reflectivity of the light reflecting electrode be 50% or more, preferably 80% or more and that the average light transmittance of the half-light transmitting electrode be 50% to 90%, preferably 60% to 90%.

Examples of a method for forming the first electrode or the second electrode include vapor deposition methods which include an electron beam vapor deposition method or a heat filament vapor deposition method, a vacuum vapor deposition method, a sputtering method, a chemical vapor deposition method (CVD method) or an MOCVD method, a combination of an ion plating method and an etching method; various types of printing methods such as a screen printing method, an ink jet printing method, or a metal mask printing method; plating methods (an electrical plating method or an electroless plating method); a lift-off method; a laser ablation method; a sol gel method, and the like. Using the various types of printing methods or plating methods, it is possible to directly form the first electrode or the second electrode with a desirable shape (pattern). Here, in a case of forming the first electrode or the second electrode after forming the organic layer, forming based on a film-forming method where the energy of the film-forming particles is small such as the vacuum vapor deposition method in particular, or on a film-forming method such as the MOCVD method is preferable from the point of view that damage to the organic layer is prevented. When the organic layer is damaged, there is a concern that non-light emitting pixels (or non-light emitting sub-pixels) referred to as "unlit defects" will be generated due to the generation of a leak current. In addition, it is preferable to carry out the execution from the forming of the organic layer to the forming of these electrodes without exposure to the atmosphere from the point of view of preventing deterioration in the organic layer due to moisture in the atmosphere. In some cases, one of the first electrode or the second electrode may not be patterned.

In the display apparatus in the present disclosure, a plurality of light emitting elements are formed on the first substrate. Here, examples of the first substrate or the second substrate include a high strain point glass substrate, a soda glass ($Na_2O$—$CaO$—$SiO_2$) substrate, a borosilicate glass ($Na_2O$—$B_2O_3$—$SiO_2$) substrate, a forsterite ($2MgO$—$SiO_2$) substrate, a lead glass ($Na_2O$—$PbO$—$SiO_2$) substrate, various types of glass substrates where an insulation film is formed on the surface, a quartz substrate, a quartz substrate where an insulation film is formed on the surface, a silicon substrate where an insulation film is formed on the surface, polymethyl methacrylate (polymethylmethacrylate, PMMA) or polyvinyl alcohol (PVA), polyvinyl phenol (PVP), polyethersulfone (PES), polyimide, polycarbonate, and polyethylene telephthalate (PET) (which has the form of a polymer material such as a plastic film, a plastic sheet, or a plastic substrate which has flexibility and is configured by polymer materials). The materials which configure the first substrate and the second substrate may be the same or may be different. However, it is necessary for the second substrate to be transparent with respect to light which is output by a light emitting element in the upper surface light emitting type display apparatus and for the first substrate to be transparent with respect to light which is output by a light emitting element in the lower surface light emitting type display apparatus.

Examples of the display apparatus in the present disclosure include an organic electroluminescence display apparatus (simply abbreviated as an organic EL display apparatus) and when the organic EL display apparatus is set to be an organic EL display apparatus for a color display, sub-pixels are configured as described above by each of the organic EL elements which configure the organic EL display apparatus. Here, one pixel is configured by three types of sub-pixels which are, for example, a red light emitting sub-pixel which emits a red color, a green light emitting sub-pixel which emits a green color, and a blue light emitting sub-pixel which emits a blue color as described above. Accordingly, in this case, when the number of the organic EL elements which configure the organic EL display apparatus is set to N×M, the number of pixels is (N×M)/3. The organic EL display apparatus is able to be used, for example, as a monitor apparatus which configures a personal computer and is able to be used as a monitor apparatus which is incorporated in a television receiver, a mobile phone, a Personal Digital Assistant (PDA or mobile information terminal), or a game machine. Alternatively, the organic EL display apparatus is able to be applied to an Electronic View Finder (EVF) or a Head Mounted Display (HMD). Alternatively, other examples of the display apparatus in the present disclosure include a back light apparatus for a liquid crystal display apparatus or a lighting apparatus which includes a planar light source apparatus.

The organic layer is provided with a light emitting layer (for example, a light emitting layer formed of an organic light emitting material); however, in detail, it is possible to configure the organic layer by, for example, a laminated structure of a hole transporting layer, a light emitting layer, and an electron transporting layer, a laminated structure of a hole transporting layer and a light emitting layer which serves as an electron transporting layer, a laminated structure of a hole injection layer, a hole transporting layer, a light emitting layer, an electron transporting layer, and an electron injection layer, and the like. In addition, in a case where these laminated structures or the like are set as a "tandem unit", the organic layer may have a tandem structure with two stages where a first tandem unit, a connecting layer, and a second tandem unit are laminated, or furthermore may have a tandem structure with three or more stages where three or more tandem units are laminated. In such a case, it is possible to obtain an organic layer which emits white light as a whole by changing the colors of the emitted light to red, green, and blue in each of the tandem units. Examples of the methods for forming the organic layer include a physical vapor deposition method (PVD method) such as a vacuum vapor deposition method; a printing method such as a screen printing method or an ink jet printing method; a laser transfer method where a laminated structure of a laser absorption layer and an organic layer which are formed on a transfer substrate is irradiated with a laser so as to separate the organic layer on the laser absorption layer and transfer the organic layer; and various types of coating methods. In a case of forming the organic layer based on the vacuum vapor deposition method, for example, it is possible to obtain the organic layer by using a so-called metal mask and accumulating a material which passes through an opening which is provided in the metal mask, and the organic layer may be formed over the entire surface without patterning.

In the upper surface light emitting type display apparatus, for example, the first electrode is provided on an interlayer insulation layer. Then, the interlayer insulation layer covers the light emitting element driving section which is formed on the first substrate. The light emitting element driving section is configured by one or a plurality of thin film transistors (TFT) and the TFT and the first electrode are electrically connected with each other via a contact plug which is provided on the interlayer insulation layer. As the configuration material of the interlayer insulation layer, it is possible to use a $SiO_2$-based material such as $SiO_2$, BPSG, PSG, BSG, AsSG, PbSG, SiON, spin on glass (SOG), low melting point glass, and glass paste; a SiN-based material; an insulating resin such as a polyimide-based resin, a novolac-based resin, an acryl-based resin, or polybenzoxazole, either individually or in appropriate combinations. For forming the interlayer insulation layer, it is possible to use a process used in the art such as a CVD method, a coating method, a sputtering method, or various types of printing methods. In the lower surface light emitting type display apparatus with a configuration or structure where light from the light emitting element passes through the interlayer insulation layer, it is necessary for the interlayer insulation layer to be configured by a material which is transparent with respect to the light from the light emitting element and it is necessary for that light emitting element driving section to be formed so as not to shield the light from the light emitting element. In addition, in the lower surface light emitting type display apparatus, it is possible to provide the light emitting element driving section above the second electrode.

Above the organic layer, it is preferable to provide a protective film which has conductivity or an insulation property as described above for the purpose of preventing moisture from reaching the organic layer. It is preferable to form the protective film based on a film-forming method where the energy of the film-forming particles is small such as the vacuum vapor deposition method in particular, or a film-forming method such as the CVD method or the MOCVD method since it is possible to reduce the influence which forming the protective film has with respect to the base. Alternatively, it is desirable to film-form the protective film by setting the film-forming temperature to room temperature in order to prevent a decrease in luminance due to deterioration in the organic layer and furthermore, under conditions where the stress on the protective film is minimized in order to prevent the protective film from being peeled off. In addition, it is preferable to form the protective film without exposing the electrode, which is already formed, to the atmosphere and it is possible to prevent the deterioration in the organic layer due to moisture or oxygen in the atmosphere due to this. Furthermore, in a case where the display apparatus is an upper surface light emitting type, it is desirable to configure the protective film by a material which transmits, for example, 80% or more of the light which is generated in the organic layer and in detail, examples of the materials include insulating materials with an inorganic amorphous property, for example, the materials described above. Such insulating materials with an inorganic amorphous property do not generate a grain and therefore have low permeability and configure a favorable protective film. Here, in a case of configuring the protective film by a conductive material, it is sufficient if the protective film is configured by a transparent conductive material such as ITO or IZO.

It is possible to manufacture the display apparatus in the present disclosure based on each of the processes, for example, in which, after obtaining the second member where the inclined surface (which corresponds to the opposing surface) of the opening section is tilted by forming an interlayer insulation layer on the first substrate forming the first electrode on the interlayer insulation layer, forming a second member forming layer (in some cases, including a light absorbing layer) on the first electrode and the interlayer insulation layer, and then selectively removing the second member forming layer on the first electrode, or after obtaining the second member where the inclined surface (which corresponds to the opposing surface) of the opening section is tilted by forming a lower layer forming layer which configures the lower layer of the second member on the first electrode and the interlayer insulation layer, selectively removing the lower layer forming layer on the first electrode, forming the lower layer which has an opening section where the inclined surface is tilted, then forming an upper layer forming layer which configures an upper layer of the second member on the lower layer, and then selectively removing the upper layer forming layer, the organic layer and the second electrode are formed over the inclined surface (the opposing surface) of the opening section from over the first electrode which is exposed at the bottom section of the opening section and the first member is then formed on the second electrode. Alternatively, it is possible to manufacture the display apparatus based on each of the processes where, a resin material layer which has convex sections is obtained by preparing a stamper which has a complementary shape to the first member, coating a resin material on a supporting substrate, shaping the resin material using the stamper, and then removing the stamper, the top section of the convex sections of the resin material layer is flattened and an adhesive agent layer is then filled between the convex sections of the resin material layer or an upper layer formed of an inorganic material and a lower layer formed of an organic material (in detail, an adhesive agent) are filled between the convex sections of the resin material layer, the resin material layer is peeled from the supporting substrate, the adhesive agent layer is adhered to the first substrate, and the second member (including the light absorbing layer in some cases) formed of the adhesive agent layer (or the upper layer and the lower layer) and the first member formed of the resin material layer are obtained. In this manner, it is possible to manufacture an organic EL display apparatus which is able to further improve the light extracting efficiency from the light emitting element to the outside with a simple manufacturing method by obtaining the second member (including the light absorbing layer in some cases) formed of the adhesive agent layer and the first member formed of the resin material layer using a stamper.

In the method for manufacturing these display apparatuses, since it is possible to directly form the first member on the second electrode, there is no extraction loss of light which is output from the light emitting element which is caused by the adhesion layer being present between the second electrode and a reflector. Alternatively, since it is possible to obtain the second member formed of the adhesive agent layer and the first member formed of the resin material layer using a stamper, it is possible to manufacture a display apparatus which is able to further improve the light extracting efficiency from the light emitting element to the outside with a simple manufacturing method.

Embodiment 1

Figure 2:
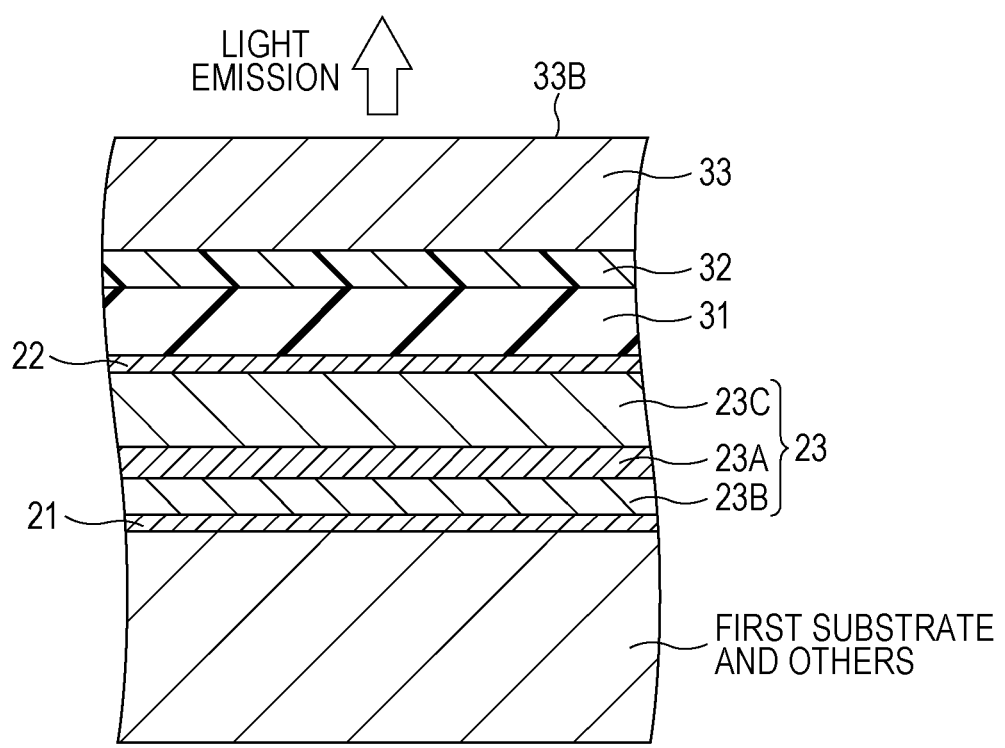
FIG. 2 is a schematic diagram of an organic layer or the like in a light emitting element which configures the display apparatus in Embodiment 1.
Figure 3A:
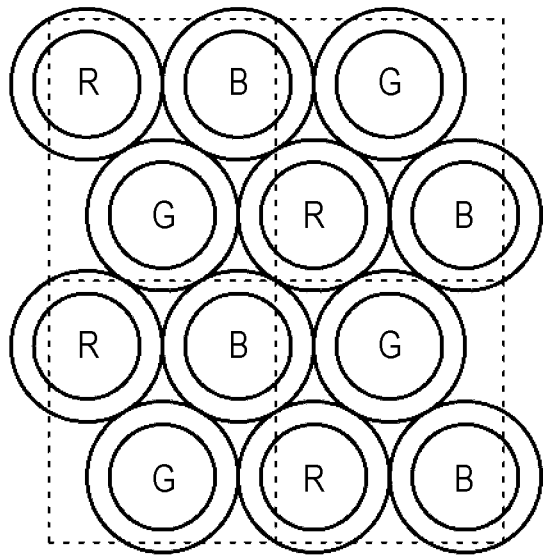
FIG. 3A and FIG. 3B are schematic diagrams each of which shows an arrangement of sub-pixels in display apparatuses of Embodiment 1 to Embodiment 6.

Embodiment 1 relates to a display apparatus according to the first embodiment and the second embodiment of the present disclosure, in detail, to an organic EL display apparatus. In addition, Embodiment 1 relates to a method for manufacturing a display apparatus of the embodiment of the present disclosure and a method for designing a display apparatus of the embodiment of the present disclosure. FIG. 1 shows a schematic partial cross-sectional diagram of a display apparatus (the display apparatus may be referred to below as an organic EL display apparatus) of Embodiment 1, FIG. 2 shows a schematic diagram of an organic layer and the like, and FIG. 3A shows a schematic diagram which represents an arrangement of sub-pixels. Here, one organic layer is shown in FIG. 2 in order to simplify the drawing; however, a plurality of organic layers are laminated in practice and the layers have a tandem structure with a plurality of stages.

In addition, the organic EL display apparatus of Embodiment 1 or of Embodiment 2 to Embodiment 5 which will be described below is an upper surface light emitting type. That is, light from each light emitting element 10 is output to the outside via a second electrode 22 which is equivalent to an upper section electrode and a second substrate 34. On the other hand, an organic EL display apparatus of Embodiment 6 which will be described below is a lower surface light emitting type where light from each light emitting element 10 is output to the outside via a first substrate 11.

The organic EL display apparatus of Embodiment 1 or of Embodiment 2 to Embodiment 6 which will be described below is provided with (A) the first substrate 11 where a plurality of light emitting elements 10, which are formed by laminating a first electrode 21, a light emitting section 24 which is configured by an organic layer 23 provided with a light emitting layer 23A formed of, for example, an organic light emitting material, and the second electrode 22, are formed and (B) the second substrate 34 which is arranged to oppose the first substrate 11, in which the first substrate 11 is further provided with a light reflecting layer 50 formed of first members 51 which propagate and output light from each light emitting element 10 to the outside and second members 52 placed between the first members 51, the first members 51 have a truncated cone shape where a cutting head section opposes the light emitting element 10, and a part of the light propagated by the first members 51 is completely reflected on an opposing surface 52' of the second member 52 which opposes the first members 51. Here, the shape of the first member 51 is, in detail, a truncated cone shape and the inclined surface of the truncated cone shape is linear. That is, the cross-sectional shape of the first member 51 is a trapezoid when the first member 51 is cut in a virtual plane which includes an axis line (z axis) of the first member 51 of the truncated cone shape, and the cross-sectional shape of the opposing surface 52' is also a trapezoid when the opposing surface 52' of the second member 52 is cut.

Then, when a tilting angle of the opposing surface 52' of the second member 52 is θ (units: degrees), a refractive index of a material which configures the first members 51 is $n_1$, and a refractive index of a material which configures the second members 52 is $n_2$ (here, $n_2 < n_1$), as will be described in detail below, (1) $75.2 - 54(n_1 - n_2) \le \theta \le 81.0 - 20(n_1 - n_2)$ is satisfied and preferably (2) $76.3 - 46(n_1 - n_2) \le \theta \le 77.0 - 20(n_1 - n_2)$ is satisfied.

Alternatively, as will be described in detail below, when a refractive index of a material which configures the first members 51 is $n_1$ and a refractive index of a material which configures the second members 52 is $n_2$ (here, $n_2 < n_1$), a tilting angle θ of the opposing surface 52' of the second member 52 is determined based on the value of the refractive index $n_1$, the value of the refractive index $n_2$, and the allowable variation range of the tilting angle θ of the opposing surface 52' of the second member 52.

Here, each light emitting element (organic EL element) 10 in the organic EL display apparatus of Embodiment 1 or Embodiment 2 to Embodiment 6 which will be described below is provided with, in more detail, (a) the first electrode 21, (b) the second member 52 which has an opening section 25 and where the first electrode 21 is exposed on the bottom section of the opening section 25, (c) the organic layer 23 which is provided on at least a portion of the first electrode 21 which is exposed on the bottom section of the opening section 25 and which is provided with the light emitting layer 23A formed of, for example, an organic light emitting material, and (d) the second electrode 22 formed on the organic layer 23. The organic layer 23 is, for example, configured by a laminated structure of a hole injection layer, a hole transporting layer 23B, the light emitting layer 23A, and an electron transporting layer 23C; however, there are cases where the diagrams represent the organic layer 23 as one layer.

The organic EL display apparatus in Embodiment 1 or Embodiment 2 to Embodiment 6 which will be described below is a high definition display apparatus which is applied to an electrical view finder (EVF) or a head mounted display (HMD) or, for example, a large organic EL display apparatus such as a television receiver.

The organic EL display apparatus of Embodiment 1 or Embodiment 2 to Embodiment 6 which will be described below has a plurality of light emitting elements (in detail, organic EL elements) 10. In detail, the number of pixels is, for example, 2048×1236 and one light emitting element 10 configures one sub-pixel and the number of the light emitting elements (in detail, organic EL elements) 10 is three times the number of pixels. Then, the organic EL display apparatus is an active matrix type color display.

One pixel is configured by three sub-pixels which are a red light emitting sub-pixel which emits a red color, a green light emitting sub-pixel which emits a green color, and a blue light emitting sub-pixel which emits a blue color. In addition, the second substrate 34 is provided with a color filter 33, the light emitting element 10 emits white light, and each color light emitting sub-pixel is configured by a combination of the light emitting element 10 which emits white light and the color filter 33. The color filter 33 is configured by a region where the transmitted light is red, a region where the transmitted light is green, and a region where the transmitted light is blue. A light shielding film (black matrix) may be provided between two of the color filters 33. The light emitting element 10 and the first member 51 are in contact. In detail, the second electrode 22 and the first member 51 are in direct contact.

Figure 3B:
Figure 3B:
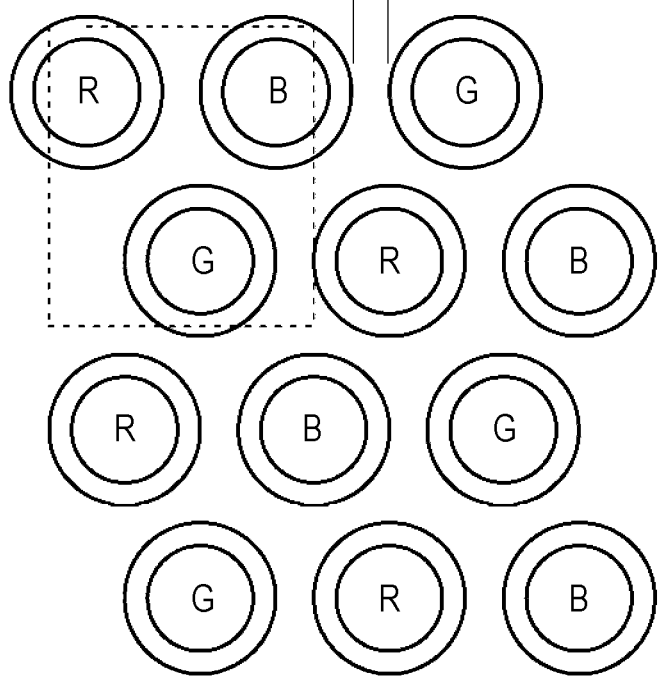

In the organic EL display apparatus of Embodiment 1 or Embodiment 2 to Embodiment 6 which will be described below, an arrangement of sub-pixels is a pseudo delta arrangement as shown in FIG. 3A and FIG. 3B and the size of one pixel which is surrounded by a dotted line is, for example, 5 μm×5 μm. Here, FIG. 3A and FIG. 3B show four pixels. In FIG. 3A and FIG. 3B, red color light emitting sub-pixels are shown with "R", green light emitting sub-pixels are shown with "G", and blue light emitting sub-pixels are shown with "B". In the example shown in FIG. 3A, the distance between two structures is 0 μm and in the example shown in FIG. 3B, the distance between two structures exceeds 0 μm. However, the arrangement of sub-pixels is not limited thereto.

In Embodiment 1 or Embodiment 2 to Embodiment 6 which will be described below, each light emitting element has a tandem structure with three stages where three tandem units are laminated and the organic layer 23 in each of the tandem units is configured, in detail, by a red light emitting organic layer, a green light emitting organic layer, and a blue light emitting organic layer which are exemplified below. However, the light emitting elements are not limited thereto. Here, the average refractive index of the entire organic layer is (real part, imaginary part)=(1.85, 0).

In detail, the red light emitting organic layer is configured by [hole injection layer] (thickness 10 nm): LGHIL manufactured by LG Chem, Co., Ltd., [hole transporting layer] (thickness 26 nm): HT320 manufactured by Idemitsu Kosan Co., Ltd., [light emitting layer] (thickness 50 nm): RH001 manufactured by Idemitsu Kosan Co., Ltd., and D125 (0.5% doped) manufactured by Toray Industries, Inc., and [electron transporting layer] (thickness 220 nm): ET085 manufactured by Idemitsu Kosan Co., Ltd., from the first electrode side.

In addition, the green light emitting organic layer is configured by [hole injection layer] (thickness 10 nm): LGHIL manufactured by LG Chem, Co., Ltd., [hole transporting layer] (thickness 35 nm): HT320 manufactured by Idemitsu Kosan Co., Ltd., [light emitting layer] (thickness 30 nm): BH232 and GD206 (10% doped) manufactured by Idemitsu Kosan Co., Ltd., and [electron transporting layer] (thickness 175 nm): ETS085 manufactured by Idemitsu Kosan Co., Ltd., from the first electrode side.

Furthermore, the blue light emitting organic layer is configured by [hole injection layer] (thickness 10 nm): LGHIL manufactured by LG Chem, Co., Ltd., [hole transporting layer] (thickness 24 nm): HT320 manufactured by Idemitsu Kosan Co., Ltd., [light emitting layer] (thickness 30 nm): BH232 and BD218 (10% doped) manufactured by Idemitsu Kosan Co., Ltd., and [electron transporting layer] (thickness 141 nm): ET085 manufactured by Idemitsu Kosan Co., Ltd., from the first electrode side.

In Embodiment 1 or Embodiment 2 to Embodiment 5 which will be described below, the first electrode 21 is used as an anode electrode and the second electrode 22 is used as a cathode electrode. The first electrode 21 is formed of a light reflecting material, in detail, an Al—Nd alloy while the second electrode 22 is formed of a half-light transmitting material, in detail, a conductive material which includes magnesium (Mg), in more detail, a Mg—Ag alloy with a thickness of 10 nm. The first electrode 21 is formed based on a combination of the vacuum vapor deposition method and the etching method. In addition, in particular, the second electrode 22 is film-formed by a film-forming method where energy of the film-forming particles is small such as a vacuum vapor deposition method and is not patterned. The measurement results of the light reflectivity of the first electrode 21, the refractive index of the second electrode 22, and the light transmittance are as shown in Table 1 below.

TABLE 1

| Refractive Index of First Electrode 21 | |
|---|---|
| Real Part: | 0.755 |
| Imaginary Part: | 5.466 |
| Refractive Index of Second Electrode 22 | |
| Real Part: | 0.617 |
| Imaginary Part: | 3.904 |
| Light Reflectivity of First Electrode 21: 85 | |
| Light Transmittance of Second Electrode 22: 57% | |

In Embodiment 1 or Embodiment 2 to Embodiment 5 which will be described below, the first electrode 21 which configures an organic EL element is provided on an interlayer insulation layer 16 (in more detail, an upper layer interlayer insulation layer 16B) formed of SiON which is formed based on the CVD method. Then, the interlayer insulation layer 16 covers an organic EL element driving section which is formed on the first substrate 11. The organic EL element driving section is configured by a plurality of TFTs and the TFTs and the first electrode 21 are electrically connected with each other via a contact plug 18, wiring 17, and a contact plug 17A which are provided in the interlayer insulation layer (in more detail, the upper layer interlayer insulation layer 16B). Here, in the diagram, one TFT is shown for one organic EL element driving section. The TFT is configured by a gate electrode 12 which is formed on the first substrate 11, a gate insulation film 13 which is formed on the first substrate 11 and the gate electrode 12, a source/drain region 14 which is provided in a semiconductor layer which is formed on the gate insulation film 13, and a channel forming region 15 to which a portion of the semiconductor layer, which is positioned above the gate electrode 12, in the source/drain region 14, is equivalent. Here, in the example shown in the diagram, the TFT is set as a bottom gate type; however, the TFT may be a top gate type. The gate electrode 12 of the TFT is connected with a scanning circuit (which is not shown in the diagram).

In Embodiment 1 or Embodiment 2 to Embodiment 5 which will be described below, the first substrate 11 is configured by a silicon substrate and the second substrate is configured by non-alkali glass or quartz glass. On the other hand, in Embodiment 6 which will be described below, the first substrate 11 and the second substrate are configured by non-alkali glass or quartz glass.

Then, in the organic EL display apparatus in Embodiment 1 or Embodiment 2 to Embodiment 5 which will be described below, as described above, a part of the light propagated by the first members 51 is completely reflected on the opposing surface 52' of the second member 52 which opposes the first members 51 (that is, on an interface between the first members 51 and the second member 52). In more detail, since the organic layer 23 and the second electrode 22 are formed between the first member 51 and the second member 52, a part of the light propagated by the first members 51 is completely reflected on the interface between the second member 52 and the organic layer 23. Such a configuration is referred to as an "anode reflector structure" for convenience. Light which is output from the light emitting element 10 and is output from the first members 51 in parallel with an axis line of the truncated cone shape is completely reflected on the opposing surface 52' when the light hits the opposing surface 52' of the second member 52.

In detail, in Embodiment 1, the first member 51 of the truncated cone shape is, for example, formed of silicon nitride ($Si_{1-x}N_x$) and the second member 52 is, for example, formed of an acryl-based resin. The value of the refractive index $n_1$ of the material which configures the first members 51 and the value of the refractive index $n_2$ of the material which configures the second member 52 are shown in Table 2 below and satisfy $n_1-n_2 \leq 0.4$. In addition, a value of an area S of the cutting head section of the truncated cone shape is, for example, set to 28 μm² (the shape of the cutting head section of the truncated cone shape is a circle with a diameter of 6 μm), the value of the height H of the truncated cone shape is, for example set to 5 μm, and the value of the tilting angle θ is set to 68 degrees.

Furthermore, in Embodiment 1 or Embodiment 2 to Embodiment 5 which will be described below, a protective film 31 and a sealing material layer 32 are further provided on the first member 51 and the second member 52 (the light reflecting layer 50). A refractive index $n_3$ of the protective film 31 formed of $Si_{1-y}N_y$ and a refractive index $n_4$ of the sealing material layer 32 formed of an epoxy-based resin are shown in Table 2 below and satisfy $|n_3-n_4| \leq 0.3$. The protective film 31 is formed based on the plasma CVD method for the purpose of preventing moisture from reaching the organic layer 23. Here, the structure may be a structure where the first member 51 and the protective film 31 are integrated by forming the first member 51 and the protective film 31 at the same time. In addition, in FIG. 1, the top surface of the first member 51 and the top surface of the second electrode 22 on the second member 52 are shown at the same level; however, the first member 51 may cover the second electrode 22 on the top surface of the second member 52. That is, the first member 51 may cover the entire surface.

TABLE 2

| | Real Part | Imaginary Part |
|---|---|---|
| Refractive Index $n_1$ of Material which configures First Member 51: | 1.81 | 0.00 |
| Refractive Index $n_2$ of Material which configures Second Member 52: | 1.54 | 0.00 |
| Refractive Index $n_3$ of Protective film 31 formed of $Si_{1-y}N_y$: | 1.81 | 0.00 |
| Refractive Index $n_4$ of Sealing Material Layer 32 formed of an epoxy-based resin: | 1.71 | 0.00 |

Figure 19A:
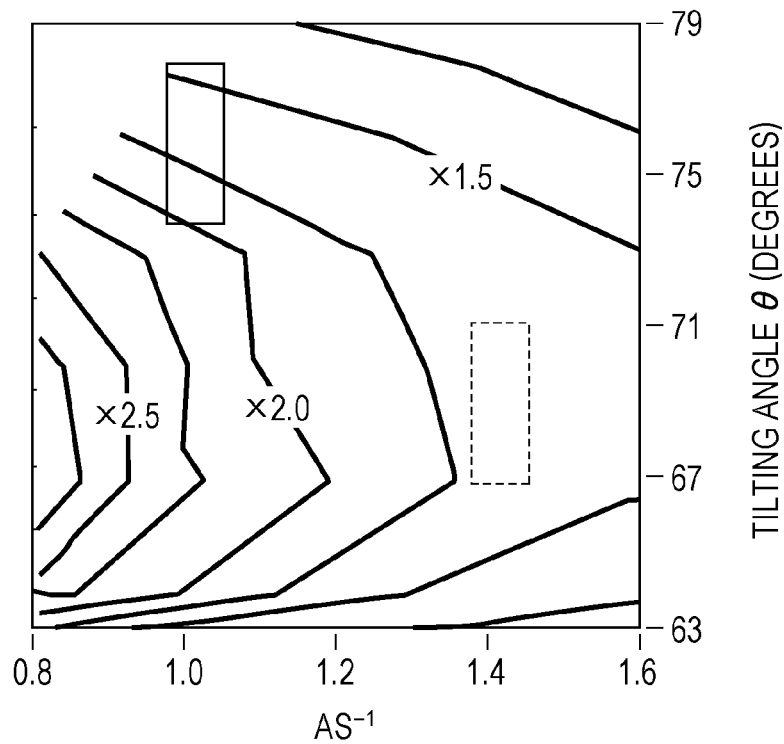
FIG. 19A and FIG. 19B are graphs each of which shows a result where a relative luminance value at a 0 degree viewing angle is determined by simulation when $\Delta n (=n_1-n_2) = 0.20$ by setting the reciprocal of an aspect ratio and the tilting angle $\theta$ as parameters in the display apparatus of Embodiment 1 and comparative example 1.

In Embodiment 1, by setting $\Delta n(=n_1-n_2)=0.20$ as a parameter, a relationship between the tilting angle θ, the reciprocal of an aspect ratio $AS^{-1}\{=(4S/\pi)^{1/2}/H\}$, and a relative luminance value at a 0 degree viewing angle of light which is output from the light emitting element 10 via the first member 51 is determined by simulation. Here, $n_1=1.80$ and $n_2=1.60$. FIG. 19A shows the result and the horizontal axis (X axis) in FIG. 19A or FIG. 19B, FIG. 20A, FIG. 20B, FIG. 21A, FIG. 21B, FIG. 22, and FIG. 23B which will be described below is the reciprocal of an aspect ratio $AS^{-1}$ and the vertical axis (Y axis) is the tilting angle θ. In addition, the contour lines in FIG. 19A, FIG. 19B, FIG. 20A, FIG. 20B, FIG. 21A, FIG. 21B, FIG. 22, and FIG. 23B show a relative luminance value at a 0 degree viewing angle (below, simply called a "relative luminance value") and "X1.5", "X2.0", "X2.5", and the like are values of $Bn_1/Bn_0$. Here, light which is output from the light emitting section is assumed to be Lambert light.

Figure 19B:
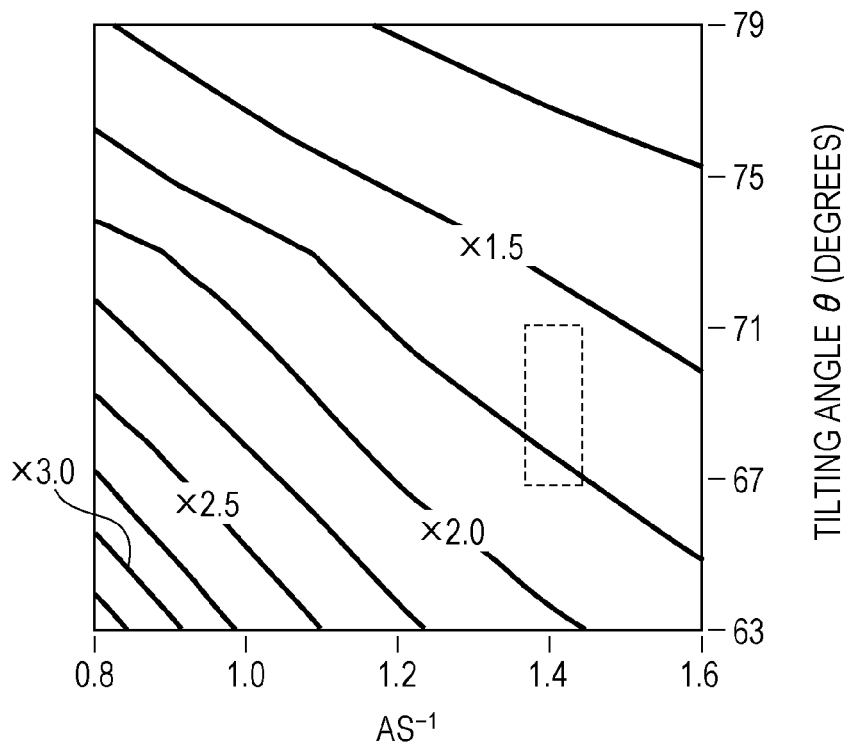

In addition, assuming a display apparatus where a metal reflecting layer formed of aluminum is formed on an interface between the first member 51 and the second member 52 and where light which is propagated by the first members 51 toward the interface of the first member 51 and the second member 52 is completely reflected by the metal reflecting layer, the relative luminance value is determined by simulation as comparative example 1. FIG. 19B shows the result.

In Embodiment 1, as shown in FIG. 19A, when the value of the tilting angle θ is 73 degrees or more, the relative luminance value monotonously decreases as the reciprocal of an aspect ratio $AS^{-1}$ becomes greater and the value of the tilting angle θ becomes smaller. In addition, when the value of the tilting angle θ is 67 degrees or more and less than 73 degrees, the relative luminance value decreases as the reciprocal of an aspect ratio $AS^{-1}$ becomes greater. Furthermore, when the value of the tilting angle θ is less than 67 degrees, the relative luminance value increases as the reciprocal of an aspect ratio $AS^{-1}$ becomes smaller and the value of the tilting angle θ becomes smaller.

That is, in Embodiment 1, the contour line of the relative luminance value has a convex shape and the convex shape extends in the X axis direction (a direction which regulates the reciprocal of an aspect ratio $AS^{-1}$) and in addition to this, the bottom section of the convex shape has a shape which faces the X axis direction. That is, a convex shape which protrudes in the X axis direction is shown.

On the other hand, in comparative example 1, as shown in FIG. 19B, the relative luminance value monotonously decreases as the reciprocal of an aspect ratio $AS^{-1}$ becomes greater regardless of the value of the tilting angle θ.

In Embodiment 1, while the relative luminance value is increased by a part of light which hits the opposing surface 52' being completely reflected, an extreme increase of the relative luminance value is suppressed by the remainder of the light which hits the opposing surface 52' entering the second member 52. Then, due to these, the contour line of the relative luminance value, as described above, shows a convex shape which protrudes in the X axis direction in a coordinate system where the reciprocal of an aspect ratio $AS^{-1}$ is set as an X axis and the tilting angle θ of the opposing surface is set as a Y axis.

Here, it is assumed that the reciprocal of an aspect ratio $AS^{-1}$: 1.4, the tilting angle θ: 69 degrees, the allowable variation range of the tilting angle θ: within ±2 degrees, and the variation of the reciprocal of an aspect ratio $AS^{-1}$: within ±0.05. Then, in the top section of the convex shape or the vicinity thereof (the assumed region is shown with a dotted line rectangle in FIG. 19A), the change in the relative luminance value is small even when the tilting angle θ of the opposing surface changes. On the other hand, in other regions in the convex shape (for example, shown with a solid line rectangle in FIG. 19A), the change in the relative luminance value is large with respect to the change in the tilting angle θ of the opposing surface. That is, the influence which the variation of the tilting angle θ of the opposing surface has on the relative luminance value is large. FIG. 24A shows a conceptual diagram of a relative luminance value at a 0 degree viewing angle when the reciprocal of an aspect ratio and the tilting angle θ are set as parameters in the display apparatus of Embodiment 1. In the region shown with a line segment "A" in FIG. 24A (a region where only an allowable variation range of the tilting angle θ is considered) or a rectangular region "B" (a region where an allowable variation range of the tilting angle θ and an allowable variation range of the reciprocal of an aspect ratio are considered), the contour lines of the relative luminance value are not crowded and the change in the relative luminance value is small even when the tilting angle θ of the opposing surface changes; however, in a rectangular region "C", the contour lines of the relative luminance value are crowded and the relative luminance value changes greatly when the tilting angle θ of the opposing surface changes.

On the other hand, in comparative example 1, since the relative luminance value monotonously decreases as the reciprocal of an aspect ratio $AS^{-1}$ becomes greater regardless of the value of the tilting angle θ, the change in the relative luminance value is large with respect to the change in the tilting angle θ of the opposing surface (the assumed region described above is shown with a dotted line rectangle in FIG. 19B). That is, the influence which the variation of the tilting angle θ of the opposing surface has on the relative luminance value is large. Then, there is no region where the change in the relative luminance value is small even when the tilting angle θ of the opposing surface changes.

Then, when the allowable change range of the relative luminance value (the difference between the maximum value and the minimum value of the relative luminance value at a 0 degree viewing angle, the same applies below) is set as a desired value, in comparative example 1, the variation of the relative luminance value is outside of the allowable change range of the relative luminance value. Here, the variation in the relative luminance value is, for example, a value where the relative luminance value minimum value of the upper right corner section of the rectangular assumed region is subtracted from the relative luminance value maximum value of the lower left corner section of the rectangular assumed region shown with a dotted line in FIG. 19B. On the other hand, in Embodiment 1, the variation of the relative luminance value is kept within the allowable change range of such a relative luminance value (the variation of the relative luminance value: approximately ±0.05).

Figure 20A:
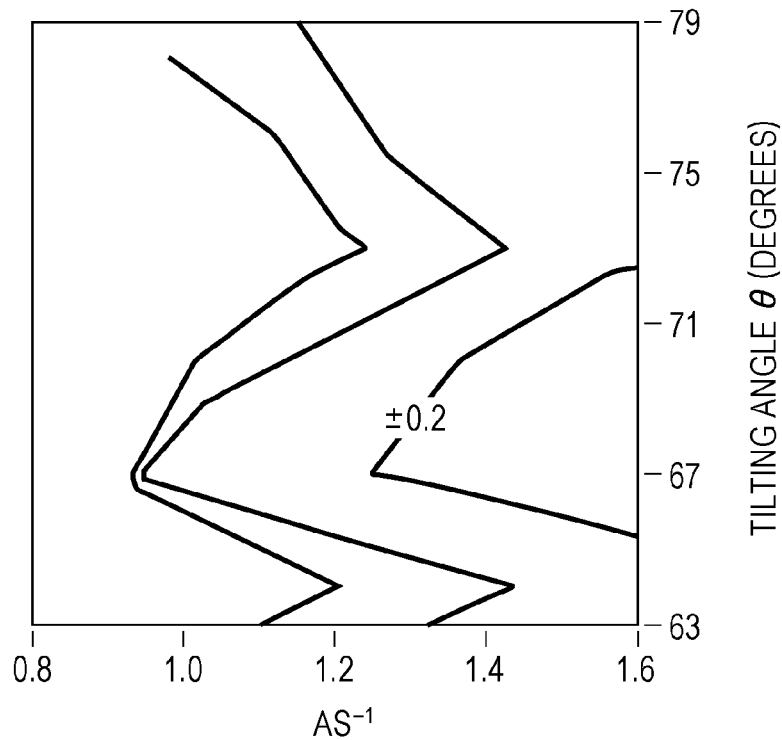
FIG. 20A and FIG. 20B are graphs each of which shows a result where changes in a relative luminance value are determined by simulation when variations of the tilting angle $\theta$ and variations of the reciprocal of an aspect ratio are set in the display apparatus of Embodiment 1 and comparative example 1.
Figure 20B:
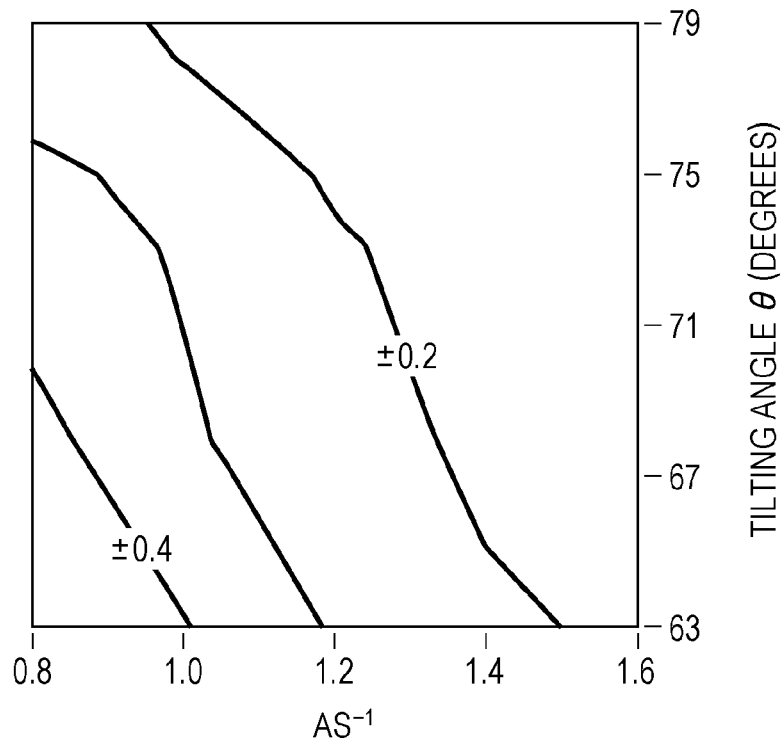

In Embodiment 1 and comparative example 1, FIG. 20A and FIG. 20B show the extent of the change in the relative luminance value when it is assumed that the allowable variation range of the tilting angle θ: within ±1 degrees and the variation of the reciprocal of the aspect ratio $AS^{-1}$: within ±0.03. In comparative example 1, the change in the relative luminance value monotonously decreases as the reciprocal of an aspect ratio $AS^{-1}$ becomes greater regardless of the value of the tilting angle θ. On the other hand, in Embodiment 1, the change in the relative luminance value is small when the tilting angle θ is 66 degrees to 72 degrees.

From the analysis results above, it is understood that the upper limit value, the optimum value, and the lower limit value in the tilting angle θ (here, Δn=0.20) are as shown in Table 3 below in a case where it is assumed that the allowable variation range of the tilting angle θ is within the maximum (A)=4 degrees. Here, the upper limit value (A) and the lower limit value (A) are values in a case where it is assumed that the allowable variation range of the tilting angle θ is within the maximum (A).

Figure 21A:
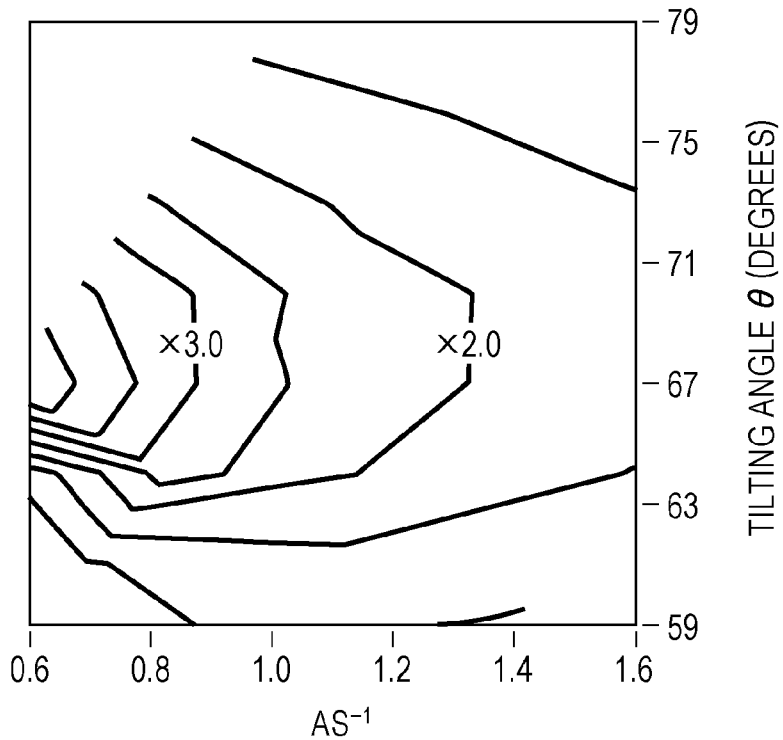
FIG. 21A and FIG. 21B are graphs each of which shows a result where a relative luminance value at a 0 degree viewing angle is determined by simulation when $\Delta n(=n_1-n_2)=0.25$ and $\Delta n=0.15$ by setting the reciprocal of an aspect ratio and the tilting angle $\theta$ as parameters in the display apparatus of Embodiment 1.
Figure 21B:
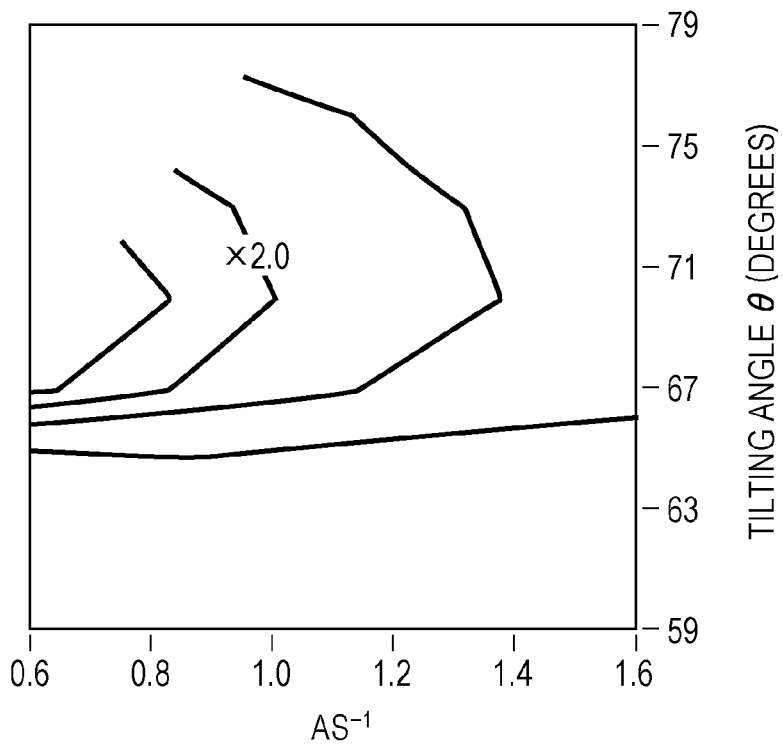
Figure 22:
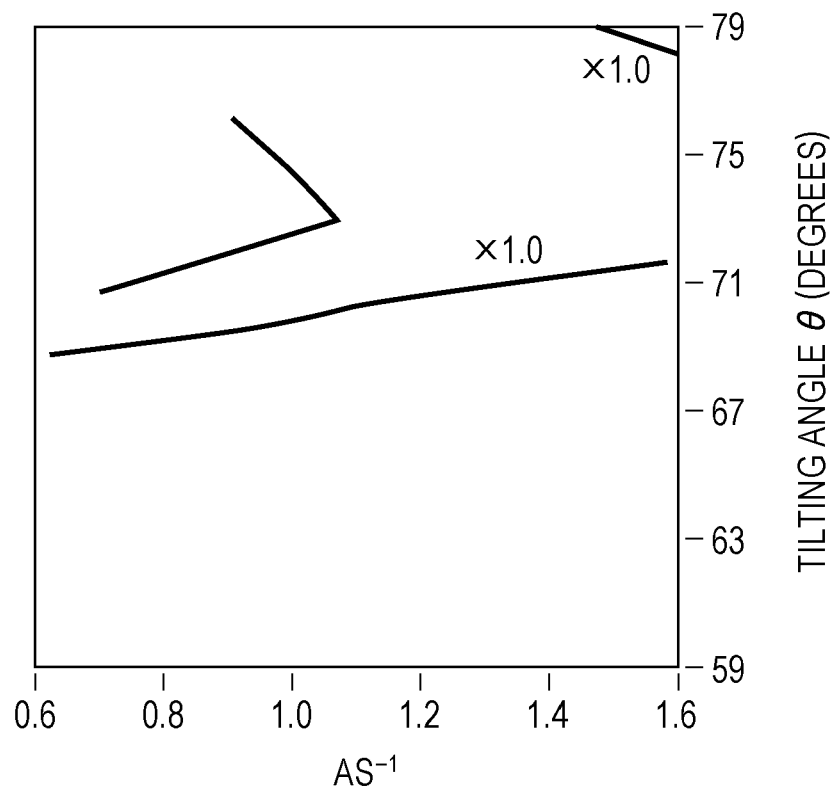
FIG. 22 is a graph which shows a result where a relative luminance value at a 0 degree viewing angle is determined by simulation when $\Delta n(=n_1-n_2)=0.10$ by setting the reciprocal of an aspect ratio and the tilting angle θ as parameters in the display apparatus of Embodiment 1.

In the same manner as the case of Δn=0.20, by setting Δn=0.25, Δn=0.15, and Δn=0.10 as parameters, the relationship between the reciprocal of an aspect ratio $AS^{-1}$, the tilting angle θ, and the relative luminance value is determined by simulation. FIG. 21A, FIG. 21B, and FIG. 22 show the results. Then, in the same manner, in a case where it is assumed that the allowable variation range of the tilting angle θ is within the range described above, it is understood that the upper limit value, the optimum value, and the lower limit value of the tilting angle θ (here, Δn=0.25), the tilting angle θ (here, Δn=0.15), and the tilting angle θ (here, Δn=0.10) are as shown in Table 3 below.

TABLE 3

| [Tilting Angle θ (here, Δn = 0.10)] | |
|---|---|
| Upper Limit Value (A): | 75 degrees |
| Optimum Value: | 73 degrees |
| Lower Limit Value (A): | 72 degrees |
| [Tilting Angle θ (here, Δn = 0.15)] | |
| Upper Limit Value (A): | 74 degrees |
| Optimum Value: | 71 degrees |
| Lower Limit Value (A): | 69 degrees |
| [Tilting Angle θ (here, Δn = 0.20)] | |
| Upper Limit Value (A): | 73 degrees |
| Optimum Value: | 69 degrees |
| Lower Limit Value (A): | 67 degrees |
| [Tilting Angle θ (here, Δn = 0.25)] | |
| Upper Limit Value (A): | 72 degrees |
| Optimum Value: | 67 degrees |
| Lower Limit Value (A): | 65 degrees |

Figure 23A:
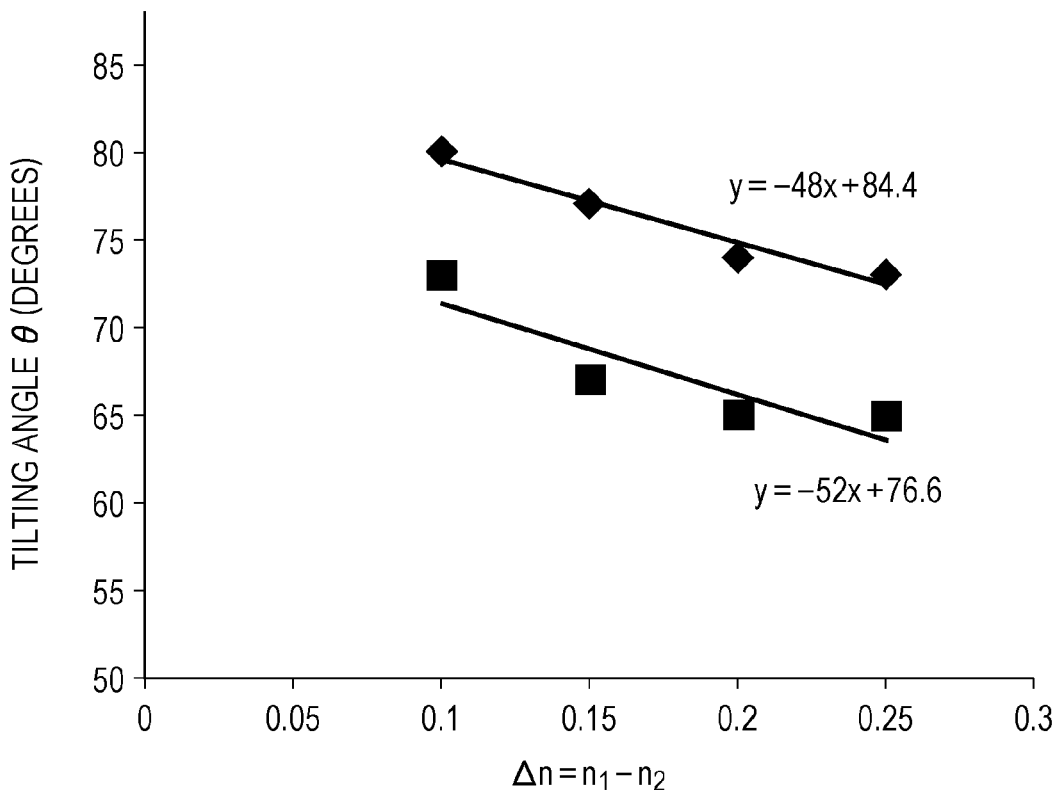
FIG. 23A is a graph which shows a relationship between the tilting angle θ and $\Delta n(=n_1-n_2)$ and FIG. 23B is a diagram where a region where the relative luminance value at a 0 degree viewing angle is 1.25 or more, variation of the relative luminance value at a 0 degree viewing angle is within 0.30, and a half value viewing angle is 45 degrees or more is blackened.

The following formula (1) is determined from the result of the upper limit value (A) and the lower limit value (A) above and the following formula (2) is determined from the result of the upper limit value (B) and the lower limit value (B). That is, it is proved that it is necessary for the tilting angle θ and $\Delta n = (n_1 - n_2)$ to satisfy (1) $75.2 - 54(n_1 - n_2) \leq \theta \leq 81.0 - 20(n_1 - n_2)$, preferably, (2) $76.3 - 46(n_1 - n_2) \leq \theta \leq 77.0 - 20(n_1 - n_2)$. Here, FIG. 23A shows a graph of the relationship described above between the tilting angle θ and $\Delta n (= n_1 - n_2)$. By $\Delta n = (n_1 - n_2)$ and the tilting angle θ satisfying these relationships, it is possible to set the variation of the relative luminance value at a 0 degree viewing angle based on the light which is output from the light emitting element 10 via the first member 51 to a maximum of 0.5 and it is possible to set the relative luminance value at a 0 degree viewing angle based on the light which is output from the light emitting element 10 via the first member 51 to 1.5 or more to 3.0 or less. Alternatively, based on the allowable variation range of the tilting angle θ in the light emitting element 10 which configures the display apparatus [in detail, for example, by setting the allowable variation range to a maximum of 4 degrees (by setting to a maximum of 4 degrees)] and further by determining the value of the tilting angle θ such that the difference between the maximum value and the minimum value of the relative luminance value at a 0 degree viewing angle is minimized and manufacturing a light emitting element which has the tilting angle θ, it is possible to set the variation of the relative luminance value at a 0 degree viewing angle based on the light which is output from the light emitting element 10 via the first member 51 to a maximum of 0.5 and it is possible to set the relative luminance value at a 0 degree viewing angle based on the light which is output from the light emitting element 10 via the first member 51 to 1.5 or more to 3.0 or less. Here, when the value of the relative luminance value at a 0 degree viewing angle is set to be excessively high, since the value of the luminance value of the high viewing angle (for example, 60 degrees) decreases and the viewing angle characteristics deteriorate, it is preferable that the setting value of the relative luminance value at a 0 degree viewing angle be, for example, 1.5 to 3.0 when the allowable change range of the relative luminance value at a 0 degree viewing angle is set. Here, in these cases, it is preferable to set the allowable variation range of the reciprocal of an aspect ratio $AS^{-1}$ [that is $\{(4S/\pi)^{1/2}/H\}$] in the light emitting element 10 which configures the display apparatus to a maximum of 0.2 (set to have a maximum of 0.2). In addition, it is preferable that the reciprocal of an aspect ratio $\{(4S/\pi)^{1/2}/H\}$ satisfy $0.8 \leq (4S/\pi)^{1/2}/H \leq 1.6$.

That is, in the method for designing the display apparatus of Embodiment 1, when a refractive index of a material which configures the first members 51 is $n_1$, a refractive index of a material which configures the second members 52 is $n_2$ (here, $n_2 < n_1$), an area of the cutting head section of the truncated cone shape is S, the height of the truncated cone shape is H, and $\Delta n = n_1 - n_2$, a relationship between the tilting angle $\theta$ of the opposing surfaces of the second members 52, $\{(4S/\pi)^{1/2}/H\}$, and the relative luminance value at a 0 degree viewing angle of light which is output from the light emitting element 10 via the first members 51 is determined by setting $\Delta n$ as a parameter and [a] the maximum value and the minimum value of the relative luminance value at a 0 degree viewing angle are determined based on the desired value of $\{(4S/\pi)^{1/2}/H\}$ and the allowable variation range of the tilting angle $\theta$ and the tilting angle $\theta$ is determined such that a difference between the maximum value and the minimum value of the relative luminance value at a 0 degree viewing angle is minimized or [b] the maximum value and the minimum value of the relative luminance value at a 0 degree viewing angle are determined based on the allowable variation range of $\{(4S/\pi)^{1/2}/H\}$ and the allowable variation range of the tilting angle $\theta$ and the tilting angle $\theta$ is determined such that the difference between the maximum value and the minimum value of the relative luminance value at a 0 degree viewing angle is minimized.

In addition, in the method for manufacturing the display apparatus of Embodiment 1, when a refractive index of a material which configures the first members 51 is $n_1$, a refractive index of a material which configures the second members 52 is $n_2$ (here, $n_2 < n_1$), the area of the cutting head section of the truncated cone shape is S, the height of the truncated cone shape is H, and $\Delta n = n_1 - n_2$, a relationship between the tilting angle $\theta$ of the opposing surfaces of the second members 52, $\{(4S/\pi)^{1/2}/H\}$, and the relative luminance value at a 0 degree viewing angle of light which is output from the light emitting element 10 via the first members 51 is determined by setting $\Delta n$ as a parameter, [a] the maximum value and the minimum value of the relative luminance value at a 0 degree viewing angle are determined based on the desired value of $\{(4S/\pi)^{1/2}/H\}$ and the allowable variation range of the tilting angle $\theta$ and the tilting angle $\theta$ is determined such that a difference between the maximum value and the minimum value of the relative luminance value at a 0 degree viewing angle is minimized or [b] the maximum value and the minimum value of the relative luminance value at a 0 degree viewing angle are determined based on the allowable variation range of $\{(4S/\pi)^{1/2}/H\}$ and the allowable variation range of the tilting angle $\theta$ and the tilting angle $\theta$ is determined such that the difference between the maximum value and the minimum value of the relative luminance value at a 0 degree viewing angle is minimized, and a light reflecting layer which has the determined tilting angle $\theta$ is manufactured.

Figure 23B:
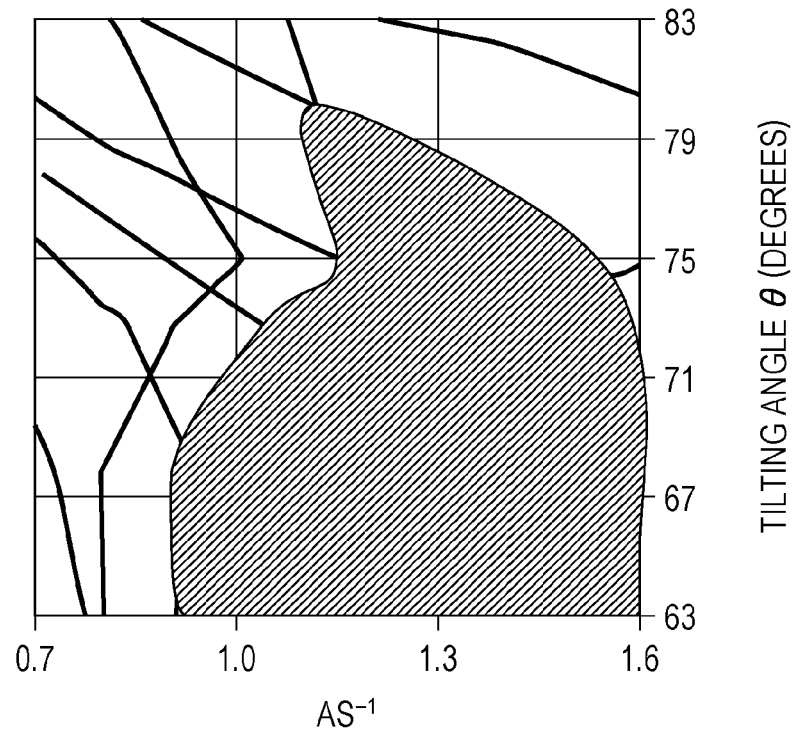

In the display apparatus of Embodiment 1, a relationship between the reciprocal of an aspect ratio, the tilting angle $\theta$, and the relative luminance value at a 0 degree viewing angle is determined by simulation by setting $\Delta n(=n_1-n_2)=0.20$ as a parameter and furthermore, FIG. 23B shows a diagram where a region where a relative luminance value at a 0 degree viewing angle is 1.25 or more, a variation of a relative luminance value at a 0 degree viewing angle is within 0.30, and a half value viewing angle is 45 degrees or more is blackened and it is understood that it is possible to obtain a wide region in Embodiment 1. Here, the "half value viewing angle" is a viewing angle when the luminance is less than 0.5 when the viewing angle is increased by standardizing the luminance at the front (a 0 degree viewing angle) as 1.

Below, description will be given of a summary of the method for manufacturing the organic EL display apparatus of Embodiment 1 with reference to FIG. 15A, FIG. 15B, FIG. 15C, FIG. 16A, FIG. 16B, and FIG. 17. However, it is possible to manufacture the organic EL display apparatus of Embodiment 1 based on each of the processes where the second member 52 where the inclined surface (the opposing surface) of the opening section 25 is tilted is obtained by forming an interlayer insulation layer on the first substrate 11 and forming the first electrode 21 on the interlayer insulation layer, and subsequently forming a second member forming layer on the first electrode 21 and the interlayer insulation layer and then selectively removing the second member forming layer on the first electrode 21, after which the first member 51 is formed on the second electrode 22 after the light emitting section 24 and the second electrode 22 are formed over the inclined surface (the opposing surface) of the opening section 25 from the first electrode 21 which is exposed on the bottom section of the opening section 25.

[Step-100]

Firstly, a TFT is created for each sub-pixel on the first substrate 11 by a method used in the art. The TFT is configured by the gate electrode 12 which is formed on the first substrate 11, the gate insulation film 13 which is formed on the first substrate 11 and the gate electrode 12, the source/drain region 14 which is provided in a semiconductor layer which is formed on the gate insulation film 13, and the channel forming region 15 to which a portion of the semiconductor layer, which is positioned at above the gate electrode 12, in the source/drain region 14, is equivalent. Here, in the example shown in the diagram, the TFT is set as a bottom gate type; however, the TFT may be a top gate type. The gate electrode 12 of the TFT is connected with a scanning circuit (which is not shown in the diagram). Next, an opening 16' is formed on the lower layer interlayer insulation layer 16A based on the photolithography technique and the etching technique after film-forming the lower layer interlayer insulation layer 16A formed of $SiO_2$ so as to cover the TFT on the first substrate 11 by the CVD method (refer to FIG. 15A).

[Step-110]

Next, wiring 17 formed of aluminum is formed on the lower layer interlayer insulation layer 16A based on a combination of the vacuum vapor deposition method and the etching method. Here, the wiring 17 is electrically connected with the source/drain region 14 of the TFT via the contact plug 17A which is provided inside the opening 16'. The wiring 17 is connected with a signal supplying circuit (which is not shown in the diagram). Then, an upper layer interlayer insulation layer 16B formed of $SiO_2$ is film-formed on the entire surface by the CVD method. Next, an opening 18' is formed on the upper layer interlayer insulation layer 16B based on the photolithography technique and the etching technique (refer to FIG. 15B).

[Step-120]

Figure 15A:
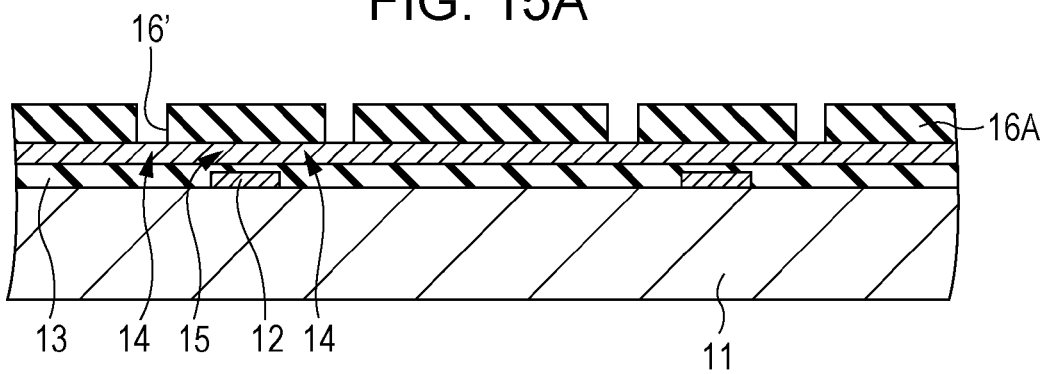
FIG. 15A, FIG. 15B, and FIG. 15C are schematic partial end surface diagrams of a first substrate and the like for illustrating the outline of a method for manufacturing the display apparatus of Embodiment 1.
Figure 15B:
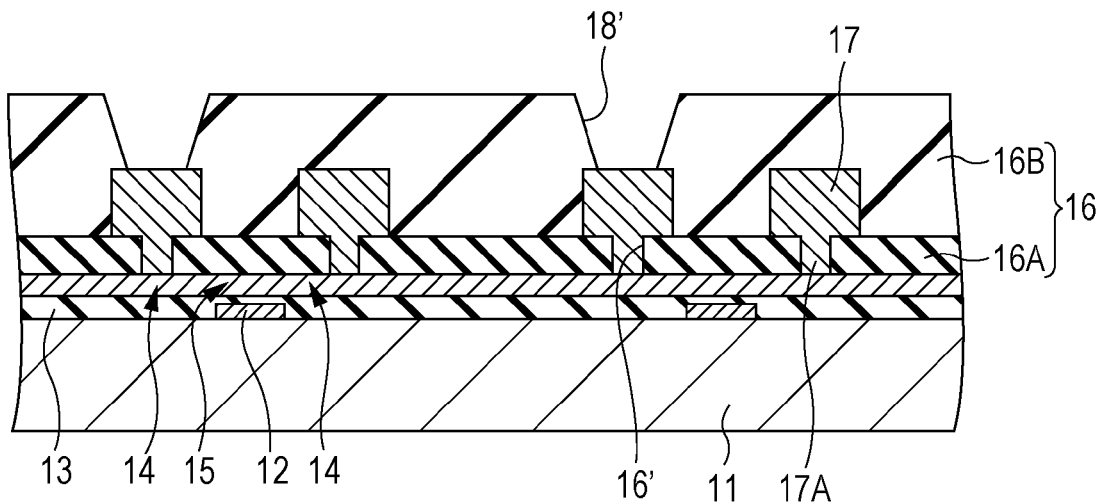
Figure 15C:
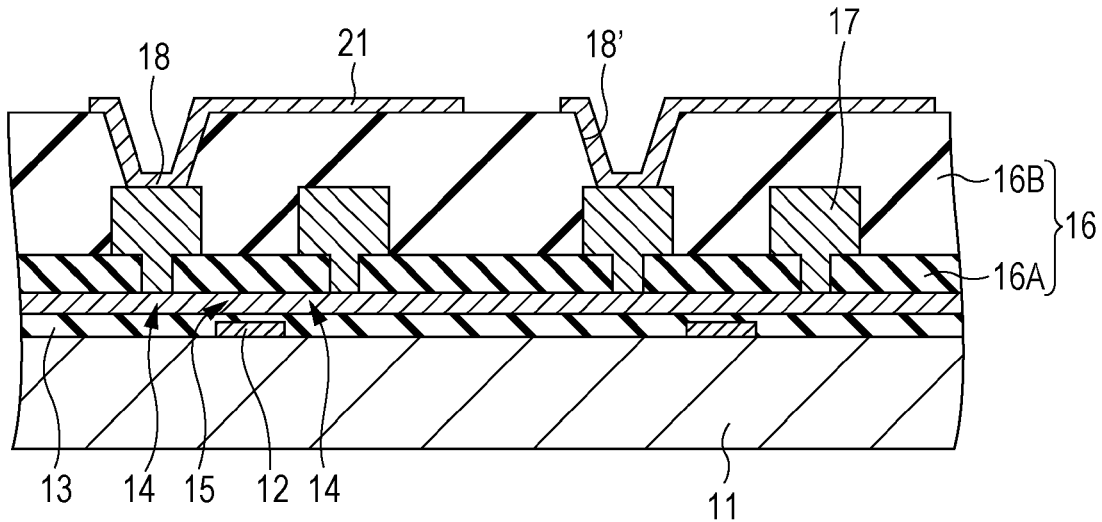
Figure 16A:
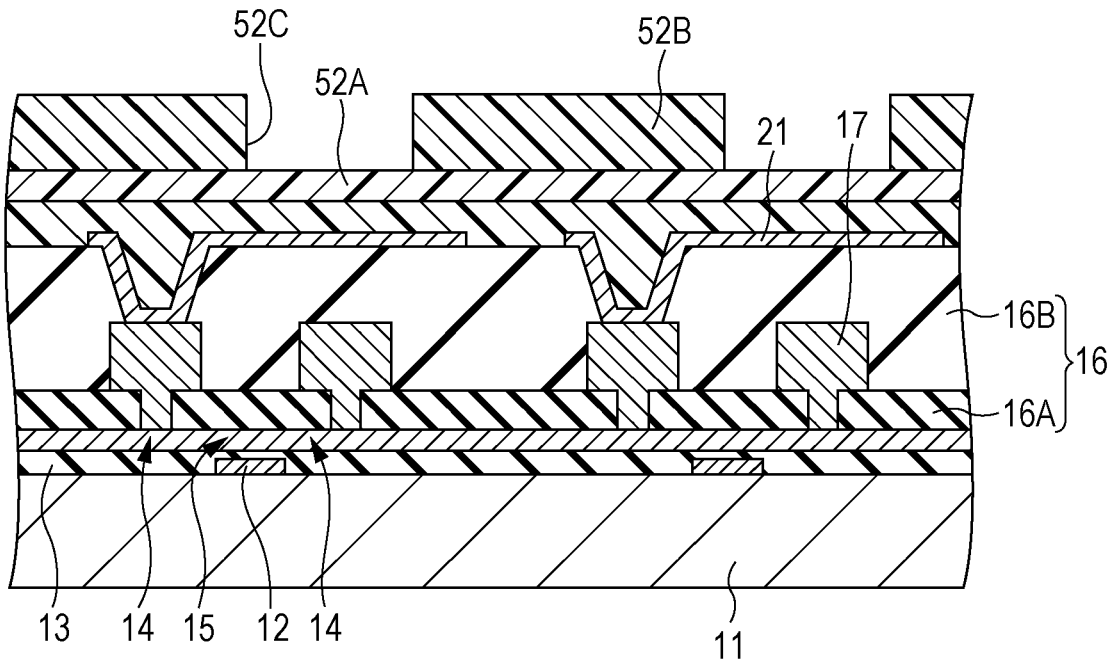
FIG. 16A and FIG. 16B are schematic partial end surface diagrams of the first substrate and the like for illustrating the outline of the method for manufacturing the display apparatus of Embodiment 1 continuing from FIG. 15C.
Figure 16B:
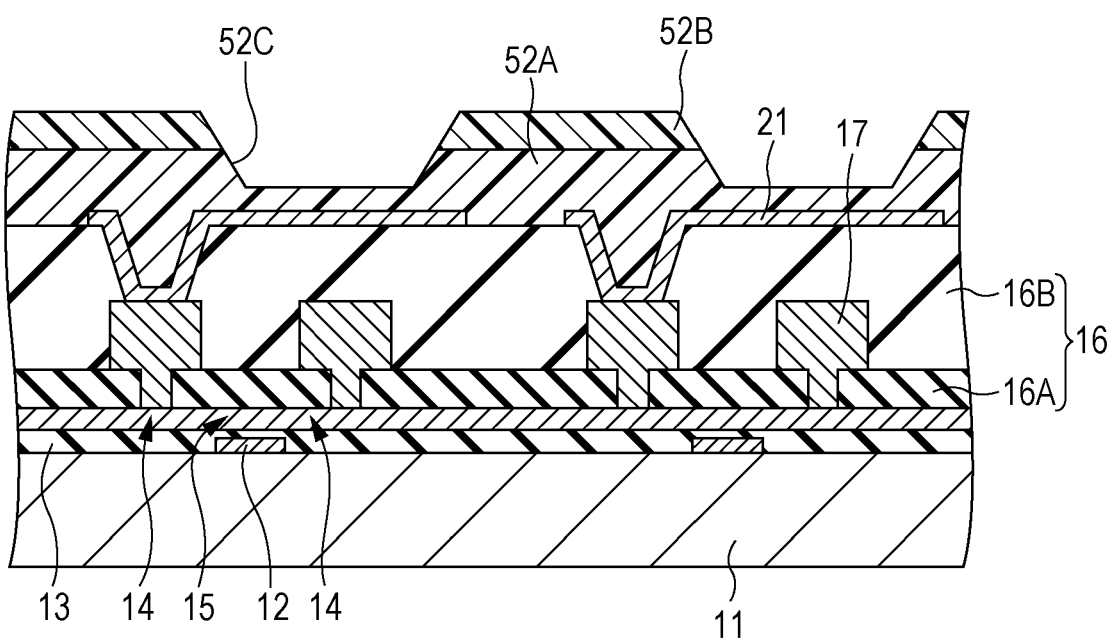
Figure 17:
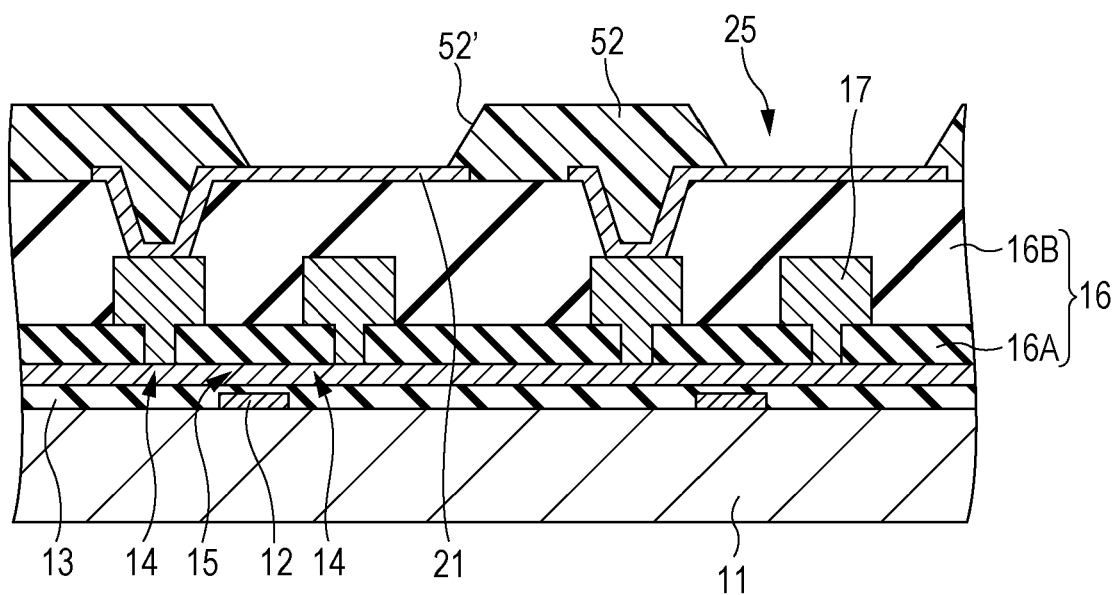
FIG. 17 is a schematic partial end surface diagram of the first substrate and the like for illustrating the outline of the method for manufacturing the display apparatus of Embodiment 1 continuing from FIG. 16B.

After that, the first electrode 21 formed of an Al—Nd alloy is formed on the upper layer interlayer insulation layer 16B based on a combination of the vacuum vapor deposition method and the etching method (refer to FIG. 15C). Here, the first electrode 21 is electrically connected with the wiring 17 via the contact plug 18 which is provided inside the opening 18'.

[Step-130]

Next, the second member 52 is formed. In detail, a second member forming layer 52A is formed on the entire surface and a resist material layer 52B is formed on the second member forming layer 52A. Next, an opening section 52C is formed in the resist material layer 52B by exposing and developing the resist material layer 52B (refer to FIG. 16A). After that, a tapered shape is applied to the second member forming layer 52A by etching the resist material layer 52B and the second member forming layer 52A based on the RIE method (refer to FIG. 16B) and it is possible to finally obtain the second member 52 where the inclined surface (which is a side wall and which corresponds to the opposing surface 52') of the opening section 25 is tilted (refer to FIG. 17). The opening section 25 has a truncated cone shape. Here, it is possible to apply a tapered shape to the second member forming layer 52A by controlling the etching conditions. However, the method for forming the second member 52 is not limited to such a forming method and, for example, the second member 52 shown in FIG. 17 may be formed based on a photolithography technique and a wet etching technique after film-forming the second member forming layer formed of an acryl-based resin or a polyimide-based resin over the entire surface.

[Step-140]

Next, the organic layer 23 is formed on the second member 52 (that is, over the entire surface) which includes above the portion of the first electrode 21 which is exposed on the bottom section of the opening section 25. Here, for example, a hole injection layer and the hole transporting layer 23B formed of an organic material, the light emitting layer 23A, and the electron transporting layer 23C are laminated in sequence in the organic layer 23. It is possible to obtain the organic layer 23 by carrying out vacuum vapor deposition of the organic material based on resistance heating.

[Step-150]

After that, the second electrode 22 is formed over the entire surface of the display region. The second electrode 22 covers the entire surface of the organic layer 23 which configures N×M organic EL elements. The second electrode 22 is insulated from the first electrode 21 by the second member 52 and the organic layer 23. The second electrode 22 is formed based on the vacuum vapor deposition method which is a film-forming method where the energy of the film-forming particles is small to an extent which does not have an influence with respect to the organic layer 23. In addition, it is possible to prevent deterioration in the organic layer 23 due to moisture or oxygen in the atmosphere by continuously forming the second electrode 22 inside the same vacuum vapor deposition apparatus as for the forming of the organic layer 23 without exposing the organic layer 23 to the atmosphere. In detail, it is possible to obtain the second electrode 22 by film-forming a co-evaporation film of Mg—Ag (volume ratio 10:1) with a thickness of 10 nm.

[Step-160]

Next, it is possible to obtain the light reflecting layer 50 formed of the first member 51 and the second member 52 by forming the first member 51 over the entire surface (in detail, on the second electrode 22). Thus, it is possible to obtain an anode reflector structure. By directly forming the first member 51 on the second electrode 22, there is no extraction loss of light which is output from the light emitting element which is caused by the adhesion layer being present between the second electrode 22 and the reflector.

[Step-170]

After that, the protective film 31 with an insulation property and formed of silicon nitride ($Si_{1-y}N_y$) is formed on the light reflecting layer 50 based on the vacuum vapor deposition method. Here, the structure may be a structure where the first member 51 and the protective film 31 are integrated by forming the first member 51 and the protective film 31 at the same time. In such a structure, there are cases where a concave section is formed on the top surface of the protective film 31 due to the influence of the opening section 25; however, by regulating the value of $|n_3-n_4|$ as described above, it is possible to effectively prevent light which is output from the light emitting element 10 from scattering in the concave section.

[Step-180]

Next, the second substrate 34 where the color filter 33 is formed and the first substrate 11 where the protective film 31 is formed are adhered using the sealing material layer 32. Lastly, it is possible to complete the organic EL display apparatus by performing connection with an external circuit.

Alternatively, it is also possible to form a light reflecting layer based on the method for manufacturing the display apparatus below. Below, description will be given of the method for creating the light reflecting layer 50 with reference to FIG. 18A, FIG. 18B, FIG. 18C, and FIG. 18D.

[Step-100A]

Firstly, a stamper which has a complementary shape to the first member 51 is prepared. In detail, a stamper (female type) 60 which has a complementary shape to the first member 51 is formed using a technique used in the art such as electroforming, etching, or another cutting process.

[Step-110A]

On the other hand, a resin material is coated on a supporting substrate. In detail, for example, an ultraviolet curable type resin material 62 is coated (formed) on a support substrate 61 formed of a glass substrate which has a light transmitting property (refer to FIG. 18A).

[Step-120A]

Then, after shaping a resin material 62 using the stamper 60, the stamper 60 is removed and a resin material layer 63 which has a convex section 64 is obtained. In detail, in a state where the stamper 60 is pushed into the resin material 62, the resin material 62 is cured by irradiating energy rays (in detail, ultraviolet rays) from the side of the support substrate 61 and the stamper 60 is removed after obtaining the resin material layer 63 (refer to FIG. 18B). Thus, it is possible to obtain the resin material layer 63 which has the convex section 64 (refer to FIG. 18C). The convex section 64 of the resin material layer 63 is equivalent to the first member 51.

[Step-130A]

Figure 18A:
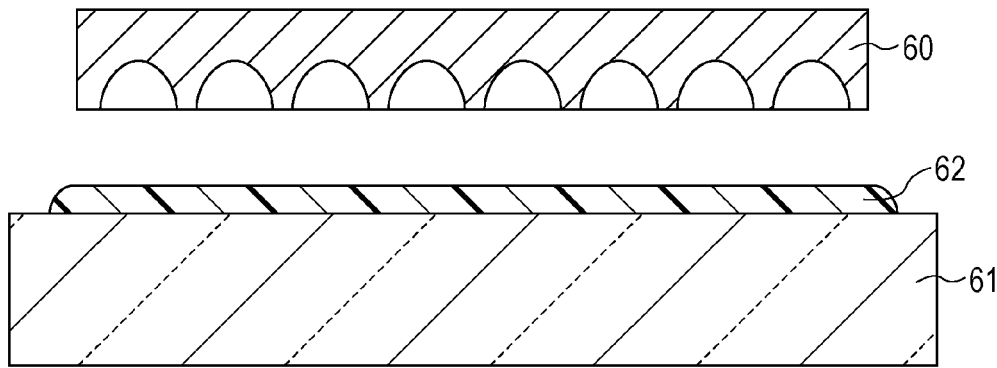
FIG. 18A, FIG. 18B, FIG. 18C, and FIG. 18D are schematic partial end surface diagrams of a glass substrate and the like for illustrating the outline of another method for manufacturing the display apparatus of Embodiment 1.
Figure 18B:
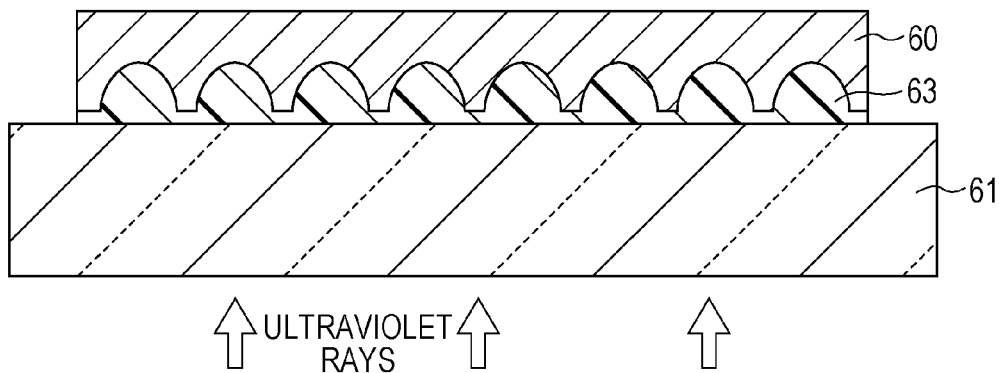
Figure 18C:
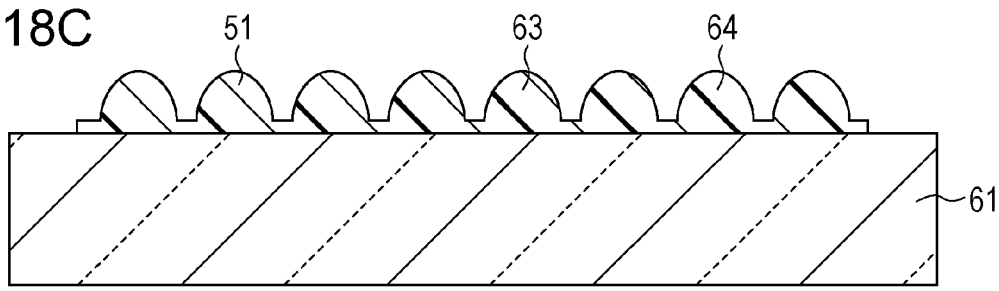
Figure 18D:
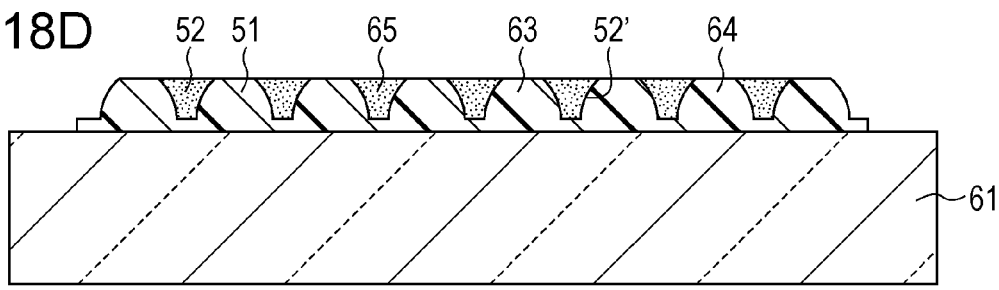

After that, the top section of the convex section 64 of the resin material layer 63 is flattened and then an adhesive agent layer 65 is filled between the two convex sections 64 of the resin material layer 63 (refer to FIG. 18D).

[Step-140A]

Next, the resin material layer 63 is peeled from the support substrate (glass substrate) 61 and the resin material layer 63 is mounted on the first substrate 11 where the light emitting element or the like is formed, that is, the adhesive agent layer 65 is arranged on the second electrode 22 such that the adhesive agent layer 65 does not block the output of light from the light emitting element 10 and the resin material layer 63 is adhered by the adhesive agent layer 65. Here, it is possible to obtain the first substrate 11 by executing the forming of the organic layer 23 and the forming of the second electrode 22 in the same manner as [Step-140] to [Step-150] on the first electrode 21 and the upper layer interlayer insulation layer 16B continuing from [Step-100] to [Step-120]. Thus, it is possible to obtain the light reflecting layer 50 which is configured by the second member 52 formed of the adhesive agent layer 65 and the first member 51 formed of the resin material layer 63. That is, it is possible to obtain an anode reflector structure.

[Step-150A]

After that, the protective film 31 with an insulation property is formed on the light reflecting layer 50 based on the plasma CVD method. Then, the second substrate 34 where the color filter 33 is formed and the first substrate 11 where the protective film 31 is formed are adhered using the sealing material layer 32. Lastly, it is possible to complete the organic EL display apparatus by performing connection with an external circuit. Here, it is also possible to use a thermosetting type resin material or a thermoplastic resin instead of the ultraviolet curable type resin material 62.

In the display apparatus of Embodiment 1, a part of the light propagated by the first members is completely reflected on the opposing surface of the second member which opposes the first members. For this reason, it is possible to improve the light extracting efficiency from the light emitting elements to the outside even without providing a light reflecting member or the like between the first member and the second member. Then, since a relationship between the difference between the values of the refractive index $n_1$ and the refractive index $n_2$ and the tilting angle $\theta$ of the opposing surfaces of the second members is regulated or since the tilting angle $\theta$ of the opposing surfaces of the second members is determined based on the values of the refractive index $n_1$ and $n_2$ and the allowable variation range of the tilting angle $\theta$ of the opposing surfaces of the second members, variations are not easily generated in the luminance (the front surface luminance) in a normal direction of the display apparatus.

Embodiment 2

Figure 4:
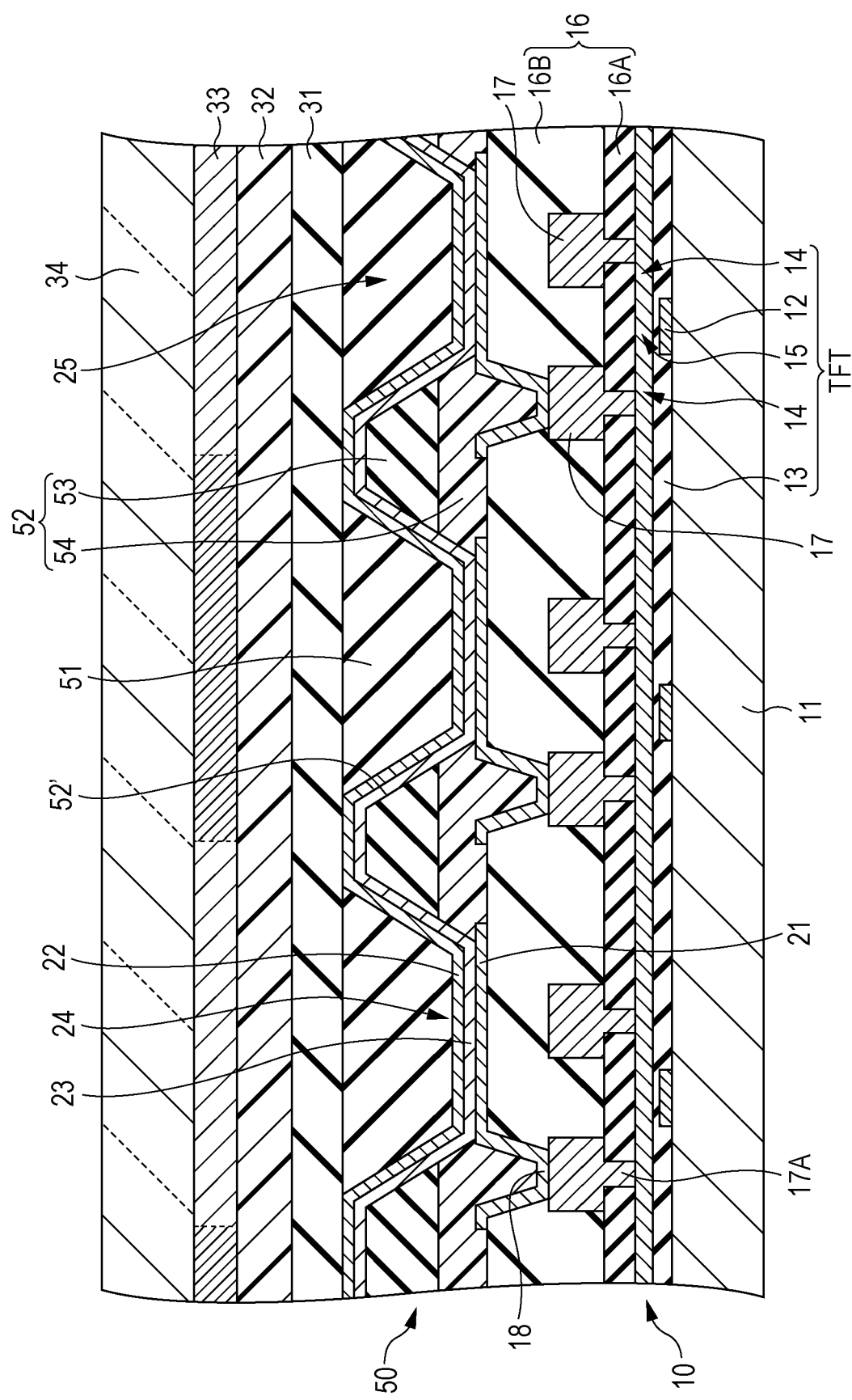
FIG. 4 is a schematic partial cross-sectional diagram of a display apparatus of Embodiment 2.

Embodiment 2 is a modification of Embodiment 1. As shown in the schematic partial cross-sectional diagram in FIG. 4, a light absorbing layer 54 is provided in the second member 52 in the display apparatus of Embodiment 2. In detail, the second member 52 has a structure where the light absorbing layer 54 and the second member configuration layer 53 are laminated. In more detail, the light absorbing layer 54 is provided in the lower section of the second member 52. That is, the display apparatus has a structure where the second member 52 and the second member configuration layer 53 are laminated from the first substrate side. Here, the second member configuration layer 53 which configures the second member 52 is formed of $SiO_2$ while the light absorbing layer 54 is formed of an acryl-based resin which includes carbon black. The average refractive index $n_{2\text{-}ave}$ of the material which configures the second member 52 which includes the light absorbing layer 54, the refractive index $n_2$ of the material which configures the second member configuration layer 53, and the refractive index $n_2'$ of the material which configures the light absorbing layer are shown in Table 4 below.

TABLE 4

|  | Real Part | Imaginary Part |
| --- | --- | --- |
| $n_{2\text{-}ave}$ | 1.48 | 0 |
| $n_2$ | 1.46 | 0 |
| $n_2'$ | 1.54 | 0 |

In the organic EL display apparatus of Embodiment 2, the first substrate is provided with first members (which fill a light emitting region) which propagate and output light from each light emitting element to the outside and second members (which fill a no light emitting region) filled between two first members, and since a light absorbing layer is provided in the second member, outside light which is incident on the second member is absorbed by the light absorbing layer and is not easily output to the outside from the organic EL display apparatus. For this reason, it is possible to improve the contrast of the organic EL display apparatus.

Figure 5:
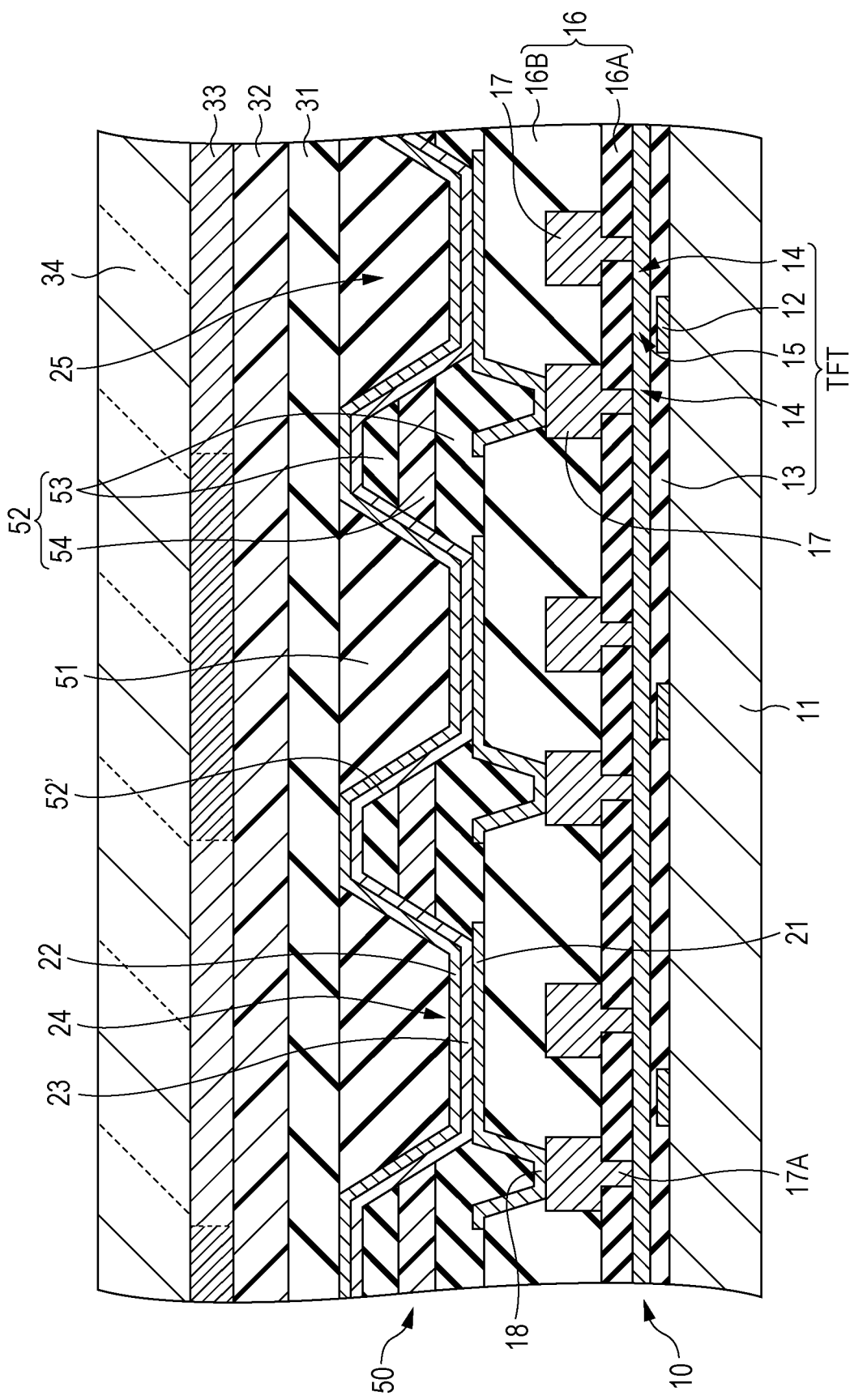
FIG. 5 is a schematic partial cross-sectional diagram of a modified example of the display apparatus of Embodiment 2.
Figure 6:
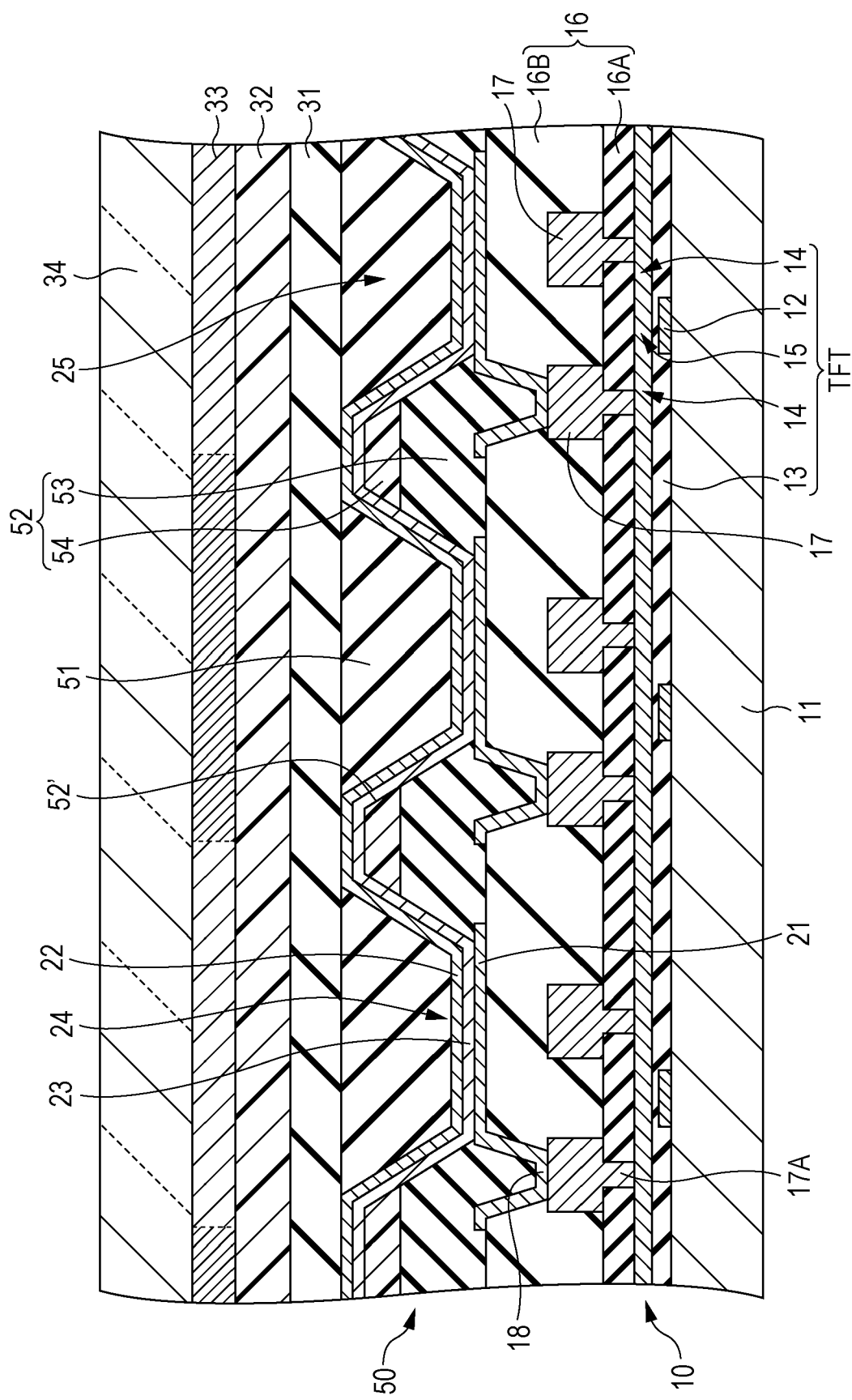
FIG. 6 is a schematic partial cross-sectional diagram of another modified example of the display apparatus of Embodiment 2.
Figure 7:
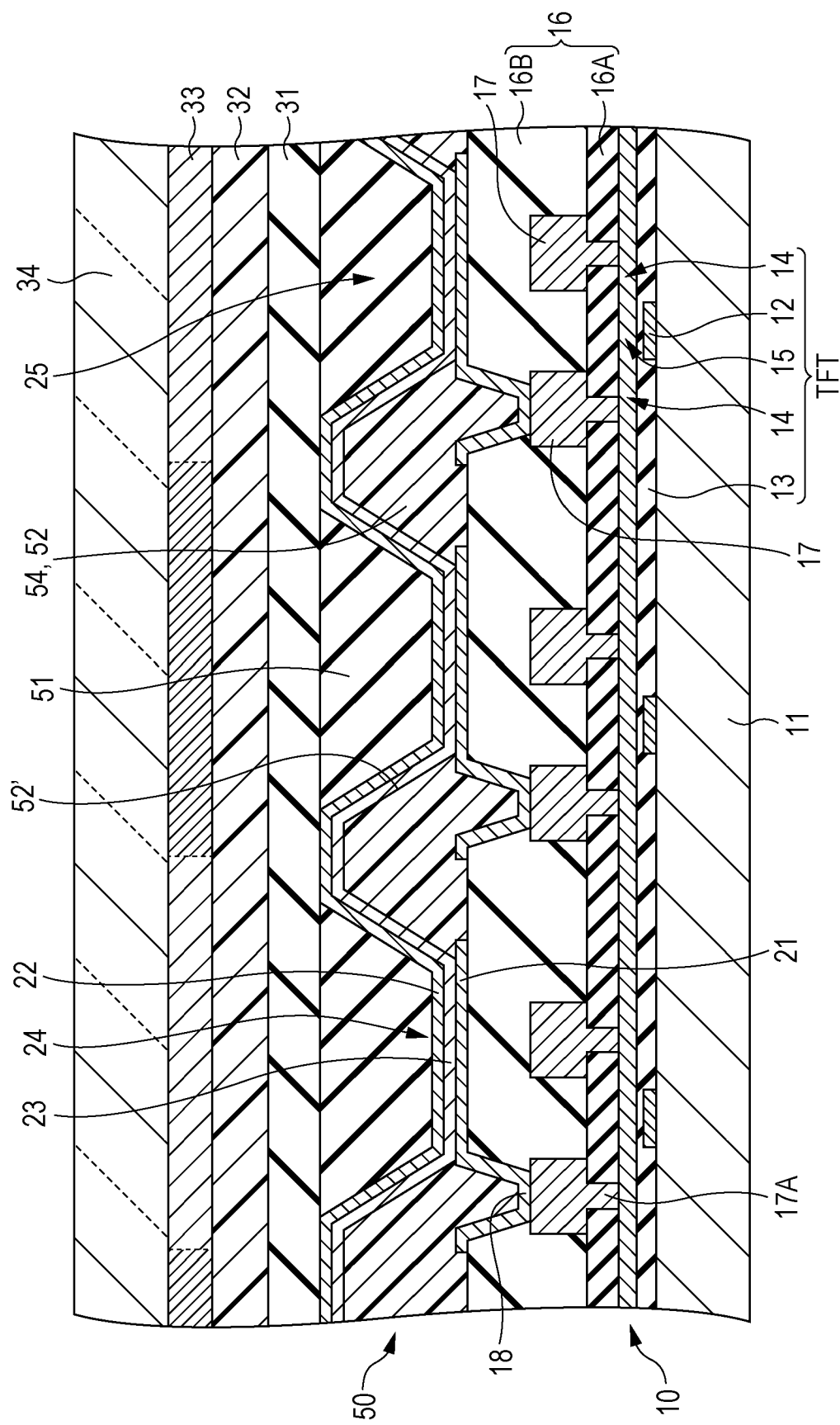
FIG. 7 is a schematic partial cross-sectional diagram of yet another modified example of the display apparatus of Embodiment 2.

Here, as shown in the schematic partial cross-sectional diagram in FIG. 5, the light absorbing layer 54 may be provided in the middle section of the second member 52 in the organic EL display apparatus of Embodiment 2. That is, the organic EL display apparatus has a structure where the second member configuration layer 53, the light absorbing layer 54, and the second member configuration layer 53 are laminated from the first substrate side. Alternatively, as shown in the schematic partial cross-sectional diagram in FIG. 6, the light absorbing layer 54 may be provided on the top section of the second member 52. That is, the organic EL display apparatus has a structure where the second member configuration layer 53 and the second member 52 are laminated from the first substrate side. Alternatively, as shown in the schematic partial cross-sectional diagram in FIG. 7, the second member 52 may be configured by the light absorbing layer 54. That is, the light absorbing layer 54 accounts for the entire second member 52.

Since the organic EL display apparatus of Embodiment 2 has the same configuration and structure as the organic EL display apparatus of Embodiment 1 apart from the points above, detailed description thereof will be omitted.

Embodiment 3

Figure 8:
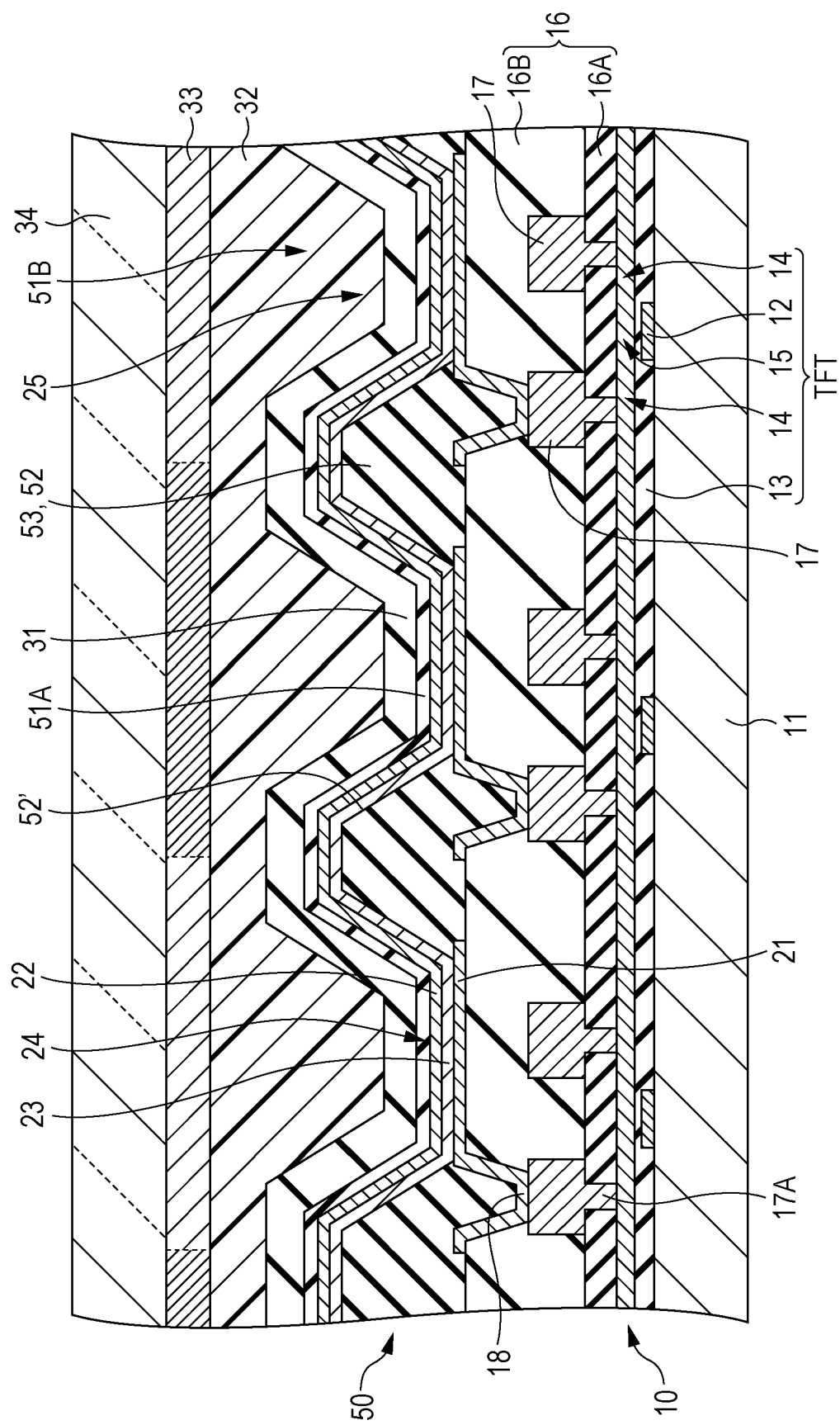
FIG. 8 is a schematic partial cross-sectional diagram of a display apparatus of Embodiment 3.

Embodiment 3 is a modification of Embodiment 1 and Embodiment 2. In Embodiment 1 and Embodiment 2, the top surface of the first member 51 and the top surface of the second member 52 are positioned on substantially the same plane. That is, the first member 51 is filled between the two second members 52. On the other hand, in Embodiment 3, as shown in the schematic partial cross-sectional diagram in FIG. 8, a first member 51A is formed in the form of a layer between the first member 51 and the second member 52. In detail, the first member 51A is formed on the second electrode 22 in the form of a layer with an average thickness of 3 μm (refractive index $n_1$: 1.81). Here, a region above the first electrode 21 which is surrounded by the second member 52 and the first member 51A in the form of a layer which is formed thereon is referred to as a "region 51B". Then, the protective film 31 with an insulation property and formed of silicon nitride ($Si_{1-y}N_y$) is formed over the entire surface, that is, the region 51B and in the region above the top surface of the second member 52. Furthermore, the sealing material layer 32 and the color filter 33 are formed on the protective film 31. Here, a part of the sealing material layer 32 extends inside the region 51B.

Since the organic EL display apparatus of Embodiment 3 has the same configuration and structure as the organic EL display apparatus of Embodiment 1 and Embodiment 2 apart from the points above, detailed description thereof will be omitted.

Embodiment 4

Figure 9:
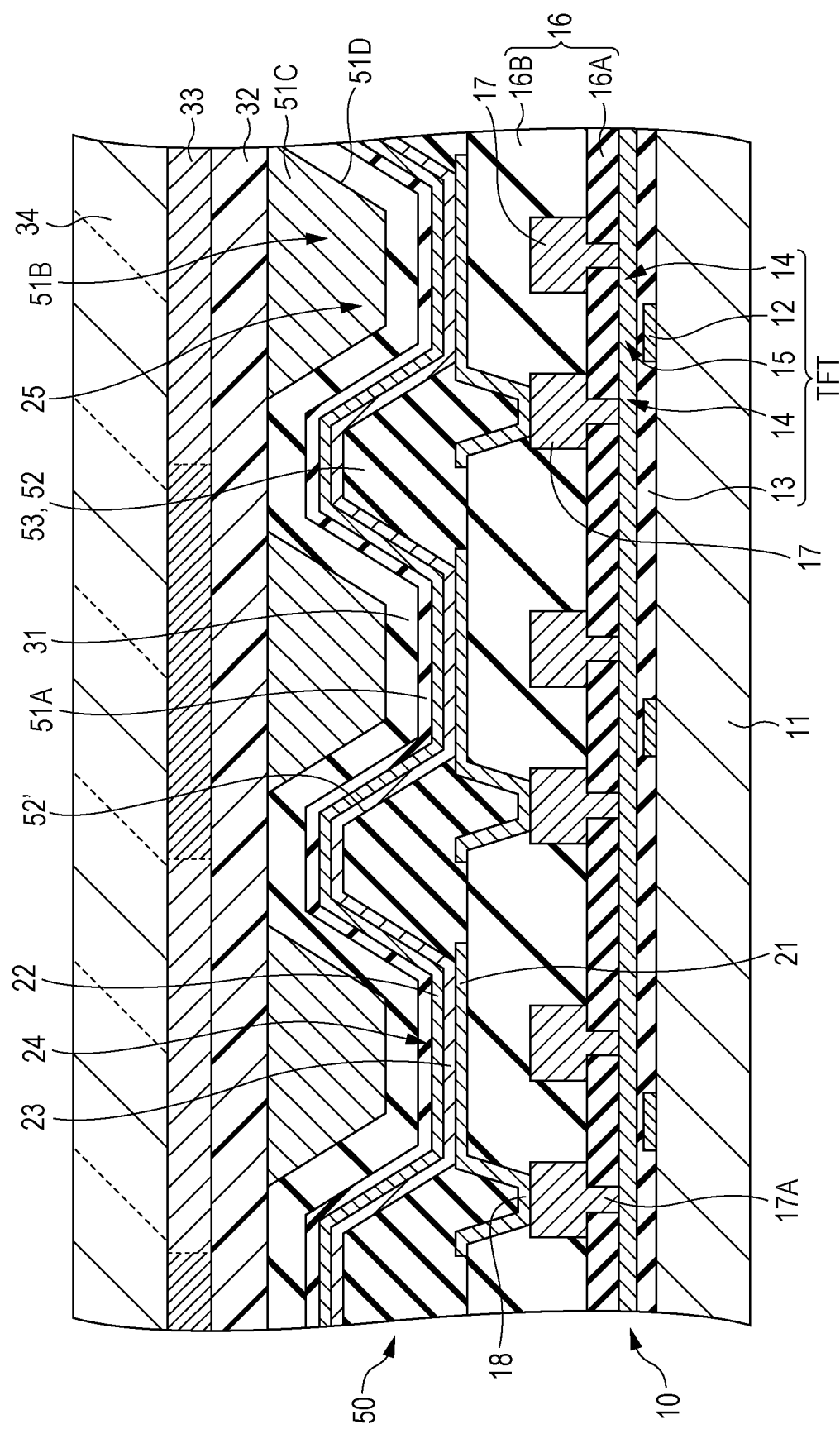
FIG. 9 is a schematic partial cross-sectional diagram of a display apparatus of Embodiment 4.

Embodiment 4 is also a modification of Embodiment 1 and Embodiment 2. As shown in the schematic partial cross-sectional diagram of the organic EL display apparatus of Embodiment 4 in FIG. 9, a high refractive index region 51C which has a refractive index $n_5$ which is higher than the refractive index $n_3$ of the protective film 31 is provided inside the region 51B instead of extending a part of the sealing material layer 32. Due to this, most of the light which enters the high refractive index region 51C from the protective film 31 and hits an inclined surface 51D which is an interface between the protective film 31 and the high refractive index region 51C is sent back to the high refractive index region 51C and as a result, it is possible to further improve the light extracting efficiency from the light emitting element to the outside. Here, for example, it is preferable to satisfy $n_5-n_3 \geq 0.3$. Since the organic EL display apparatus of Embodiment 4 has the same configuration and structure as the organic EL display apparatus of Embodiment 1 and Embodiment 2 apart from the points above, detailed description thereof will be omitted.

Embodiment 5

Embodiment 5 is also a modification of Embodiment 1 and Embodiment 2. FIG. 10A, FIG. 10B, FIG. 11A, FIG. 11B, FIG. 12A, FIG. 12B, FIG. 13A, and FIG. 13B show schematic partial cross-sectional diagrams of the organic EL display apparatus of Embodiment 5 or modified examples thereof; however, in these diagrams, the first electrode 21, the second member, and the like are shown in the diagrams and illustrations of the light emitting section 24 which is configured by the organic layer 23, the second electrode 22, the first member 51, the protective film 31, the sealing material layer 32, the color filter 33, and the second substrate 34 are omitted.

In the display apparatus of Embodiment 5, the second member is configured of a lower layer 152A formed of an organic material such as a polyimide-based resin, an acryl-based resin, a fluorine-based resin, a silicon-based resin, a fluorine-based polymer, a silicone-based polymer, a novolac-based resin, an epoxy-based resin, a norbornene-based resin, or these resin materials in which a pigment is dispersed, and an upper layer 152B formed of an inorganic material such as $SiO_2$, silicon nitride, silicon oxynitride, or aluminum oxide, which covers at least a part of the lower layer 152A. Then, the opening section 25 is provided in the second member, the inclined surface of the opening section 25 corresponds to the opposing surface 52', and a light emitting section (which is not shown in the diagram) is provided on the bottom surface of the opening section 25. In more detail, light emitting elements formed by laminating the first electrode, the light emitting section which is configured by an organic layer which is provided with a light emitting layer, and the second electrode are provided on the bottom surface of the opening section 25. The organic layer and the second electrode may extend to the inclined surface (the opposing surface 52') of the opening section 25.

Figure 10A:
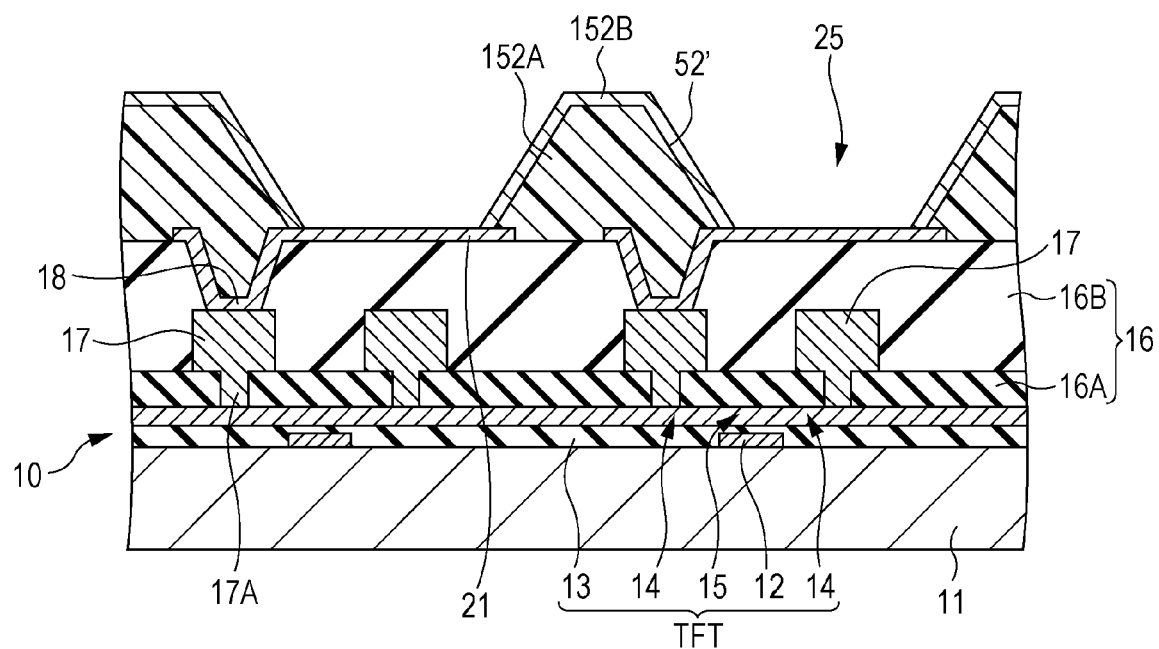
FIG. 10A and FIG. 10B are schematic partial cross-sectional diagrams of a display apparatus of Embodiment 5.
Figure 10B:
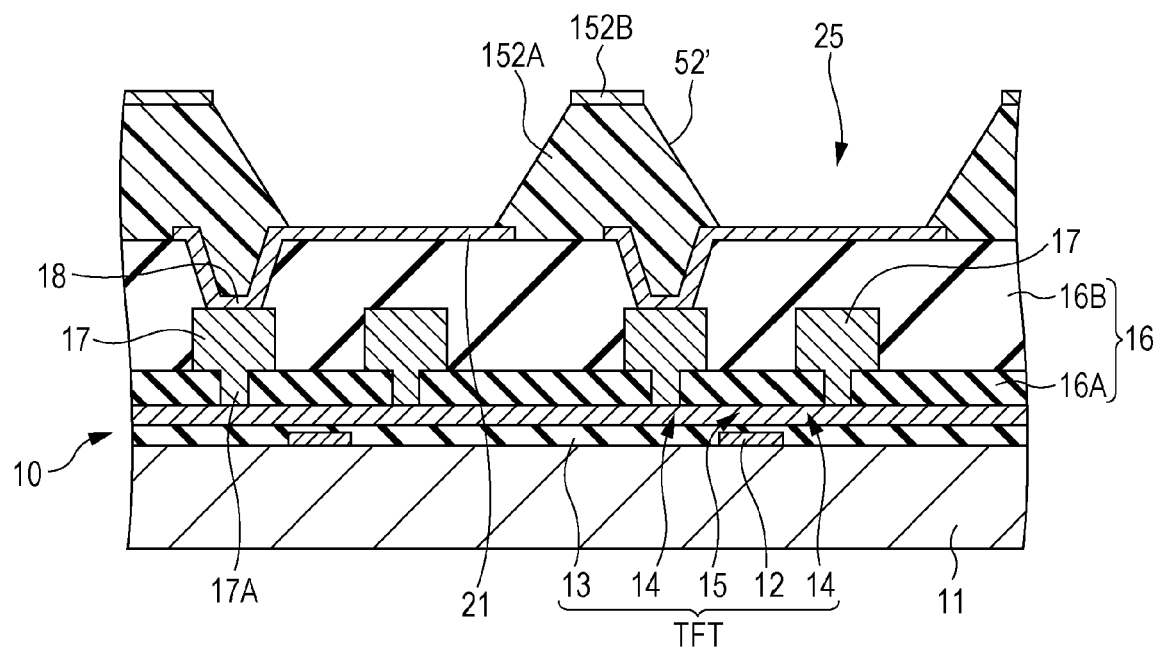
Figure 11A:
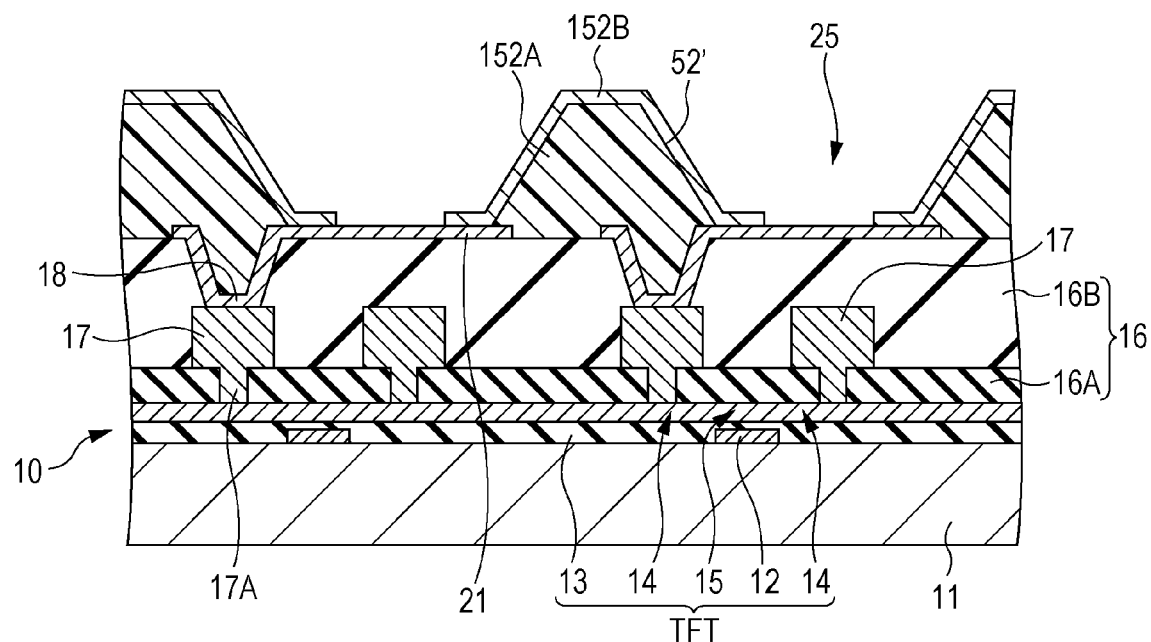
FIG. 11A and FIG. 11B are schematic partial cross-sectional diagrams of a modified example of the display apparatus of Embodiment 5.
Figure 11B:
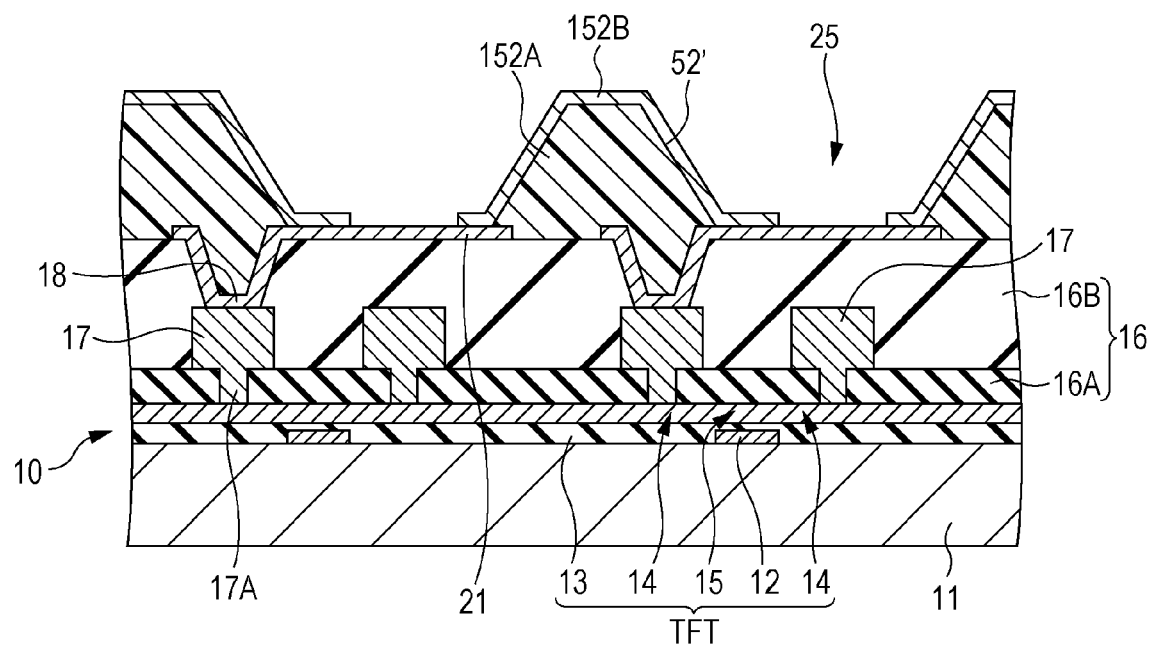
Figure 12A:
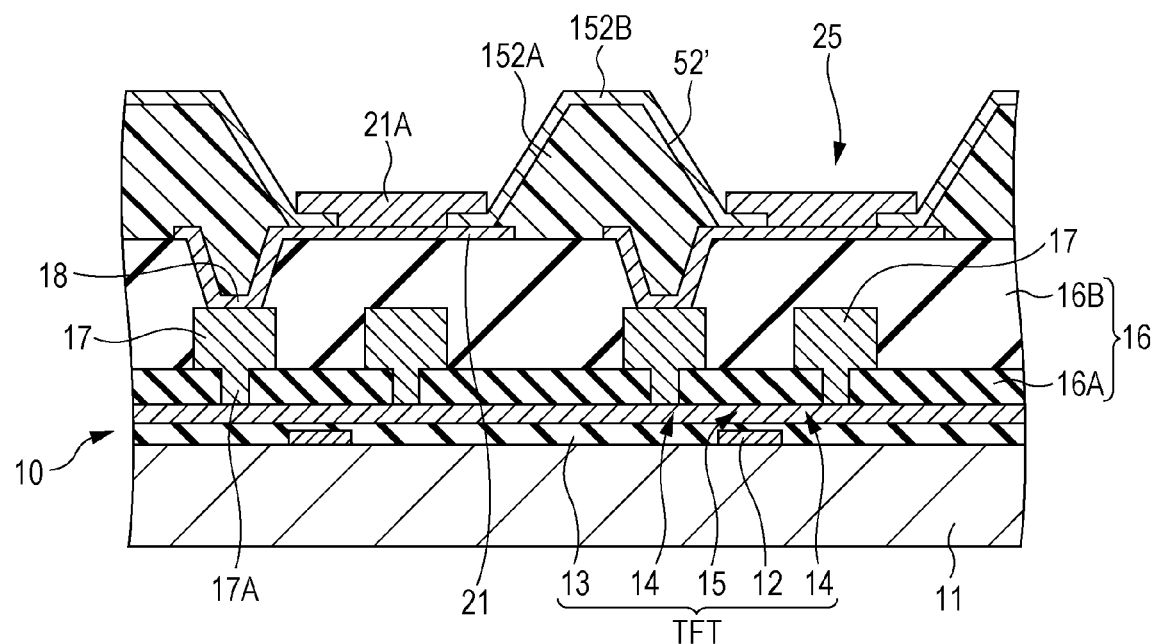
FIG. 12A and FIG. 12B are schematic partial cross-sectional diagrams of another modified example of the display apparatus of Embodiment 5.
Figure 12B:
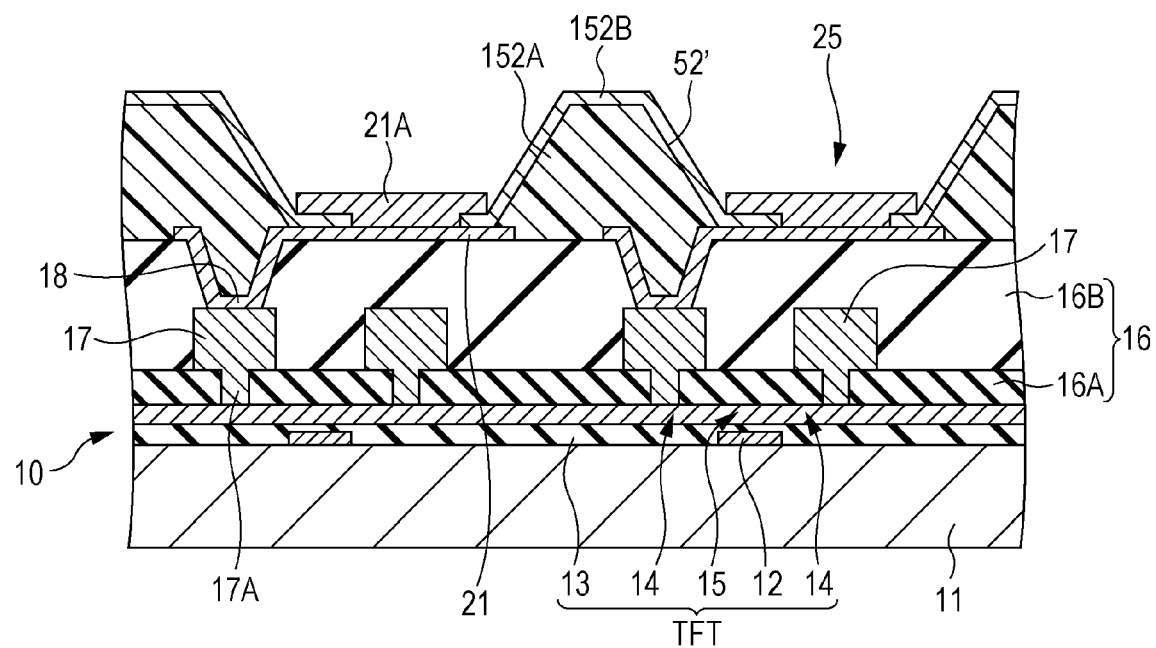
Figure 13A:
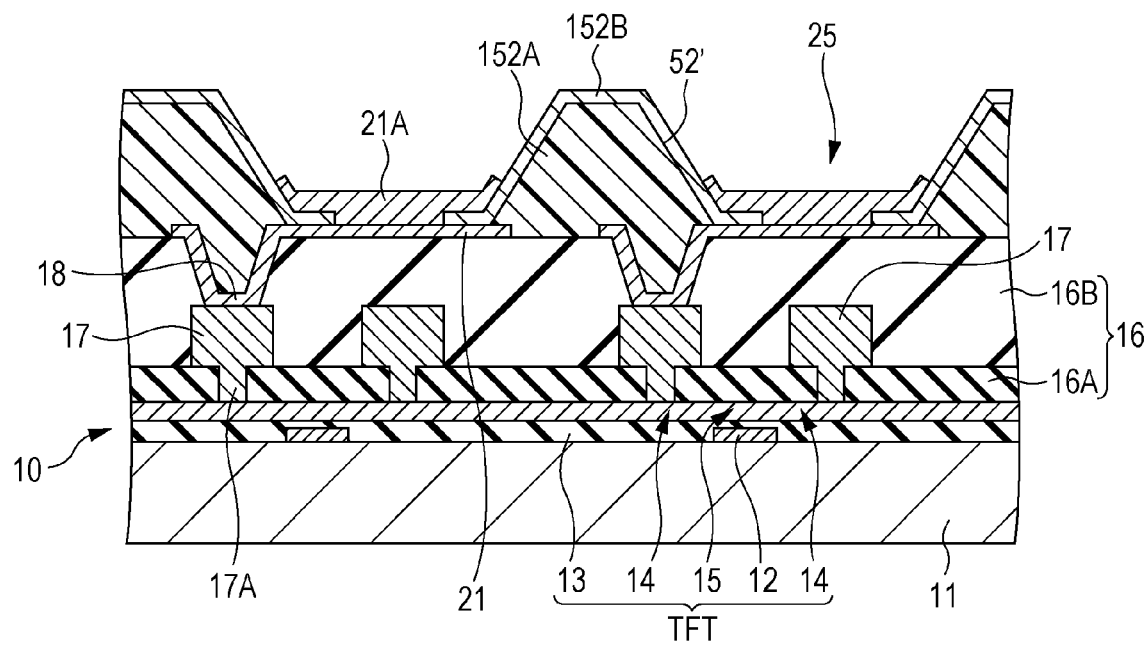
FIG. 13A and FIG. 13B are schematic partial cross-sectional diagrams of yet another modified example of the display apparatus of Embodiment 5.
Figure 13B:
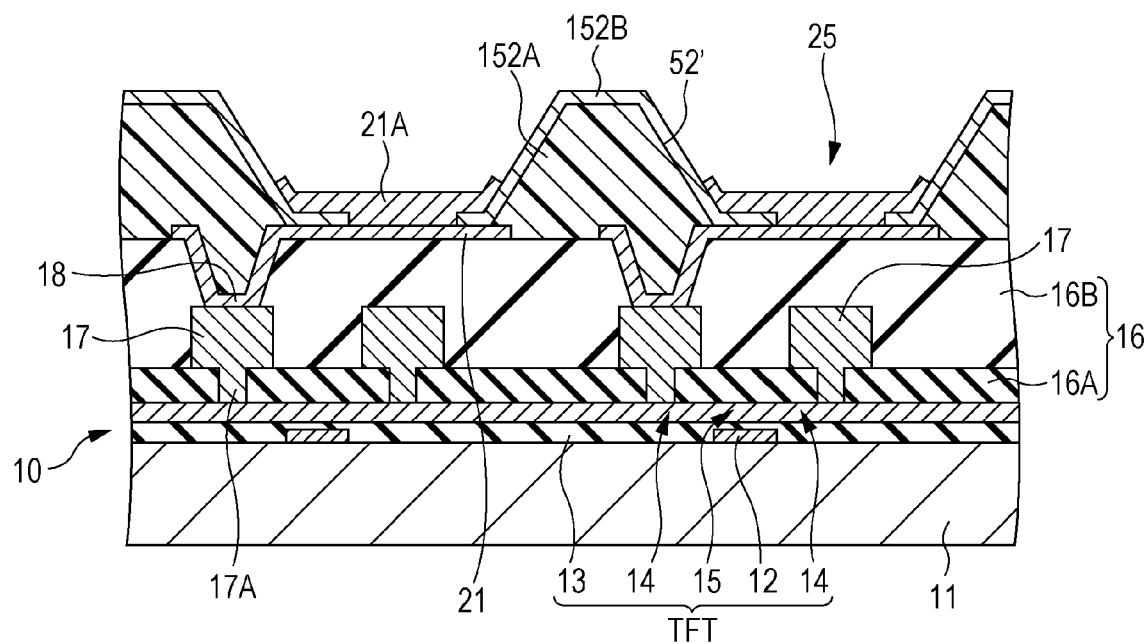

The upper layer 152B may cover the entire surface of the lower layer 152A as shown in FIG. 10A and the upper layer 152B may cover the top surface of the lower layer 152A as shown in FIG. 10B. Then, as shown in FIG. 10A and FIG. 10B, the opening section 25 is provided in the second member, the inclined surface of the opening section 25 corresponds to the opposing surface 52', and a light emitting section (which is not shown in the diagram) is provided on the bottom surface of the opening section 25. Alternatively, as shown in FIG. 11A, FIG. 11B, FIG. 12A, FIG. 12B, FIG. 13A and FIG. 13B, the opening section 25 is provided in the second member, the inclined surface of the opening section 25 corresponds to the opposing surface 52', and the upper layer 152B which configures the second member extends to a part of the bottom surface of the opening section 25. Then, it is possible to have any of the forms out of [1] a form where a light emitting section (which is not shown in the diagram) is provided on the first electrode 21 which is exposed on the bottom section of the opening section 25 of which a part is covered by the extended section of the upper layer 152B (refer to FIG. 11A and FIG. 11B), [2] a form where a first auxiliary electrode 21A is formed on the first electrode 21 which is exposed on the bottom section of the opening section 25 of which a part is covered by the extended section of the upper layer 152B and where a light emitting section (which is not shown in the diagram) is formed on the first auxiliary electrode 21A (refer to FIG. 12A and FIG. 12B), or [3] a form where the first auxiliary electrode 21A is formed over the opposing surface 52' from on the first electrode 21 which is exposed on the bottom section of the opening section 25 of which a part is covered by the extended section of the upper layer 152B and a light emitting section (which is not shown in the diagram) is formed on a part of the first auxiliary electrode 21A (refer to FIG. 13A and FIG. 13B). The first auxiliary electrode 21A is configured, for example, by an aluminum alloy which includes an Al—Nd alloy; ITO, IZO, IGZO, or the like, silver, a gold alloy, or an aluminum alloy, or by laminating ITO with the above. Here, the exposed first electrode is placed in the central section of the bottom surface of the opening section 25 in FIG. 11A, FIG. 12A, and FIG. 13A and the exposed first electrode is placed in a region which is shifted from the central section of the bottom surface of the opening section 25 in FIG. 11B, FIG. 12B, and FIG. 13B. In addition, a configuration where the upper layer 152B shown in FIG. 10B covers the top surface of the lower layer 152A and a configuration where the first auxiliary electrode 21A is formed may be combined.

In Embodiment 5, after forming the lower layer 152A which has the opening section 25 where the inclined surface is tilted by forming a lower layer forming layer which configures the lower layer 152A of the second member on the first electrode 21 and the interlayer insulation layer 16 and selectively removing the lower layer forming layer on the first electrode 21, it is possible to obtain the second member where the inclined surface (the opposing surface 52') of the opening section 25 is tilted by forming the upper layer forming layer which configures the upper layer 152B of the second member on the lower layer 152A and selectively removing the upper layer forming layer.

In the example shown in FIG. 10A, FIG. 11A, FIG. 11B, FIG. 12A, FIG. 12B, FIG. 13A, and FIG. 13B, the value of a "refractive index $n_2$ of the material which configures the second member" is 1.46, for example, in a case where the material is configured by $SiO_2$. On the other hand, in the example shown in FIG. 10B, the value of a "refractive index $n_2$ of the material which configures the second member" is 1.55, for example, in a case where the material is configured by an acryl-based resin. Here, it is also possible to configure the display apparatus in Embodiment 5 with the display apparatuses of Embodiment 1 to Embodiment 2, excluding the regulation of θ, $n_1$, and $n_2$.

Embodiment 6

Figure 14:
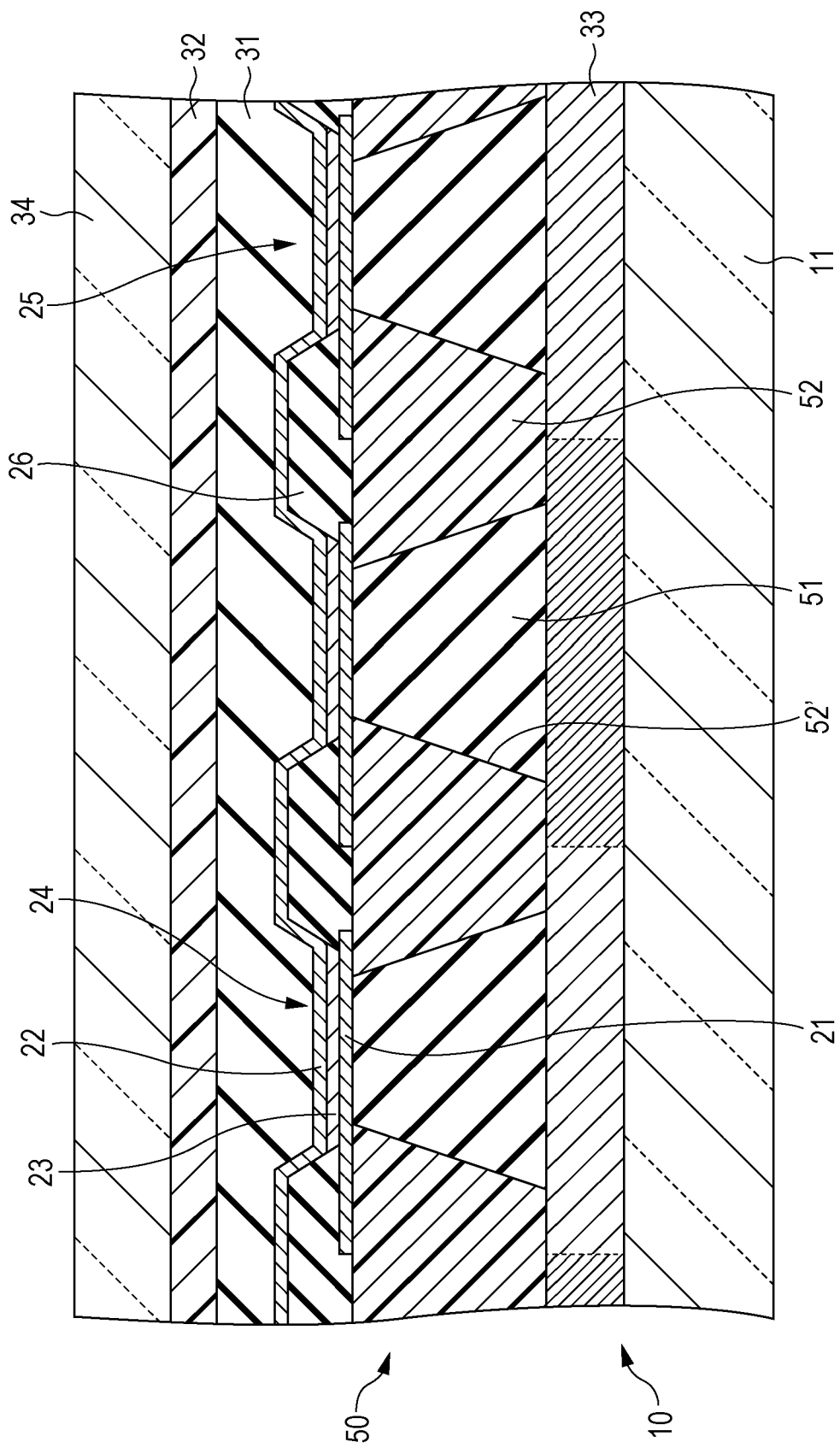
FIG. 14 is a schematic partial cross-sectional diagram of a display apparatus of Embodiment 6.

Embodiment 6 is also a modification of Embodiment 1 and Embodiment 2; however, in Embodiment 6, light from each light emitting element 10 is output to the outside via the first substrate 11. That is, the display apparatus of Embodiment 6 is a lower surface light emitting type display apparatus. FIG. 14 shows a schematic partial cross-sectional diagram of the display apparatus of Embodiment 6 (an active matrix type color display organic EL display apparatus). Here, the arrangement state of the sub-pixels is the same as shown in FIG. 3A and FIG. 3B. Then, the first member 51 has a truncated cone shape (or a cutting head rotating body). That is, the inclined surface of the truncated cone shape is linear and additionally, the cross-sectional shape of the opposing surface 52' is a trapezoid when the second member 52 is cut in a virtual plane which includes an axis line (Z axis) of the truncated cone shape.

In Embodiment 6, the second electrode 22 is used as an anode electrode and the first electrode 21 is used as a cathode electrode. The second electrode 22 is formed of a light reflecting material, in detail, an Al—Nd alloy while the first electrode 21 is formed of a half-light transmitting material, in detail, a conductive material which includes magnesium (Mg), and in more detail, a Mg—Ag alloy with a thickness of 10 nm. In particular, the second electrode 22 is film-formed by a film-forming method where the energy of the film-forming particles is small such as the vacuum vapor deposition method. In addition, the first electrode 21 is formed based on a combination of the vacuum vapor deposition method and the etching method. The refractive index measurement result of the first electrode 21 and the second electrode 22, the average light reflectivity measurement result of the first electrode 21, and the average light transmittance measurement result of the second electrode 22 are the same as shown in Embodiment 1. However, in the measurement values in Embodiment 1, the 'first electrode 21' is to be read as the "second electrode 22" and the 'second electrode 22' is to be read as the "first electrode 21".

In Embodiment 6, the first electrode 21 which configures the organic EL element is provided on the light reflecting layer 50 formed of the first member 51 and the second member 52. Then, the light reflecting layer 50 covers an organic EL element driving section (which is not shown in the diagram) which is formed on the first substrate 11. The organic EL element driving section is configured by a plurality of TFTs and the TFTs and the first electrode 21 are electrically connected with each other via a contact plug which is provided in the second member 52 and wiring (which are also not shown in the diagram). In some cases, the organic EL element driving section may be provided above the light emitting section 24.

In Embodiment 6, the protective film 31 and the sealing material layer 32 are further provided on the light emitting section 24 in the same manner as Embodiment 1. In addition, the light emitting section 24 is surrounded by an insulation layer 26.

Also in the display apparatus of Embodiment 6, a part of the light propagated by the first members is completely reflected on an opposing surface of the second member which opposes the first members. For this reason, it is possible to improve the light extracting efficiency from the light emitting elements to the outside even without providing a light reflecting member or the like between the first member and the second member. Then, since a relationship between the difference in the values of the refractive index $n_1$ and the refractive index $n_2$ and the tilting angle θ of the opposing surface of the second member is regulated or since the tilting angle θ of the opposing surfaces of the second members is determined based on the values of the refractive index $n_1$ and $n_2$ and the allowable variation range of the tilting angle θ of the opposing surfaces of the second members, variations are not easily generated in the luminance (the front surface luminance) in the normal direction of the display apparatus.

Above, description was given of the present disclosure based on preferable embodiments; however, the present disclosure is not limited to these embodiments. The configuration and structure of the organic EL display apparatus or the organic EL element, the materials which configure the organic EL display apparatus or the organic EL element, and the like in the embodiments are examples and it is possible to appropriately change these.

Here, the present disclosure is also able to adopt the following configurations.

[A01] Display Apparatus: First Embodiment

A display apparatus including (A) a first substrate where a plurality of light emitting elements, which are formed by laminating a first electrode, a light emitting section which is configured by an organic layer provided with a light emitting layer, and a second electrode, are formed, and (B) a second substrate which is arranged to oppose the first substrate, in which the first substrate is further provided with a light reflecting layer formed of first members which propagate and output light from each light emitting element to an outside and second members placed between the first members, the first members have a truncated cone shape where a cutting head section opposes the light emitting element, a part of light propagated by the first members is completely reflected on opposing surfaces of the second members which oppose the first members, and when a tilting angle of the opposing surfaces of the second members is θ (units: degrees), a refractive index of a material which configures the first members is $n_1$, and a refractive index of a material which configures the second members is $n_2$ (here, $n_2 < n_1$), $75.2 - 54(n_1 - n_2) \leq \theta \leq 81.0 - 20(n_1 - n_2)$ is satisfied.

[A02] The display apparatus according to [A01], in which $76.3 - 46(n_1 - n_2) \leq \theta \leq 77.0 - 20(n_1 - n_2)$ is satisfied.

[A03] The display apparatus according to [A01] or [A02], in which an allowable variation range for the tilting angle θ in the light emitting element which configures the display apparatus is a maximum of 4 degrees.

[A04] The display apparatus according to any one of [A01] to [A03], in which an allowable change range of a relative luminance value at a 0 degree viewing angle of light which is output from the light emitting element via the first members is a maximum of 0.5 in the light emitting element which configures the display apparatus.

[A05] The display apparatus according to any one of [A01] to [A04], in which a relative luminance value at a 0 degree viewing angle of light which is output from the light emitting element via the first members is 1.5 or more to 3.0 or less.

[A06] The display apparatus according to any one of [A01] to [A05], in which an allowable variation range of $\{(4S/\pi)^{1/2}/H\}$ in the light emitting element which configures the display apparatus is a maximum of 0.2 when an area of the cutting head section of the truncated cone shape is S and a height of the truncated cone shape is H.

[A07] The display apparatus according to any one of [A01] to [A06], in which $0.1 \leq n_1 - n_2 \leq 0.4$ is satisfied.

[A08] The display apparatus according to any one of [A01] to [A07], in which $0.8 \leq (4S/\pi)^{1/2}/H \leq 1.6$ is satisfied when an area of the cutting head section of the truncated cone shape is S and a height of the truncated cone shape is H.

[A09] The display apparatus according to any one of [A01] to [A08], in which light which is output from the light emitting element and which is output from the first members in parallel with an axis line of the truncated cone shape is completely reflected on the opposing surface when the light hits the opposing surface of the second member which opposes the first members.

[A10] The display apparatus according to any one of [A01] to [A09], in which the light emitting element and the first members are in contact.

[A11] The display apparatus according to any one of [A01] to [A10], in which light from each light emitting element is output to the outside via the second substrate.

[A12] The display apparatus according to [A11], further including a color filter.

[A13] The display apparatus according to any one of [A01] to [A12], in which a light absorbing layer is provided on the second member.

[A14] The display apparatus according to [A13], in which the light absorbing layer is provided on a lower section of the second member.

[A15] The display apparatus according to [A13], in which the light absorbing layer is provided in a middle section of the second member.

[A16] The display apparatus according to [A13], in which the light absorbing layer is provided in a top section of the second member.

[A17] The display apparatus according to [A13], in which the light absorbing layer accounts for the entire second member.

[A18] The display apparatus according to any one of [A01] to [A17], in which the first members are formed of $Si_{1-x}N_x$, ITO, IZO, $TiO_2$, $Nb_2O_5$, bromine-containing polymers, sulfur-containing polymers, titanium-containing polymers, or zirconium-containing polymers.

[A19] The display apparatus according to any one of [A01] to [A18], in which the second members are formed of $SiO_2$, MgF, LiF, polyimide-based resins, acryl-based resins, fluorine-based resins, silicone-based resins, fluorine-based polymers, or silicone-based polymers.

[A20] The display apparatus according to any one of [A01] to [A17], in which the second members are configured of a lower layer formed of an organic material and an upper layer formed of an inorganic material which covers at least a part of the lower layer.

[A21] The display apparatus according to [A20], in which the upper layer covers the entire surface of the lower layer.

[A22] The display apparatus according to [A20], in which the upper layer covers the top surface of the lower layer.

[A23] The display apparatus according to any one of [A20] to [A22], in which an opening section is provided in the second member, an inclined surface of the opening section corresponds to the opposing surface, and the light emitting section is provided on the bottom surface of the opening section.

[A24] The display apparatus according to [A20] or [A21], in which an opening section is provided in the second member, an inclined surface of the opening section corresponds to the opposing surface, the upper layer which configures the second member extends to a part of the bottom surface of the opening section, and the light emitting section is provided on the first electrode which is exposed on the bottom surface of the opening section of which a part is covered by the extending section of the upper layer.

[A25] The display apparatus according to [A20] or [A21], in which an opening section is provided in the second member, an inclined surface of the opening section corresponds to the opposing surface, the upper layer which configures the second member extends to a part of the bottom surface of the opening section, a first auxiliary electrode is formed on the first electrode which is exposed on the bottom surface of the opening section of which a part is covered by the extending section of the upper layer, and the light emitting section is formed on the first auxiliary electrode.

[A26] The display apparatus according to [A20] or [A21], in which an opening section is provided in the second member, an inclined surface of the opening section corresponds to the opposing surface, the upper layer which configures the second member extends to a part of the bottom surface of the opening section, a first auxiliary electrode is formed over the opposing surface from on the first electrode which is exposed on the bottom surface of the opening section of which a part is covered by the extending section of the upper layer and the light emitting section is formed on a part of the first auxiliary electrode.

[A27] The display apparatus according to any one of [A01] to [A26], further including a protective film and a sealing material layer on the first members and the second members, in which when a refractive index of a material which configures the protective film is set as $n_3$ and a refractive index of a material which configures the sealing material layer is set as $n_4$, $|n_3-n_4|\leq 0.3$ is satisfied.

[A28] The display apparatus according to any one of [A01] to [A27], in which the remainder of light propagated by the first members enters the second members on the opposing surface of the second members which opposes the first members.

[A29] The display apparatus according to any one of [A01] to [A28], in which one pixel is configured by one light emitting element.

[A30] The display apparatus according to any one of [A01] to [A28], in which one pixel is configured by gathering a plurality of light emitting elements.

[B01] Display Apparatus: Second Embodiment

A display apparatus including (A) a first substrate where a plurality of light emitting elements, which are formed by laminating a first electrode, a light emitting section which is configured by an organic layer provided with a light emitting layer, and a second electrode, are formed, and (B) a second substrate which is arranged to oppose the first substrate, in which the first substrate is further provided with a light reflecting layer formed of first members which propagate and output light from each light emitting element to an outside and second members placed between the first members, the first members have a truncated cone shape where a cutting head section opposes the light emitting element, a part of light propagated by the first members is completely reflected on opposing surfaces of the second members which oppose the first members, and when a refractive index of a material which configures the first members is $n_1$ and a refractive index of a material which configures the second members is $n_2$ (here, $n_2<n_1$), a tilting angle $\theta$ of the opposing surfaces of the second members is determined based on a value of the refractive index $n_1$, a value of the refractive index $n_2$, and an allowable variation range of the tilting angle $\theta$ of the opposing surfaces of the second members.

[B02] The display apparatus according to [B01], in which an allowable variation range for the tilting angle $\theta$ in the light emitting element which configures the display apparatus is a maximum of 4 degrees.

[B03] The display apparatus according to [B01] or [B02], in which an allowable change range of a relative luminance value at a 0 degree viewing angle of light which is output from the light emitting element via the first members is a maximum of 0.5 in the light emitting element which configures the display apparatus.

[B04] The display apparatus according to any one of [B01] to [B03], in which a relative luminance value at a 0 degree viewing angle of light which is output from the light emitting element via the first members is 1.5 or more to 3.0 or less.

[B05] The display apparatus according to any one of [B01] to [B04], in which an allowable variation range of $\{(4S/\pi)^{1/2}/H\}$ in the light emitting element which configures the display apparatus is a maximum of 0.2 when an area of the cutting head section of the truncated cone shape is S and a height of the truncated cone shape is H.

[B06] The display apparatus according to any one of [B01] to [B05], in which $0.1\leq n_1-n_2\leq 0.4$ is satisfied.

[B07] The display apparatus according to any one of [B01] to [B06], in which $0.8\leq(4S/\pi)^{1/2}/H\leq 1.6$ is satisfied when the area of the cutting head section of the truncated cone shape is S and the height of the truncated cone shape is H.

[B08] The display apparatus according to any one of [B01] to [B07], in which light which is output from the light emitting element and which is output from the first members in parallel with an axis line of the truncated cone shape is completely reflected on the opposing surface when the light hits the opposing surface of the second member which opposes the first members.

[B09] The display apparatus according to any one of [B01] to [B08], in which the light emitting element and the first members are in contact.

[B10] The display apparatus according to any one of [B01] to [B09], in which light from each light emitting element is output to the outside via the second substrate.

[B11] The display apparatus according to [B10], further including a color filter.

[B12] The display apparatus according to any one of [B01] to [B11], in which a light absorbing layer is provided on the second member.

[B13] The display apparatus according to [B12], in which the light absorbing layer is provided on a lower section of the second member.

[B14] The display apparatus according to [B12], in which the light absorbing layer is provided in a middle section of the second member.

[B15] The display apparatus according to [B12], in which the light absorbing layer is provided in a top section of the second member.

[B16] The display apparatus according to [B12], in which the light absorbing layer accounts for the entire second member.

[B17] The display apparatus according to any one of [B01] to [B16], in which the first members are formed of $Si_{1-x}N_x$, ITO, IZO, $TiO_2$, $Nb_2O_5$, bromine-containing polymers, sulfur-containing polymers, titanium-containing polymers, or zirconium-containing polymers.

[B18] The display apparatus according to any one of [B01] to [B17], in which the second members are formed of $SiO_2$, MgF, LiF, polyimide-based resins, acryl-based resins, fluorine-based resins, silicone-based resins, fluorine-based polymers, or silicone-based polymers.

[B19] The display apparatus according to any one of [B01] to [B16], in which the second members are configured of a lower layer formed of an organic material and an upper layer formed of an inorganic material which covers at least a part of the lower layer.

[B20] The display apparatus according to [B19], in which the upper layer covers the entire surface of the lower layer.

[B21] The display apparatus according to [B19], in which the upper layer covers the top surface of the lower layer.

[B22] The display apparatus according to any one of [B19] to [B21], in which an opening section is provided in the second member, an inclined surface of the opening section corresponds to the opposing surface, and the light emitting section is provided on the bottom surface of the opening section.

[B23] The display apparatus according to [B19] or [B20], in which an opening section is provided in the second member, an inclined surface of the opening section corresponds to the opposing surface, the upper layer which configures the second member extends to a part of the bottom surface of the opening section, and the light emitting section is provided on the first electrode which is exposed on the bottom surface of the opening section of which a part is covered by the extending section of the upper layer.

[B24] The display apparatus according to [B19] or [B20], in which an opening section is provided in the second member, an inclined surface of the opening section corresponds to the opposing surface, the upper layer which configures the second member extends to a part of the bottom surface of the opening section, a first auxiliary electrode is formed on the first electrode which is exposed on the bottom surface of the opening section of which a part is covered by the extending section of the upper layer, and the light emitting section is formed on the first auxiliary electrode.

[B25] The display apparatus according to [B19] or [B20], in which an opening section is provided in the second member, an inclined surface of the opening section corresponds to the opposing surface, the upper layer which configures the second member extends to a part of the bottom surface of the opening section, a first auxiliary electrode is formed over the opposing surface from on the first electrode which is exposed on the bottom surface of the opening section of which a part is covered by the extending section of the upper layer and the light emitting section is formed on a part of the first auxiliary electrode.

[B26] The display apparatus according to any one of [B01] to [B25], further including a protective film and a sealing material layer on the first members and the second members, in which when a refractive index of a material which configures the protective film is set as $n_3$ and a refractive index of a material which configures the sealing material layer is set as $n_4$, $|n_3-n_4| \leq 0.3$ is satisfied.

[B27] The display apparatus according to any one of [B01] to [B26], in which the remainder of light propagated by the first members enters the second members on the opposing surface of the second members which opposes the first members.

[B28] The display apparatus according to any one of [B01] to [B27], in which one pixel is configured by one light emitting element.

[B29] The display apparatus according to any one of [B01] to [B27], in which one pixel is configured by gathering a plurality of light emitting elements.

[C01] A display apparatus including (A) a first substrate where a plurality of light emitting elements, which are formed by laminating a first electrode, a light emitting section which is configured by an organic layer provided with a light emitting layer, and a second electrode, are formed, and (B) a second substrate which is arranged to oppose the first substrate, in which the first substrate is further provided with a light reflecting layer formed of first members which propagate and output light from each light emitting element to an outside and second members placed between the first members, the first members have a truncated cone shape where a cutting head section opposes the light emitting element, and a part of light propagated by the first members is completely reflected on opposing surfaces of the second members which oppose the first members, and the second members are configured by a lower layer formed of organic material and an upper layer formed of an organic material and which covers at least a part of the lower layer.

[C02] The display apparatus according to [C01], in which the upper layer covers the entire surface of the lower layer.

[C03] The display apparatus according to [C01], in which the upper layer covers the top surface of the lower layer.

[C04] The display apparatus according to any one of [C01] to [C03], in which an opening section is provided in the second member, an inclined surface of the opening section corresponds to the opposing surface, and the light emitting section is provided on the bottom surface of the opening section.

[C05] The display apparatus according to [C01] or [C02], in which an opening section is provided in the second member, an inclined surface of the opening section corresponds to the opposing surface, the upper layer which configures the second member extends to a part of the bottom surface of the opening section, and the light emitting section is provided on the first electrode which is exposed on the bottom surface of the opening section of which a part is covered by the extending section of the upper layer.

[C06] The display apparatus according to [C01] or [C02], in which an opening section is provided in the second member, an inclined surface of the opening section corresponds to the opposing surface, the upper layer which configures the second member extends to a part of the bottom surface of the opening section, a first auxiliary electrode is formed on the first electrode which is exposed on the bottom surface of the opening section of which a part is covered by the extending section of the upper layer, and the light emitting section is formed on the first auxiliary electrode.

[C07] The display apparatus according to [C01] or [C02], in which an opening section is provided in the second member, an inclined surface of the opening section corresponds to the opposing surface, the upper layer which configures the second member extends to a part of the bottom surface of the opening section, a first auxiliary electrode is formed over the opposing surface from on the first electrode which is exposed on the bottom surface of the opening section of which a part is covered by the extending section of the upper layer and the light emitting section is formed on a part of the first auxiliary electrode.

[D01] Method for Manufacturing Display Apparatus

A method for manufacturing a display apparatus provided with (A) a first substrate where a plurality of light emitting elements, which are formed by laminating a first electrode, a light emitting section which is configured by an organic layer provided with a light emitting layer, and a second electrode, are formed, and (B) a second substrate which is arranged to oppose the first substrate, in which the first substrate is further provided with a light reflecting layer formed of first members which propagate and output light from each light emitting element to an outside and second members placed between the first members, the first members have a truncated cone shape where a cutting head section opposes the light emitting element, and a part of light propagated by the first members is completely reflected on opposing surfaces of the second members which oppose the first members, the method including determining a relationship between a tilting angle θ of the opposing surfaces of the second members, $\{(4S/\pi)^{1/2}/H\}$, and a relative luminance value at a 0 degree viewing angle of light which is output from the light emitting element via the first members by setting Δn as a parameter when a refractive index of a material which configures the first members is $n_1$, a refractive index of a material which configures the second members is $n_2$ (here, $n_2<n_1$), an area of the cutting head section of the truncated cone shape is S, a height of the truncated cone shape is H, and $\Delta n = n_1 - n_2$; determining a maximum value and a minimum value of the relative luminance value at a 0 degree viewing angle based on a desired value of $\{(4S/\pi)^{1/2}/H\}$ and an allowable variation range of the tilting angle θ; determining the tilting angle θ such that a difference between the maximum value and the minimum value of the relative luminance value at a 0 degree viewing angle is minimized; and manufacturing a light reflecting layer which has the determined tilting angle θ.

[D02] The method for designing a display apparatus according to [D01], in which a maximum value and a minimum value of a relative luminance value at a 0 degree viewing angle are determined based on an allowable variation range of $\{(4S/\pi)^{1/2}/H\}$ instead of the desired value of $\{(4S/\pi)^{1/2}/H\}$.

[D03] Method For Designing Display Apparatus

A method for designing a display apparatus provided with (A) a first substrate where a plurality of light emitting elements, which are formed by laminating a first electrode, a light emitting section which is configured by an organic layer provided with a light emitting layer, and a second electrode, are formed, and (B) a second substrate which is arranged to oppose the first substrate, in which the first substrate is further provided with a light reflecting layer formed of first members which propagate and output light from each light emitting element to an outside and second members placed between the first members, the first members have a truncated cone shape where a cutting head section opposes the light emitting element, and a part of light propagated by the first members is completely reflected on opposing surfaces of the second members which oppose the first members, the method including determining a relationship between a tilting angle θ of the opposing surfaces of the second members, $\{(4S/\pi)^{1/2}/H\}$, and a relative luminance value at a 0 degree viewing angle of light which is output from the light emitting element via the first member by setting Δn as a parameter when a refractive index of a material which configures the first members is $n_1$, a refractive index of a material which configures the second members is $n_2$ (here, $n_2<n_1$), an area of the cutting head section of the truncated cone shape is S, a height of the truncated cone shape is H, and $\Delta n = n_1 - n_2$; determining a maximum value and a minimum value of the relative luminance value at a 0 degree viewing angle based on a desired value of $\{(4S/\pi)^{1/2}/H\}$ and an allowable variation range of the tilting angle θ; and determining the tilting angle θ such that a difference between the maximum value and the minimum value of the relative luminance value at a 0 degree viewing angle is minimized.

[D04] The method for designing a display apparatus according to [D03], in which a maximum value and a minimum value of a relative luminance value at a 0 degree viewing angle are determined based on an allowable variation range of $\{(4S/\pi)^{1/2}/H\}$ instead of the desired value of $\{(4S/\pi)^{1/2}/H\}$.

It should be understood by those skilled in the art that various modifications, combinations, sub-combinations and alterations may occur depending on design requirements and other factors insofar as they are within the scope of the appended claims or the equivalents thereof.

What is claimed is:

1. A display apparatus comprising:
   (A) a first substrate where a plurality of light emitting elements, which are formed by laminating a first electrode, a light emitting section which is configured by an organic layer provided with a light emitting layer, and a second electrode, are formed; and
   (B) a second substrate which is arranged to oppose the first substrate,
   wherein the first substrate is further provided with a light reflecting layer formed of first members which propagate and output light from each light emitting element to an outside and second members placed between the first members,
   the first members have a truncated cone shape where a cutting head section opposes the light emitting element,
   a part of light propagated by the first members is completely reflected on opposing surfaces of the second members which oppose the first members, and
   when a tilting angle of the opposing surfaces of the second members is θ (units: degrees), a refractive index of a material which configures the first members is $n_1$, and a refractive index of a material which configures the second members is $n_2$ (here, $n_2<n_1$), $75.2-54(n_1-n_2) \leq \theta \leq 81.0-20(n_1-n_2)$ is satisfied.

2. The display apparatus according to claim 1, wherein $76.3-46(n_1-n_2) \leq \theta \leq 77.0-20(n_1-n_2)$ is satisfied.

3. The display apparatus according to claim 1,
wherein an allowable variation range for the tilting angle θ in the light emitting element which configures the display apparatus is a maximum of 4 degrees.

4. The display apparatus according to claim 1,
wherein an allowable change range of a relative luminance value at a 0 degree viewing angle of light which is output from the light emitting element via the first members is a maximum of 0.5 in the light emitting element which configures the display apparatus.

5. The display apparatus according to claim 1,
wherein a relative luminance value at a 0 degree viewing angle of light which is output from the light emitting element via the first members is 1.5 or more to 3.0 or less.

6. The display apparatus according to claim 1,
wherein an allowable variation range of $\{(4S/\pi)^{1/2}/H\}$ in the light emitting element which configures the display apparatus is a maximum of 0.2 when an area of the cutting head section of the truncated cone shape is S and a height of the truncated cone shape is H.

7. The display apparatus according to claim 1,
wherein $0.1 \leq n_1 - n_2 \leq 0.4$ is satisfied.

8. The display apparatus according to claim 1,
wherein $0.8 \leq (4S/\eta)^{1/2}/H \leq 1.6$ is satisfied when an area of the cutting head section of the truncated cone shape is S and a height of the truncated cone shape is H.

9. The display apparatus according to claim 1,
wherein light which is output from the light emitting member and which is output from the first members in parallel with an axis line of the truncated cone shape is completely reflected on the opposing surface when the light hits the opposing surface of the second member which opposes the first members.

10. The display apparatus according to claim 1,
wherein the light emitting element and the first members are in contact.

11. The display apparatus according to claim 1,
wherein light from each light emitting element is output to the outside via the second substrate.

12. A display apparatus comprising:
(A) a first substrate where a plurality of light emitting elements, which are formed by laminating a first electrode, a light emitting section which is configured by an organic layer provided with a light emitting layer, and a second electrode, are formed; and
(B) a second substrate which is arranged to oppose the first substrate,
wherein the first substrate is further provided with a light reflecting layer formed of first members which propagate and output light from each light emitting element to an outside and second members placed between the first members,
the first members have a truncated cone shape where a cutting head section opposes the light emitting element,
a part of light propagated by the first members is completely reflected on opposing surfaces of the second members which oppose the first members, and
when a refractive index of a material which configures the first members is $n_1$ and a refractive index of a material which configures the second members is $n_2$ (here, $n_2 < n_1$), a tilting angle θ of the opposing surfaces of the second members is determined based on a value of the refractive index $n_1$, a value of the refractive index $n_2$, and an allowable variation range of the tilting angle θ of the opposing surfaces of the second members.

13. The display apparatus according to claim 12,
wherein an allowable variation range for the tilting angle θ in the light emitting element which configures the display apparatus is a maximum of 4 degrees.

14. The display apparatus according to claim 12,
wherein an allowable change range of a relative luminance value at a 0 degree viewing angle of light which is output from the light emitting element via the first members is a maximum of 0.5 in the light emitting element which configures the display apparatus.

15. The display apparatus according to claim 12,
wherein a relative luminance value at a 0 degree viewing angle of light which is output from the light emitting element via the first members is 1.5 or more to 3.0 or less.

16. The display apparatus according to claim 12,
wherein an allowable variation range of $\{(4S/\pi)^{1/2}/H\}$ in the light emitting element which configures the display apparatus is a maximum of 0.2 when an area of the cutting head section of the truncated cone shape is S and a height of the truncated cone shape is H.

17. The display apparatus according to claim 12,
wherein $0.1 \leq n_1 - n_2 \leq 0.4$ is satisfied.

* * * * *